(12) United States Patent
Noda et al.

(10) Patent No.: US 11,387,276 B2
(45) Date of Patent: Jul. 12, 2022

(54) NONVOLATILE SEMICONDUCTOR STORAGE DEVICE AND METHOD OF MANUFACTURING THE SAME

(71) Applicant: Kioxia Corporation, Tokyo (JP)

(72) Inventors: Kotaro Noda, Yokkaichi Mie (JP); Hiroyuki Ode, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/010,999

(22) Filed: Sep. 3, 2020

(65) Prior Publication Data

US 2021/0265427 A1 Aug. 26, 2021

(30) Foreign Application Priority Data

Feb. 26, 2020 (JP) .............................. JP2020-030578

(51) Int. Cl.
*H01L 27/24* (2006.01)
*H01L 45/00* (2006.01)
*G11C 13/00* (2006.01)

(52) U.S. Cl.
CPC ...... *H01L 27/2481* (2013.01); *G11C 13/0007* (2013.01); *H01L 45/1253* (2013.01); *H01L 45/145* (2013.01)

(58) Field of Classification Search
CPC ............ H01L 27/2481; H01L 45/1253; H01L 45/145; H01L 27/2472; H01L 45/04; H01L 27/2463; H01L 23/53238; H01L 21/76883; G11C 13/0007
See application file for complete search history.

(56) References Cited

U.S. PATENT DOCUMENTS

| 8,822,968 | B2 | 9/2014 | Inokuma | |
|---|---|---|---|---|
| 2008/0242080 | A1* | 10/2008 | Tanaka | H01L 27/101 438/653 |
| 2013/0121060 | A1* | 5/2013 | Lee | G11C 13/0069 365/148 |
| 2014/0347911 | A1* | 11/2014 | Minemura | H01L 45/085 365/148 |

FOREIGN PATENT DOCUMENTS

JP 2013-201405 A 10/2013

* cited by examiner

*Primary Examiner* — Shih Tsun A Chou
(74) *Attorney, Agent, or Firm* — Foley & Lardner LLP

(57) ABSTRACT

A storage device includes first wiring layers extending in a first direction; second wiring layers extending in a second direction; third wiring layers extending in the second direction; a first memory cell arranged at each cross point of one second wiring layer and one first wiring layer; fourth wiring layers extending in the first direction; and a second memory cell arranged at each cross point of one fourth wiring layer and one third wiring layer. The second wiring layer has a first surface in contact with the third wiring layer and a second surface that has a portion extending in the first direction, the extended portion of the second surface being longer than the first surface in the first direction, the second surface being spaced from the first surface in the third direction.

14 Claims, 45 Drawing Sheets

NONVOLATILE SEMICONDUCTOR STORAGE DEVICE AND METHOD OF MANUFACTURING THE SAME

CROSS-REFERENCE TO RELATED APPLICATION(S)

This application is based upon and claims the benefit of priority from Japanese Patent Application No. 2020-030578, filed Feb. 26, 2020, the entire contents of which are incorporated herein by reference.

FIELD

Embodiments described herein relate generally to a nonvolatile semiconductor storage device and a method of manufacturing the same.

BACKGROUND

In recent years, a resistive random access memory (ReRAM) utilizing a change in the resistance of a film has been developed, for example, a phase change memory (PCM). The PCM utilizes a change in the resistance value due to a thermal phase transition between a crystalline state and an amorphous state in a storage area of a film. Further, a superlattice PCM in which two different alloys are repeatedly stacked may change the phase of a film using a relatively small amount of current, and thus, has attracted attention as a storage device which facilitates power saving.

DETAILED DESCRIPTION

Figure 1:
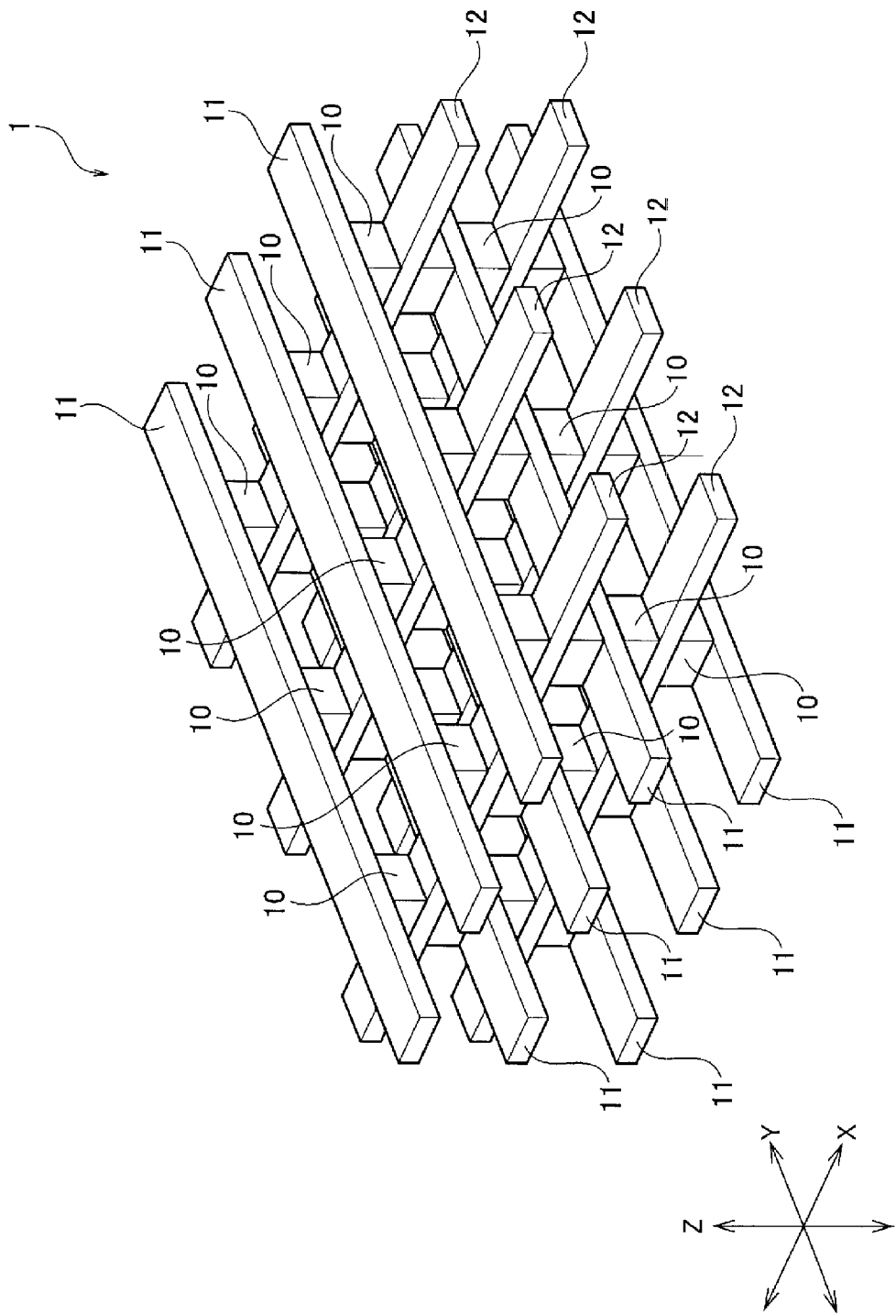
FIG. 1 is a schematic bird's eye view configuration diagram of a nonvolatile semiconductor storage device according to an embodiment.

In the PCM, wirings of low resistance word lines and bit lines may be desired to drive a cell at a low voltage. Although the wiring volume can increase by increasing the wiring film thickness, this causes high processing difficulty and makes it difficult to reduce the resistance. Wirings arranged in parallel have only a line/space width depending on a half pitch (HP), which can cause shorting between adjacent wirings.

Embodiments provide a nonvolatile semiconductor storage device and a method of manufacturing the same which prevent shorting between adjacent wirings and reduce the wiring resistance.

In general, according to one embodiment, a nonvolatile semiconductor storage device includes a plurality of first wiring layers extending in a first direction; a plurality of second wiring layers, extending in a second direction intersecting the first direction, provided above the plurality of first wiring layers along a third direction intersecting the first direction and the second direction; a plurality of third wiring layers, extending in the second direction, provided above the plurality of second wiring layers along the third direction; a first memory cell, arranged between the second wiring layer and the first wiring layer at each cross point of one of the plurality of second wiring layers and one of the plurality of first wiring layers, the first memory cell having a first resistance change film; a plurality of fourth wiring layers extending in the first direction and provided above the plurality of third wiring layers along the third direction; and a second memory cell, arranged between the fourth wiring layer and the third wiring layer at each cross point of one of the plurality of fourth wiring layers and one of the plurality of third wiring layers, the second memory cell having a second resistance change film. The second wiring layer has a first surface that is in contact with the third wiring layer and a second surface that has a portion extending in the first direction, the extended portion of the second surface being longer than the first surface in the first direction, the second surface being spaced from the first surface in the third direction. The third wiring layer has a third surface that is in contact with the first surface of the second wiring layer. The third surface is longer than the first surface in the first direction.

Next, embodiments will be described with reference to the drawings. In the following description of the drawings, the same or similar reference numerals will be given to the same or similar parts. However, it is to be noted that the drawings are schematically illustrated and, a relationship between the thickness and the planar dimension of each component is different from the actual one. Therefore, specific thicknesses or dimensions need to be determined in consideration of the following description. Further, it is needless to say that the drawings also include parts having different dimensional relationships and ratios.

Further, the embodiments described below exemplify devices and methods for embodying the technical ideas, and do not specify the material, shape, structure, arrangement, or the like of each component. These embodiments may be modified in various ways within the scope of the claims.

Embodiment

Figure 2:
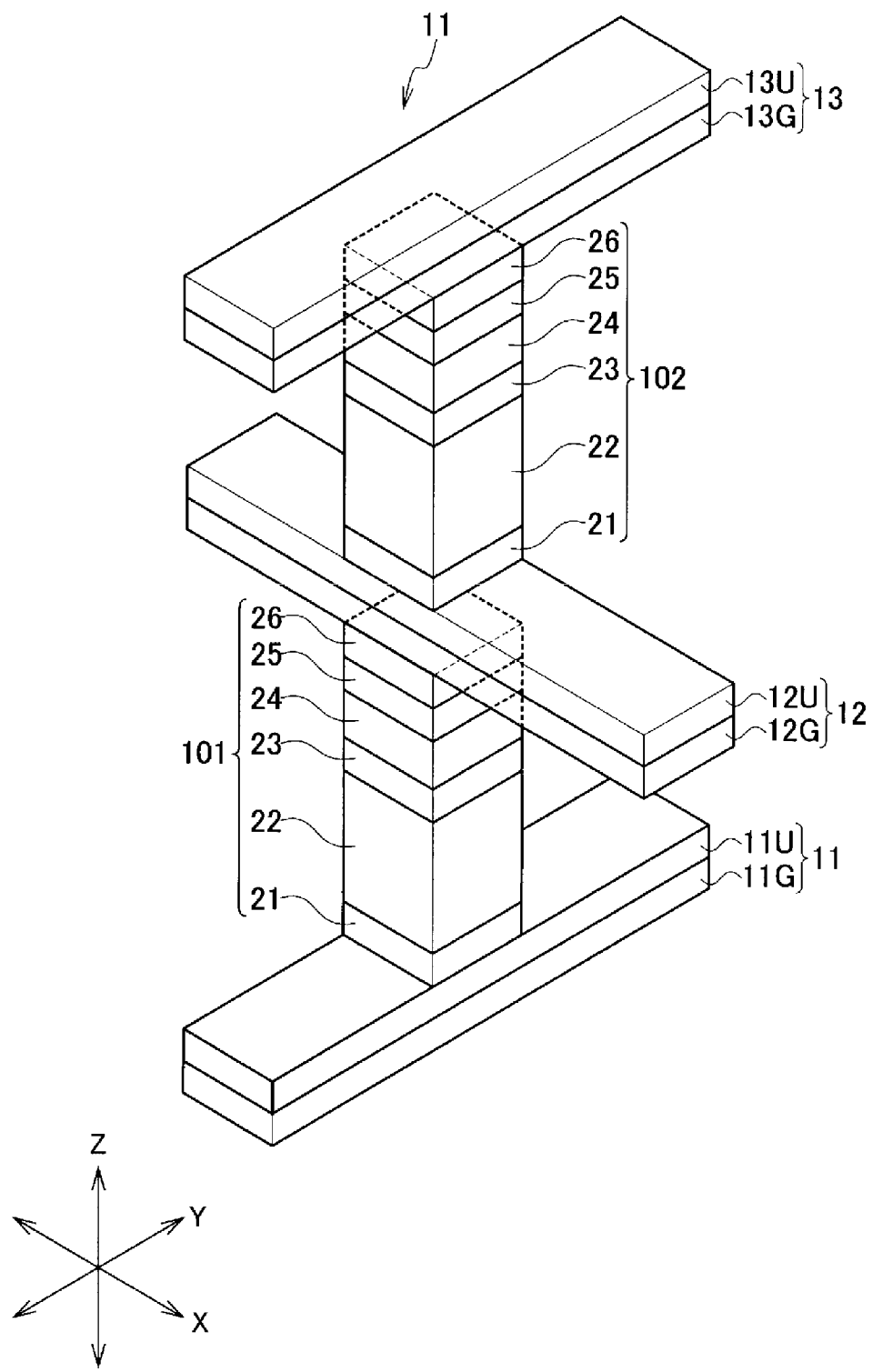
FIG. 2 is a schematic bird's eye view configuration diagram of a memory cell two-stage configuration part of FIG. 1.

A schematic bird's eye view configuration of a nonvolatile semiconductor storage device 1 according to an embodiment is illustrated in FIG. 1, and is, for example, as an array of 3 rows×3 columns stacked in four layers. A schematic bird's eye view configuration of a memory cell two-stage configuration part of FIG. 1 is illustrated in FIG. 2.

As illustrated in FIG. 1, the nonvolatile semiconductor storage device 1 according to the embodiment has a cross point type memory structure, and includes a plurality of first wiring layers 11 arranged on the same plane, a plurality of second wiring layers 12 arranged on the same plane over the plurality of first wiring layers 11 so as to three-dimensionally intersect with the plurality of first wiring layers 11, and a memory cell 10 arranged between the first wiring layer 11 and the second wiring layer 12 at each cross point of the plurality of first wiring layers 11 and the plurality of second wiring layers 12. The nonvolatile semiconductor storage device 1 according to the embodiment may be disposed on, for example, an insulating substrate including an insulating layer formed on a semiconductor substrate.

The first wiring layer 11 and the second wiring layer 12 intersect each other in a non-parallel and three-dimensional manner. For example, as illustrated in FIG. 1, a plurality of memory cells 10 are arranged in a matrix in a two-dimensional direction (X-Y direction), and the resulting matrix array is stacked in a plurality of layers in the Z direction orthogonal to the X-Y plane. The first wiring layer 11 is shared by the memory cells 10 arranged adjacent to each other in the Z direction, and similarly, the second wiring layer 12 is shared by the memory cells 10 arranged adjacent to each other in the Z direction. In FIG. 1, interlayer insulating films are provided respectively between the plurality of first wiring layers 11 arranged adjacent to each other, between the plurality of second wiring layers 12 arranged adjacent to each other, and between the memory cells 10 arranged adjacent to each other, but illustration thereof is omitted.

The first wiring layer 11 may be referred to as a bit line, and the second wiring layer 12 may be referred to as a word line. Further, the cross point type memory structure may be stacked in a plurality of layers. The names of the bit line and the word line may be reversed.

For the nonvolatile semiconductor storage device according to the embodiment, all of a resistive random access memory (ReRAM), a phase change memory (PCM), and a ferroelectric random access memory (FeRAM) may be applied. Further, a magneto tunnel junction (MTJ) resistance change element may also be applied. In the following description, a PCM will be mainly described.

(Configuration of Memory Cell)

As illustrated in FIG. 2, the memory cell 10 of the nonvolatile semiconductor storage device 1 according to the embodiment includes a storage element connected in series between the first wiring layer 11 and the second wiring layer 12 and a selector 22. The storage element includes a resistance change film 24.

The nonvolatile semiconductor storage device 1 according to the embodiment has a PCM cross point array structure, and also has a structure in which all wirings such as the first wiring layer 11, the second wiring layer 12, and a third wiring layer 13 are divided and processed at least twice in parallel directions.

In the nonvolatile semiconductor storage device 1 according to the embodiment, when the line/space dimensions of the wirings arranged in parallel are, for example, about 20.5 nm/about 20.5 nm, the half pitch HP is 20.5 nm.

In the nonvolatile semiconductor storage device 1 according to the present embodiment, wirings of low resistance word lines and bit lines are required to drive a cell at a low voltage. Specifically, the cell drive voltage is, for example, about 8.0V, and the drive voltage of a half-selected cell of adjacent cells is, for example, about 4V.

As illustrated in FIG. 2, the first wiring layer 11 has a two-layer structure of a first lower wiring layer 11G1 and a first upper wiring layer 11U1. Further, the second wiring layer 12 has a two-layer structure of a second lower wiring layer 12G2 and a second upper wiring layer 12U2. Further, the third wiring layer 13 has a two-layer structure of a third lower wiring layer 13G3 and a third upper wiring layer 13U3.

A first memory cell 101 arranged between the second wiring layer 12 and the first wiring layer 11 includes stacked films 21, 22, 23, 24, 25, and 26. Similarly, a second memory cell 102 arranged between the second wiring layer 12 and the third wiring layer 13 includes the stacked films 21, 22, 23, 24, 25, and 26. The first memory cell 101 and the second memory cell 102 correspond to the memory cell 10 as illustrated in FIG. 1, but are distinguished for convenience of description. Similarly, the third wiring layer 13 corresponds to the first wiring layer 11 as illustrated in FIG. 1, but is distinguished for convenience of description.

The selector 22 may be, for example, a switch element between two terminals. When a voltage applied between the two terminals is equal to or less than a threshold voltage, the switch element is in a "high resistance" state, e.g., an electrically non-conducting state. When the voltage applied between the two terminals is equal to or greater than the threshold voltage, the switch element is switched to a "low resistance" state, e.g., an electrically conducting state. The switch element may have this function regardless of the polarity of the voltage. This switch element contains at least one chalcogen element selected from the group consisting of tellurium (Te), selenium (Se), and sulfur (S). Alternatively, the switch element may contain chalcogenide that is a compound containing the chalcogen element. In addition to the above, the switch element may contain at least one element selected from the group consisting of boron (B), aluminum (Al), gallium (Ga), indium (In), carbon (C), silicon (Si), germanium (Ge), tin (Sn), arsenic (As), phosphorus (P), and antimony (Sb).

Further, the selector 22 may be configured with, for example, a silicon diode having a p-intrinsic-n (PIN) structure.

The resistance change film 24 may electrically switch between a relatively low resistance state (set state) and a relatively high resistance state (reset state), and stores data in a nonvolatile manner. The selector 22 prevents sneak current when electrically accessing (forming/writing/erasing/reading) a selected memory cell.

The resistance change film 24 contains, for example, a metal oxide. Examples of the metal oxide may include an oxide of one metal or an alloy of two or more metals selected from the group consisting of zirconium (Zr), titanium (Ti), aluminum (Al), hafnium (Hf), manganese (Mn), tantalum (Ta), and tungsten (W).

When the memory cell 10 is formed as a superlattice PCM, the resistance change film 24 is formed by a superlattice structure in which a plurality of chalcogenide compound layers are stacked. A chalcogenide compound used for the resistance change film 24 is composed of two or more chalcogenide compounds, for example, antimony tellurium such as $Sb_2Te_3$ and germanium tellurium such as GeTe. In order to stabilize a phase change, one chalcogenide compound may contain antimony (Sb) or bismuth (Bi). The selector 22 is formed by a chalcogenide compound of a transition metal. This chalcogenide compound is a compound of one or more transition metals selected from the group consisting of titanium (Ti), vanadium (V), copper (Cu), zinc (Zn), chromium (Cr), zirconium (Zr), platinum (Pt), palladium (Pd), molybdenum (Mo), nickel (Ni), manganese (Mn), and hafnium (Hf) and one or more calcogen elements selected from the group consisting of sulfur (S), selenium (Se), and tellurium (Te). More preferably, the chalcogenide compound is a compound having a composition represented by the chemical formula MX or $MX_2$ when M is a transition metal and X is a chalcogen element. When the composition is MX, the concentration of the transition metal M in the chalcogenide compound is 50 at %, and when the composition is $MX_2$, the concentration of the transition metal M is 33 at %. However, since the composition of the compound has an allowable margin, the appropriate concentration of the transition metal M in the chalcogenide compound is 20 at % or more and 60 at % or less. In the present embodiment, the chalcogenide compound is, for example, $TiTe_2$.

The resistance change film 24 is interposed between a conductive film 25 and a conductive film 23. The conductive film 25 and the conductive film 23 include a metal film or a metal nitride film. As the conductive film 25 and the conductive film 23, for example, a titanium nitride film may be used.

An electrode layer 26 is arranged between the conductive film 25 and the second wiring layer 12. For the electrode layer 26, for example, W, Ti, Ta, or a nitride thereof may be applied. Further, the resistance change film 24 may be formed of Si, and the electrode layer 26 may be formed of Ni or Pt. The materials of the first wiring layer 11 and the second wiring layer 12 will be described later.

A conductive film 21 is arranged between the first wiring layer 11 and the selector 22. The conductive film 21 includes a metal film or a metal nitride film. The conductive film 21 may include, for example, a conductive material such as carbon, carbon nitride (CN), titanium nitride (TiN), W, Cu, or Al. The conductive film 21 is connected to the first wiring layer 11.

The conductive films 21, 23, and 25 prevent diffusion of elements between upper and lower layers sandwiching the conductive films 21, 23, and 25 therebetween. Further, the conductive films 21, 23, and 25 enhance the adhesiveness between the upper and lower layers sandwiching the conductive films 21, 23, and 25 therebetween.

When the reset voltage is applied to the resistance change film 24 in the low resistance state (set state) having a relatively low resistance through the first wiring layer 11 and the second wiring layer 12, the resistance change film 24 may be switched to the high resistance state (reset state) having a relatively high resistance. When the set voltage higher than the reset voltage is applied to the resistance change film 24 in the high resistance state (reset state), the resistance change film 24 may be switched to the low resistance state (set state).

Figure 3:
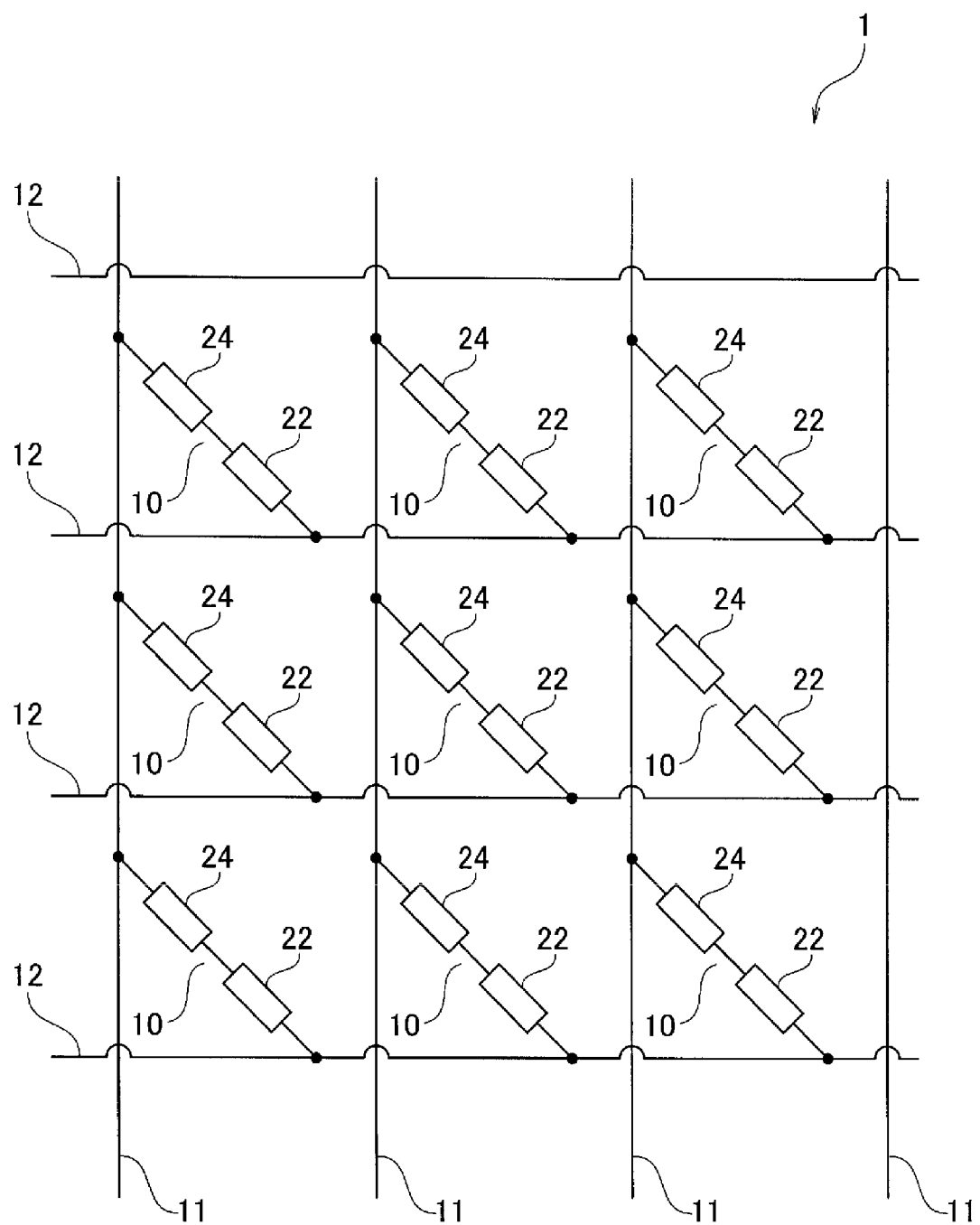
FIG. 3 is a circuit configuration diagram of the nonvolatile semiconductor storage device according to the embodiment.

As illustrated in FIG. 3, in a basic circuit configuration of the nonvolatile semiconductor storage device 1 according to the embodiment, the memory cell 10 is connected to the cross point of the first wiring layer 11 and the second wiring layer 12. In FIG. 3, the memory cell 10 is represented as having a serial configuration of the resistance change film 24 and the selector 22. Since the nonvolatile semiconductor storage device 1 has, for example, a stacked structure in four layers as illustrated in FIG. 1, in this case, the circuit configuration illustrated in FIG. 3 is stacked in four layers.

Figure 4:
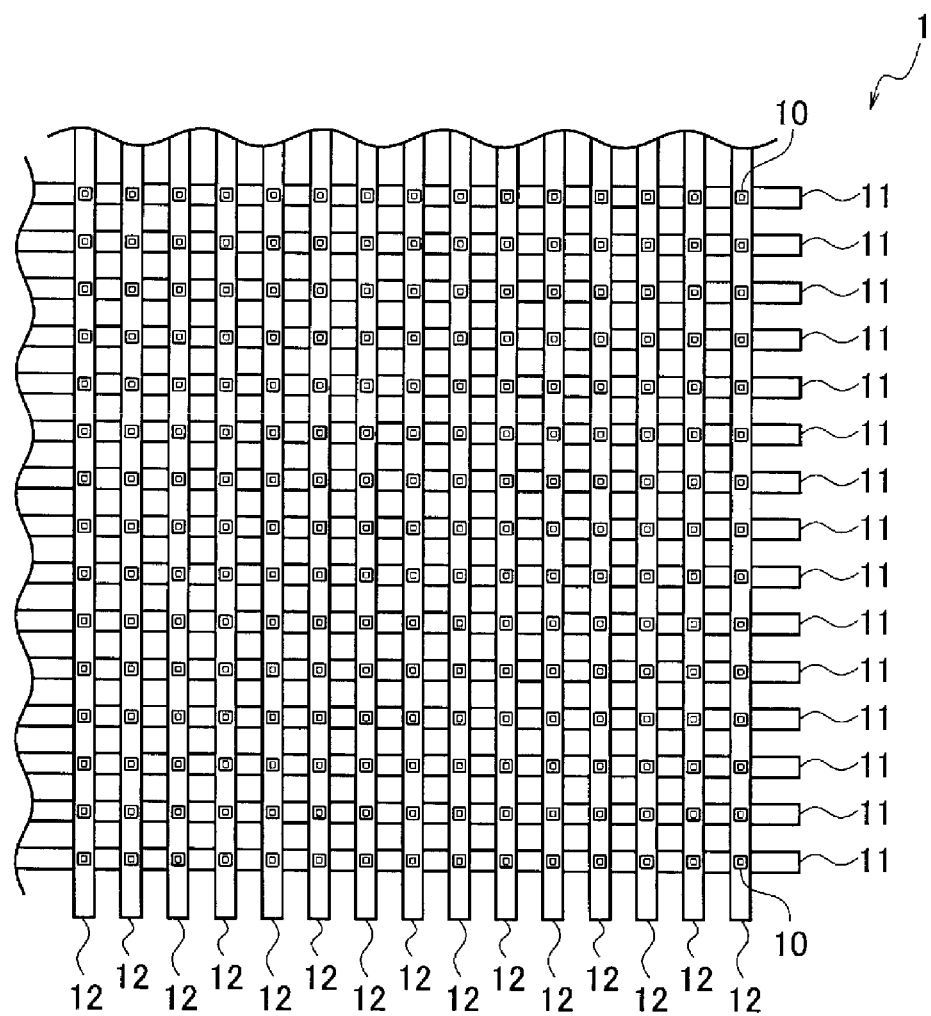
FIG. 4 is a schematic plan pattern configuration diagram of the nonvolatile semiconductor storage device according to the embodiment.

As illustrated in FIG. 4, a schematic plane pattern configuration example of the nonvolatile semiconductor storage device 1 according to the embodiment includes a plurality of first wiring layers (bit lines) 11, a plurality of second wiring layers (word lines) 12, and memory cells 10 arranged at the cross points of the plurality of bit lines 11 and the plurality of word lines 12. The configuration of FIG. 4 is an example in which the memory cells 10 are arranged in one layer.

(Selection of Wiring Material)

For the first wiring layer 11 and the second wiring layer 12 which may be applied to the nonvolatile semiconductor storage device 1 according to the embodiment, any material selected from the group of W, Mo, polysilicon, Ni, Co, Ti, and Cu may be used. Further, any silicide material selected from the group of W, Mo, polysilicon, Ni, Co, Ti, and Cu may be used. Further, any nitride material selected from the group of W, Mo, polysilicon, Ni, Co, Ti, and Cu may be used. Further, a material having a mixing ratio of any one selected from the group of W, Mo, polysilicon, Ni, Co, Ti, and Cu may be used.

Examples of the silicide material may include NiSi, CoSi, WSi, or TiSi. For example, the mixing ratio of the material is represented by Ni:Si=1:1 or 0.5:1. Further, in each wiring layer, an upper wiring layer U and a lower wiring layer G use the same metal material.

(Relationship Between Wiring Resistance and Wiring Width_Mo and W)

Figure 5:
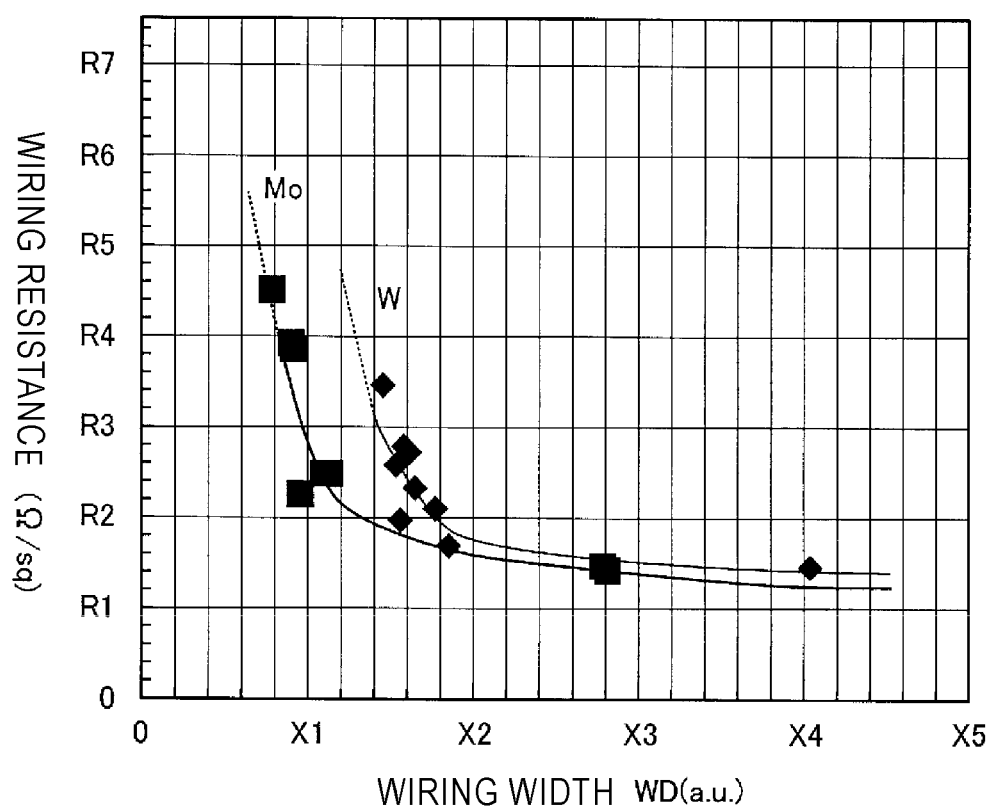
FIG. 5 is a schematic diagram illustrating a relationship between the wiring resistance (Ω/sq) and the wiring width WD (a.u.) in an example in which a combination of wiring materials that may be applied to the nonvolatile semiconductor storage device according to the embodiment is tungsten and molybdenum.

A relationship between the wiring resistance ($\Omega$/sq) and the wiring width WD (a.u.) in an example in which a combination of wiring materials that may be applied to the nonvolatile semiconductor storage device 1 according to the embodiment is W and Mo is schematically illustrated in FIG. 5. In a case of the wiring width WD (a.u.)=X2, a W wiring and an Mo wiring have substantially the same resistance value.

According to the nonvolatile semiconductor storage device of the embodiment, wiring layers which face each other at the cross point thereof with a one-layer memory cell structure interposed therebetween may be formed of different materials. Since a lower wiring layer is less likely to be etched when an upper wiring layer is processed, the nonvolatile semiconductor storage device which avoids an increase in the wiring resistance and reduces the wiring resistance may be provided.

(Arrangement Example of Adjacent Two-Layer Wirings)

Figure 6A:
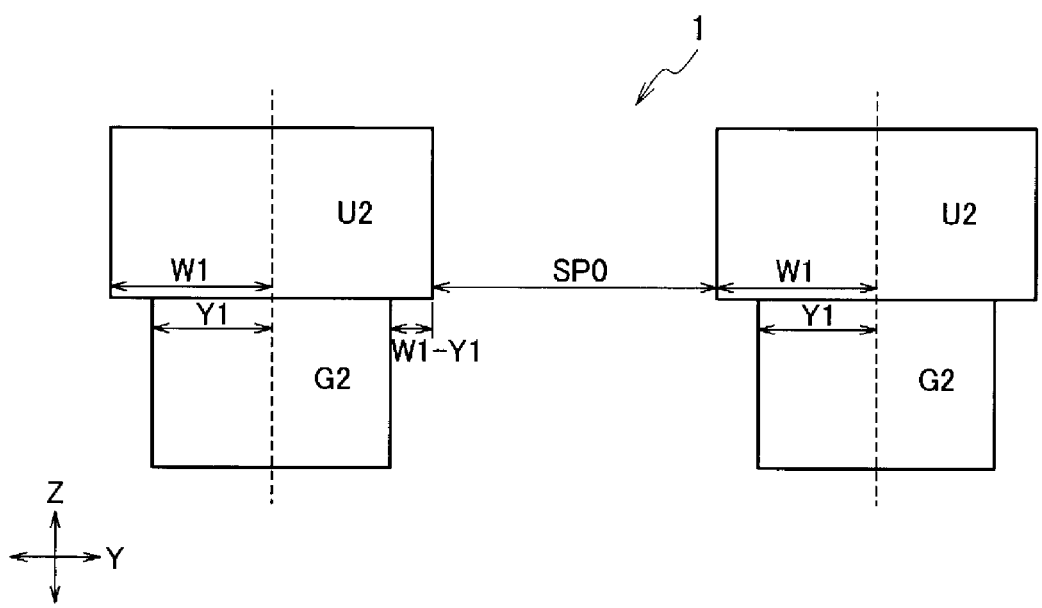
FIG. 6A is an arrangement example when there is no overlay of adjacent wiring layers having a two-layer structure of a lower wiring layer and an upper wiring layer in the nonvolatile semiconductor storage device according to the embodiment.

In the nonvolatile semiconductor storage device 1 according to the embodiment, FIG. 6A illustrates an arrangement example when there is no overlay of adjacent wiring layers having a two-layer structure of a lower wiring layer G2 and an upper wiring layer U2 which extend in the X direction. Further, FIG. 6B illustrates an arrangement example in an example having the overlay.

As illustrated in FIG. 6A, the width in the Y direction of the upper wiring layer U2 is 2W1, the width in the Y direction of the lower wiring layer G2 is 2Y1, and the space between the adjacent wiring layers is SP0. As a non-limiting example, when the half pitch HP is 14 nm, W1 is 7.5 nm, and Y1 is 5 nm, W1−Y1 is 2.5 nm, and SP0 (=2HP−2W1) is 13 nm. The deviation when the upper wiring layer U2 and the lower wiring layer G2 deviate from each other in the Y direction until they are no longer in contact with each other is represented by 2Y1+W1−Y1=12.5 nm.

Figure 6B:
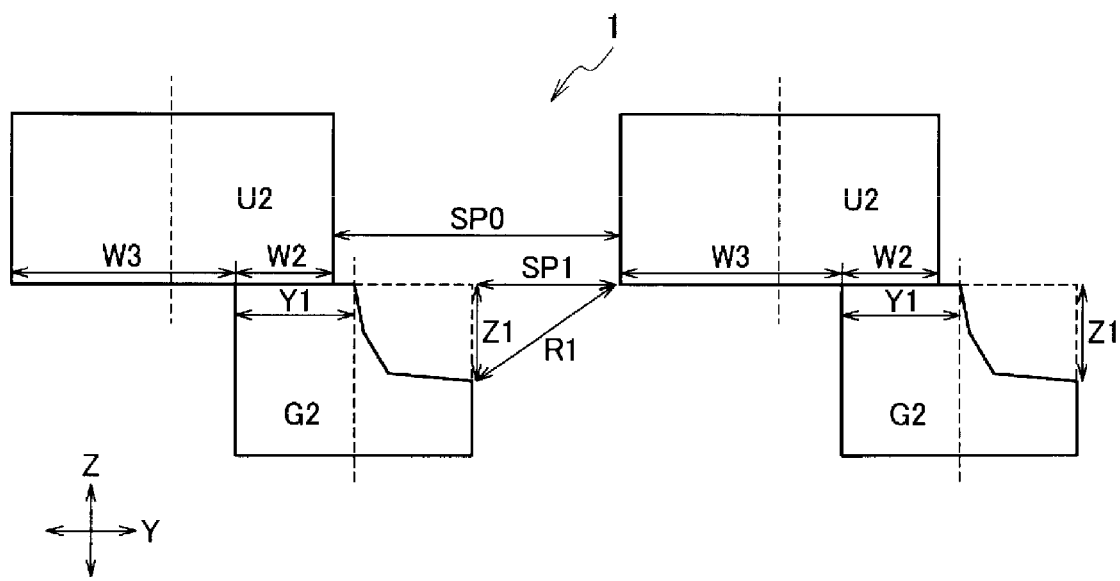
FIG. 6B is an arrangement example in an example having the overlay of adjacent wiring layers having a two-layer structure of the lower wiring layer and the upper wiring layer in the nonvolatile semiconductor storage device according to the embodiment.

Meanwhile, as illustrated in FIG. 6B, in a case of the overlay=8 nm, W3 is 10.5 nm, W2 is 4.5 nm, and SP1=SP0−Y1 is 8 nm. Therefore, as illustrated in FIG. 6B, assuming that the lower wiring layer G2 is etched in order to secure a space between adjacent wiring layers having a two-layer structure, etching is required until Z1 is 11 nm, and R1 is 13.3 nm in order to secure a space R equal to SP0=13 nm.

Figure 7A:
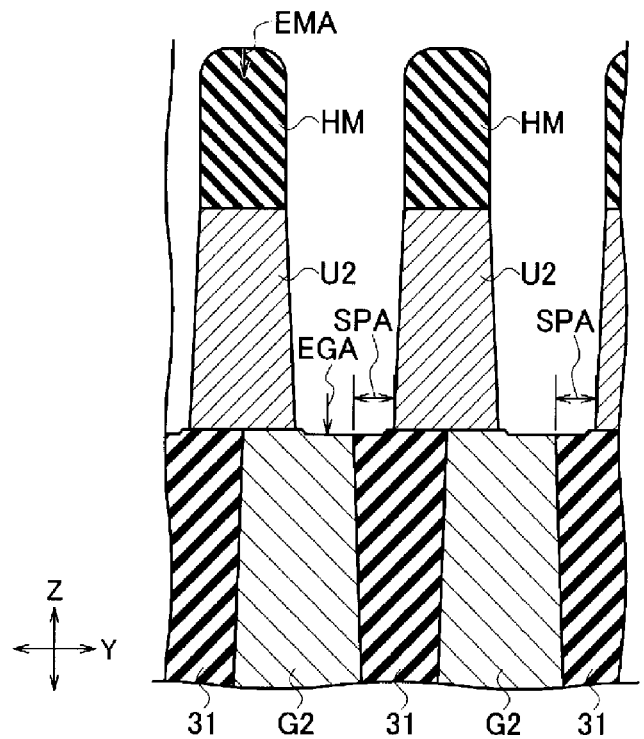
FIG. 7A is a schematic cross-sectional structural diagram illustrating a manufacturing process of forming the upper wiring layer on the lower wiring layer to form a wiring layer having a two-layer structure in the nonvolatile semiconductor storage device according to the comparative example.
Figure 7B:
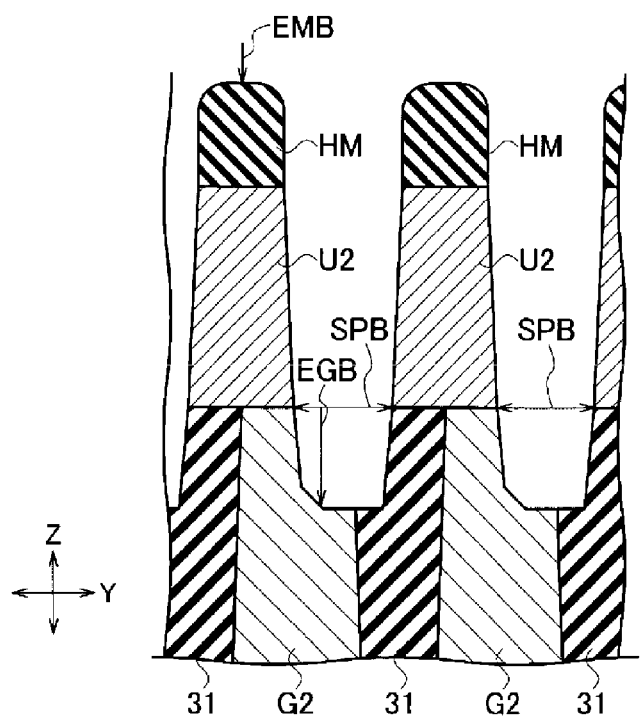
FIG. 7B is a schematic cross-sectional structural diagram illustrating a manufacturing process of forming the upper wiring layer on the lower wiring layer and performing simultaneous cutting to form a wiring layer having a two-layer structure in the nonvolatile semiconductor storage device according to the comparative example.

A schematic cross-sectional structure for which a description will be made on a process of forming the upper wiring layer U2 on the lower wiring layer G2 and etching the upper wiring layer U2 using a hard mask HM is illustrated in FIG. 7A. In FIG. 7A, a space SPA between the lower wiring layer G2 and the upper wiring layer U2 is narrow. Further, a schematic cross-sectional structure with reference to which a description will be made on a process of etching the lower wiring layer G2 simultaneously with the etching of the upper wiring layer U2 is illustrated in FIG. 7B. By etching the lower wiring layer G2 simultaneously with the etching of the upper wiring layer U2, as illustrated in FIG. 7B, a space SPB may be secured between the upper wiring layer U2 and the lower wiring layer G2. However, when the lower wiring layer G2 is processed simultaneously with the etching of the upper wiring layer U2, for example, assuming that the half pitch HP is 14 nm, excessive over-etching is necessary, and the processing difficulty is high. As illustrated in FIGS. 7A and 7B, etching the lower wiring layer G2 simultaneously with the etching of the upper wiring layer U2 means that the lower wiring layer G2 is also etched by over-etching of the upper wiring layer U2. In FIG. 7A, the arrow EMA indicates the etching direction for the hard mask HM, and the arrow EGA indicates the etching direction for the lower wiring layer G2. In FIG. 7B, the arrow EMB indicates the etching direction for the hard mask HM, and the arrow EGB indicates the etching direction for the lower wiring layer G2. By over-etching of the upper wiring layer U2, the lower wiring layer G2 is also etched, and in FIG. 7B, the space SPB may be secured between the lower wiring layer G2 and the upper wiring layer U2. Further, in FIGS. 7A and 7B, the lower wiring layer G2 is formed so as to be embedded in an interlayer insulating film 31.

Comparative Example

Figure 8A:
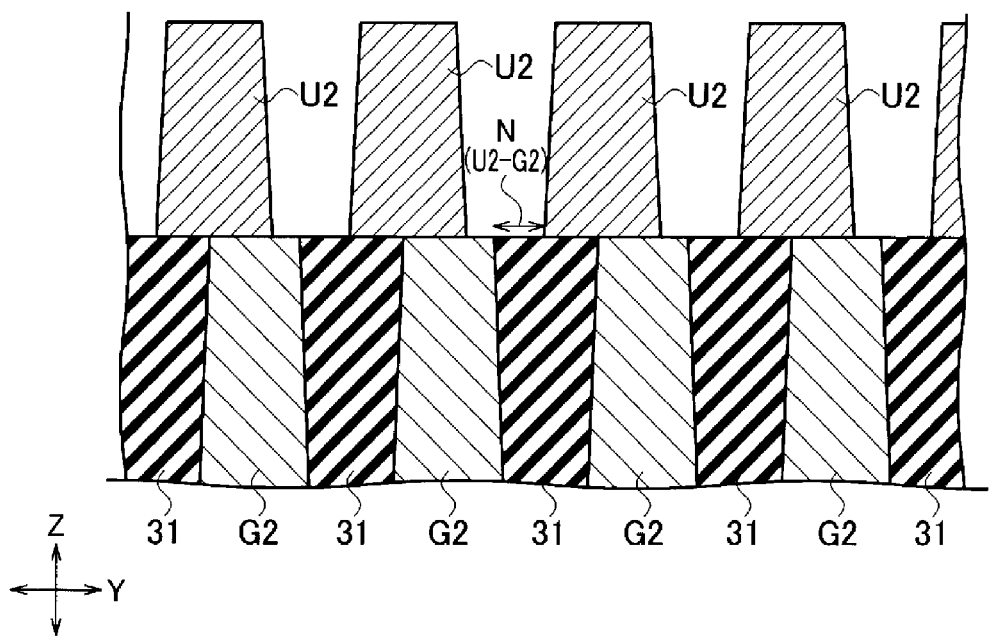
FIG. 8A is a schematic cross-sectional structural diagram illustrating a wiring layer having a two-layer structure in which the upper wiring layer is disposed on the lower wiring layer in the nonvolatile semiconductor storage device according to the comparative example.

In the nonvolatile semiconductor storage device according to a comparative example, a schematic cross-sectional structure of a wiring layer having a two-layer structure in which the upper wiring layer U2 is disposed on the lower wiring layer G2 is illustrated in FIG. 8A. As illustrated in FIG. 8A, the lower wiring layer G2 is formed so as to be embedded in the interlayer insulating film 31, and only a narrow space N (U2−G2) may be formed between the upper wiring layer U2 and the lower wiring layer G2.

First Embodiment

Figure 8B:
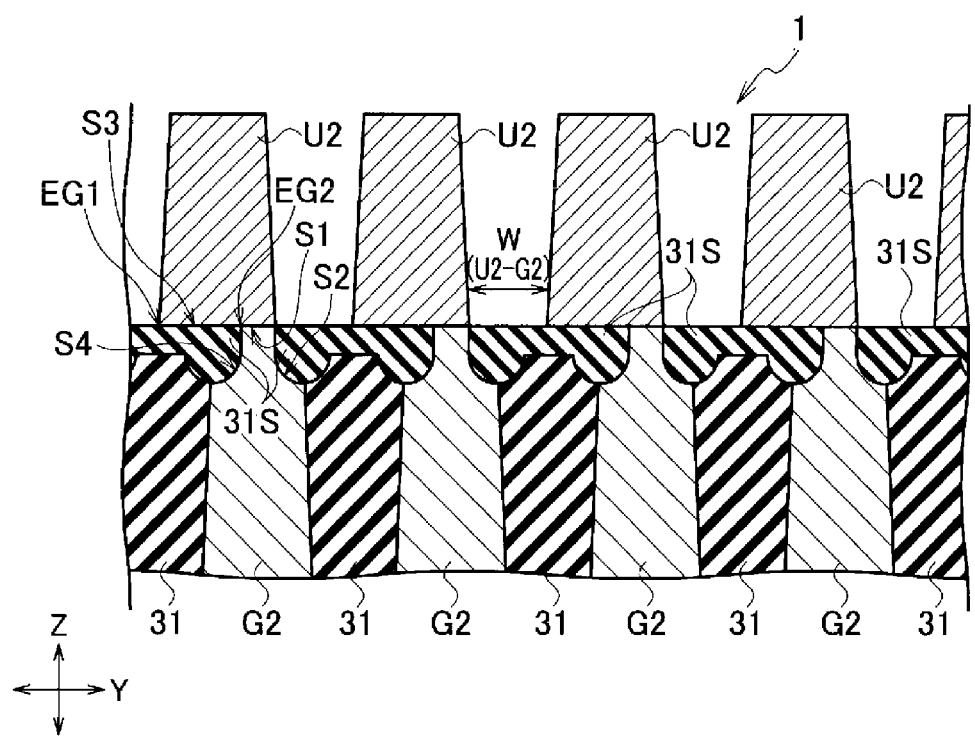
FIG. 8B is a schematic cross-sectional structural diagram illustrating a wiring layer having a two-layer structure in which the upper wiring layer is disposed on the lower wiring layer in the nonvolatile semiconductor storage device according to a first embodiment.

In the nonvolatile semiconductor storage device according to a first embodiment, a schematic cross-sectional structure of a wiring layer having a two-layer structure in which the upper wiring layer U2 is disposed on the lower wiring layer G2 is illustrated in FIG. 8B. The wiring layer extending in the X direction has a stacked structure of the lower wiring layer G2 and the upper wiring layer U2. Here, the stacked structure has a recess structure in the Y direction in the stacked interface. In an example of FIG. 8B, the recess structure is disposed on both sides of the top of the lower wiring layer G2 which is in contact with the upper wiring layer U2. The recess structure has a semicircular cross-sectional structure in the Y-Z plane. The recess structure is filled with an interlayer insulating film 31S similar to the interlayer insulating film 31. In the nonvolatile semiconductor storage device according to the first embodiment, a relatively wide space W (U2−G2) is formed between the upper wiring layer U2 and the lower wiring layer G2 as compared with the comparative example of FIG. 8A. Details will be described later.

As illustrated in FIG. 8B, the lower wiring layer G2 has, among the surface of the lower wiring layer G2, a first surface S1 at the upper side which is in contact with the upper wiring layer U2 and a second surface S2 which has a portion extending in the Y direction. Such an extended portion is longer than the first surface S1 in the Y direction, and thus is sometimes referred to as a "longer portion." The second surface is spaced from the first surface S1 in the Z direction and extends in the Y direction to be connected to the longer portion.

The upper wiring layer U2 has a third surface S3 among the surface of the upper wiring layer U2 which is in contact with the first surface S1 of the lower wiring layer G2, and the third surface S3 is longer than the first surface S1 in the Y direction.

The lower wiring layer G2 further has a fourth surface S4 which is spaced apart from the first surface S1 in the Z direction and extends in the Y direction to be connected to the longer portion, and the fourth surface S4 is located opposite to the second surface S2 in the Y direction with the first surface S1 interposed therebetween.

The interlayer insulating film 31S is provided on the second surface S2.

The third surface S3 has a side end EG1 and a middle end EG2 in the Y direction, and the fourth surface S4 is located between the side end EG1 and the middle end EG2 in the Y direction.

The interlayer insulating film 31S is provided between the third surface S3 and the fourth surface S4.

In the first embodiment, the upper wiring layer U2 and the lower wiring layer G2 are formed of any material, any silicide material, or any nitride material selected from the group of W, Mo, polysilicon, Ni, Co, Ti, and Cu. This is the same hereinafter.

Second Embodiment

Figure 9A:
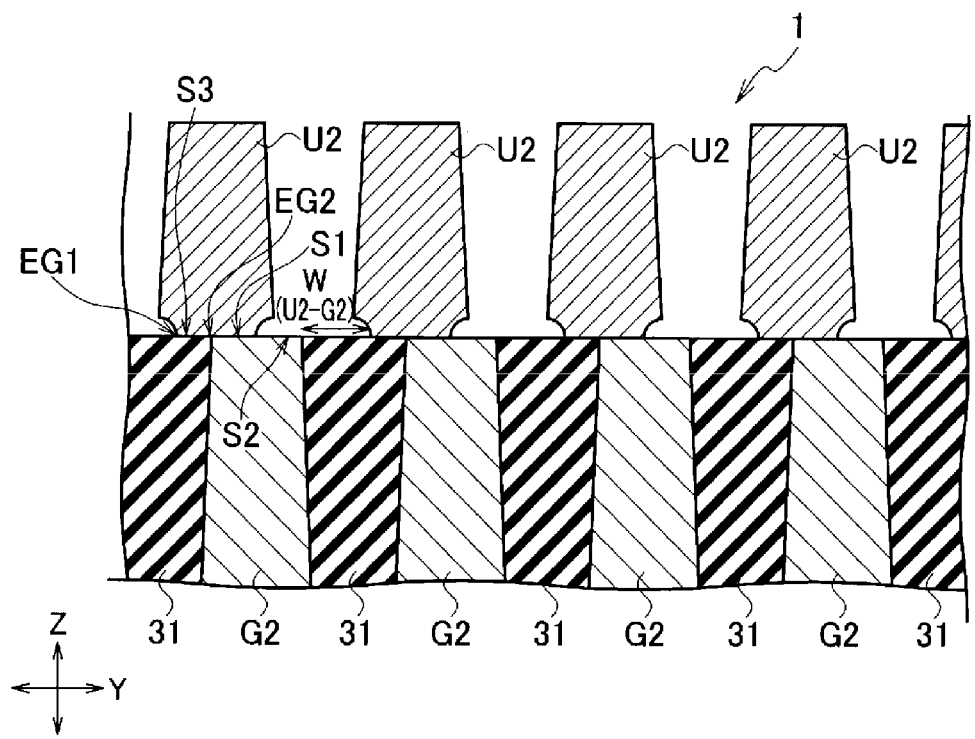
FIG. 9A is a schematic cross-sectional structural diagram of a wiring layer having a two-layer structure in which the upper wiring layer is disposed on the lower wiring layer in the nonvolatile semiconductor storage device according to a second embodiment.

In the nonvolatile semiconductor storage device 1 according to a second embodiment, a schematic cross-sectional structure of a wiring layer having a two-layer structure in which the upper wiring layer U2 is disposed on the lower wiring layer G2 is illustrated in FIG. 9A. The wiring layer extending in the X direction has a stacked structure of the lower wiring layer G2 and the upper wiring layer U2. Here, the stacked structure has a recess structure in the Y direction in the stacked interface. In an example of FIG. 9A, the recess structures are provided on both sides of the bottom of the upper wiring layer U2 which is in contact with the lower wiring layer G2. The recess structure has a semicircular cross-sectional structure in the Y-Z plane. The recess structure is filled with an insulating film similar to the interlayer insulating film 31. In the nonvolatile semiconductor storage device according to the second embodiment, the relatively wide space W (U2-G2) is formed between the upper wiring layer U2 and the lower wiring layer G2 as compared with the comparative example of FIG. 8A.

As illustrated in FIG. 9A, the lower wiring layer G2 has, among the surface of the lower wiring layer G2, the first surface S1 at the upper side which is in contact with the upper wiring layer U2 and the second surface S2 which has a longer portion than the first surface S1 in the Y direction, is spaced apart from the first surface S1 in the Z direction and extends in the Y direction to be connected to the longer portion.

The upper wiring layer U2 has the third surface S3 among the surface of the upper wiring layer U2 which is in contact with the first surface S1 of the lower wiring layer G2, and the third surface S3 is longer than the first surface S1 in the Y direction.

The third surface S3 has a side end EG1 and a middle end EG2 in the Y direction.

Second Embodiment Modification 1

Figure 9B:
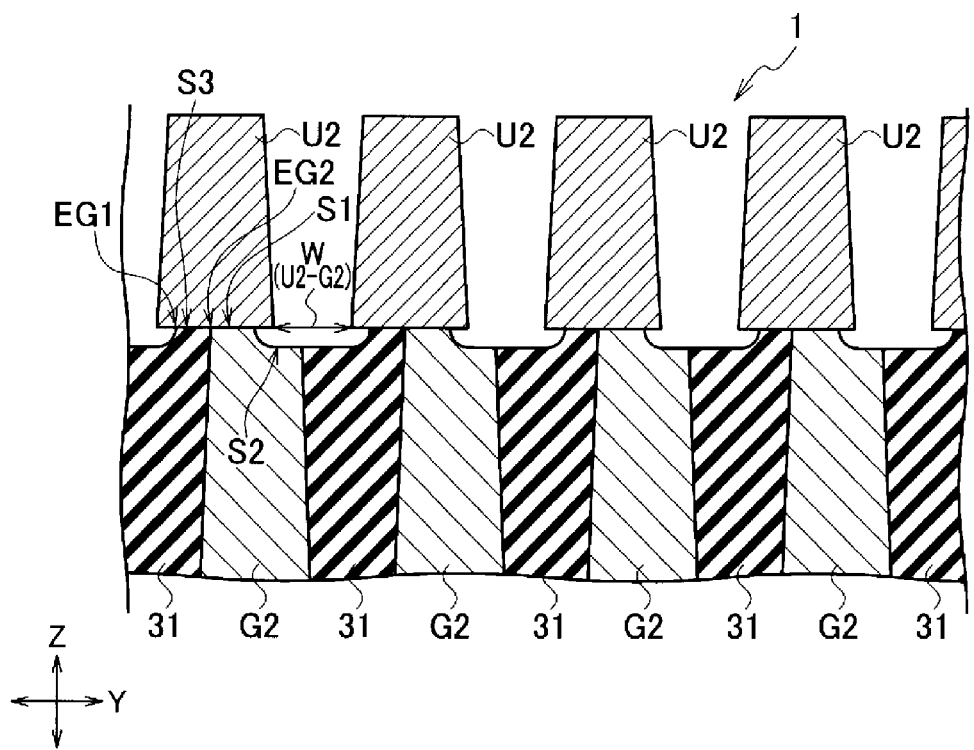
FIG. 9B is a schematic cross-sectional structural diagram of a wiring layer having a two-layer structure in which the upper wiring layer is disposed on the lower wiring layer in the nonvolatile semiconductor storage device according to a modification 1 of the second embodiment.

In the nonvolatile semiconductor storage device 1 according to a modification 1 of the second embodiment, a schematic cross-sectional structure of a wiring layer having a two-layer structure in which the upper wiring layer U2 is disposed on the lower wiring layer G2 is illustrated in FIG. 9B. The wiring layer extending in the X direction has a stacked structure of the lower wiring layer G2 and the upper wiring layer U2. Here, the stacked structure has a recess structure in the Y direction in the stacked interface. In an example of FIG. 9B, the recess structures are provided on both sides of the top of the lower wiring layer G2 which is in contact with the upper wiring layer U2. The recess structure has a U-shaped cross-sectional structure in the Y-Z plane. The recess structure is filled with an insulating film similar to the interlayer insulating film 31. In the nonvolatile semiconductor storage device according to the modification 1 of the second embodiment, the relatively large space W (U2-G2) is formed between the upper wiring layer U2 and the lower wiring layer G2 as compared with the comparative example of FIG. 8A.

As illustrated in FIG. 9B, the lower wiring layer G2 has, among the surface of the lower wiring layer G2, the first surface S1 at the upper side which is in contact with the upper wiring layer U2 and the second surface S2 which has a longer portion than the first surface S1 in the Y direction, is spaced apart from the first surface S1 in the Z direction and extends in the Y direction to be connected to the longer portion.

The upper wiring layer U2 has the third surface S3 among the surface of the upper wiring layer U2 which is in contact with the first surface S1 of the lower wiring layer G2, and the third surface S3 is longer than the first surface S1 in the Y direction.

The third surface S3 has a side end EG1 and a middle end EG2 in the Y direction.

Second Embodiment Modification 2

Figure 9C:
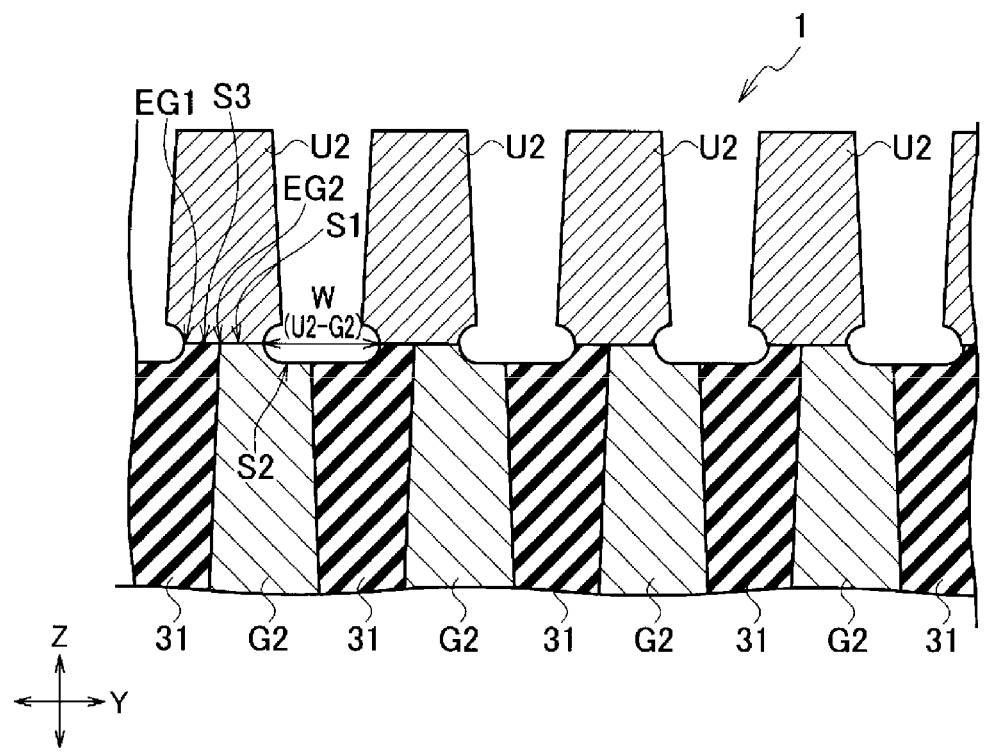
FIG. 9C is a schematic cross-sectional structural diagram of a wiring layer having a two-layer structure in which the upper wiring layer is disposed on the lower wiring layer in the nonvolatile semiconductor storage device according to a modification 2 of the second embodiment.

In the nonvolatile semiconductor storage device 1 according to a modification 2 of the second embodiment, a schematic cross-sectional structure of a wiring layer having a two-layer structure in which the upper wiring layer U2 is disposed on the lower wiring layer G2 is illustrated in FIG. 9C. The wiring layer extending in the X direction has a stacked structure of the lower wiring layer G2 and the upper wiring layer U2. Here, the stacked structure has a recess structure in the Y direction in the stacked interface. In an example of FIG. 9C, the recess structures are provided on both sides of the lower wiring layer G2 and the upper wiring layer U2. The recess structure has a semicircular cross-sectional structure in the Y-Z plane. The recess structure is filled with an insulating film similar to the interlayer insulating film 31. In the nonvolatile semiconductor storage device according to the modification 2 of the second embodiment, the relatively large space W (U2-G2) is formed between the upper wiring layer U2 and the lower wiring layer G2 as compared with the comparative example of FIG. 8A.

As illustrated in FIG. 9C, the lower wiring layer G2 has, among the surface of the lower wiring layer G2, the first surface S1 at the upper side which is in contact with the upper wiring layer U2 and the second surface S2 which has a longer portion than the first surface S1 in the Y direction, is spaced apart from the first surface S1 in the Z direction and extends in the Y direction to be connected to the longer portion.

The upper wiring layer U2 has the third surface S3 among the surface of the upper wiring layer U2 which is in contact with the first surface S1 of the lower wiring layer G2, and the third surface S3 is longer than the first surface S1 in the Y direction.

The third surface S3 has a side end EG1 and a middle end EG2 in the Y direction.

Third Embodiment

Figure 10A:
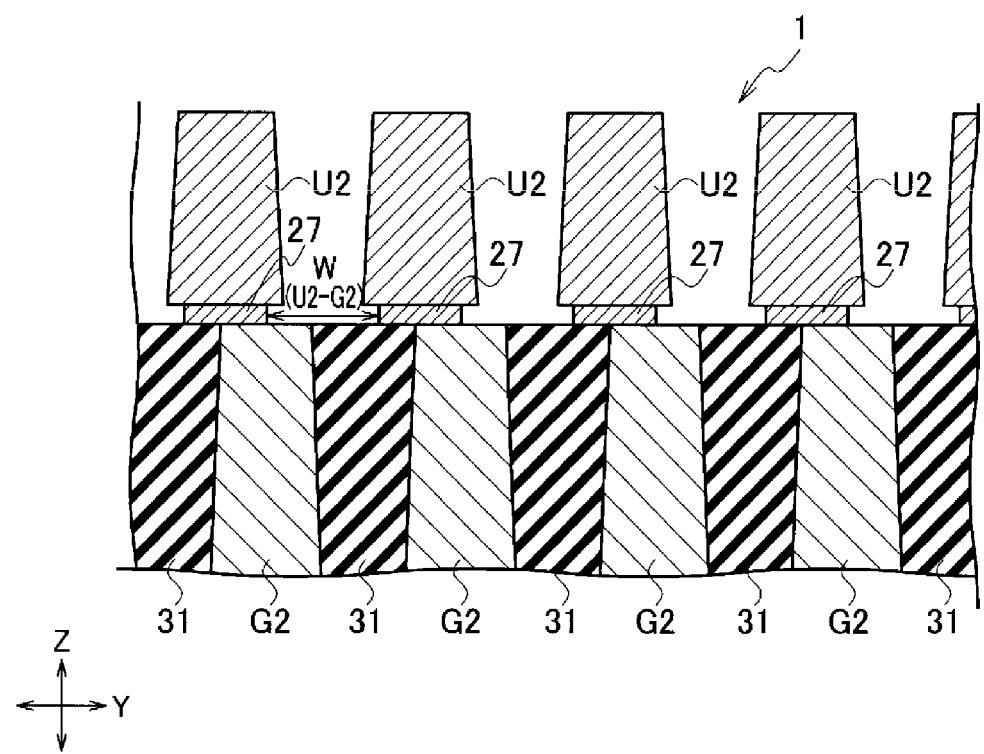
FIG. 10A is a schematic cross-sectional structural diagram of wiring layers having a structure in which a metal layer is further provided between the upper wiring layer and the lower wiring layer in the nonvolatile semiconductor storage device according to a third embodiment.

In the nonvolatile semiconductor storage device according to a third embodiment, a schematic cross-sectional structure of a wiring layer having a structure in which a metal layer 27 is further provided between the upper wiring layer U2 and the lower wiring layer G2 is illustrated in FIG. 10A.

As illustrated in FIG. 10A, the nonvolatile semiconductor storage device 1 according to the third embodiment further includes the metal layer 27 which is arranged between the lower wiring layer G2 and the upper wiring layer U2 and is different from the upper wiring layer U2. The wiring layer extending in the X direction has a stacked structure of the lower wiring layer G2, the metal layer 27, and the upper wiring layer U2. Here, the stacked structure has a recess structure in the Y direction by sandwiching the metal layer 27. In an example of FIG. 10A, the recess structures are provided on both sidewalls of the metal layer 27 between the upper wiring layer U2 and the lower wiring layer G2. The recess structure has a rectangular cross-sectional structure in the Y-Z plane. The recess structure is filled with an insulating film similar to the interlayer insulating film 31. In the nonvolatile semiconductor storage device according to the third embodiment, the relatively large space W (U2-G2) is formed between the upper wiring layer U2 and the lower wiring layer G2 as compared with the comparative example of FIG. 8A.

The lower wiring layer G2 is formed of a metal different from that of the upper wiring layer U2, and also includes the first metal layer 27 connected to the upper wiring layer U2.

This will be described below in detail with reference to FIG. 10A. Further, a two-layer memory cell configuration will be described with reference to FIG. 2.

As illustrated in FIGS. 10A and 2, the nonvolatile semiconductor storage device 1 according to the third embodiment includes a plurality of first wirings 11, a plurality of second wirings G2 (12G), a plurality of third wirings U2 (12U), a plurality of fourth wirings 27, a plurality of fifth wirings 13G, the first memory cell 101, and the second memory cell 102. The plurality of first wirings 11 extend in the Y direction.

The plurality of second wirings G2 (12G) extend in the X direction intersecting the Y direction, are provided above the plurality of first wirings 11 in the Z direction intersecting both the Y direction and the X direction, and have at least a first width in the Y direction.

The plurality of third wirings U2 (12U) extend in the X direction, have at least a second width in the Y direction, and are provided above the second wirings G2 (12G) in the Z direction.

The plurality of fourth wirings 27 extend in the X direction, have a third width smaller than the first width and the second width in the Y direction, and are connected to the respective second wiring G2 (12G) below thereof in the Z direction and connected to the respective third wirings U2 (12U) above thereof in the Z direction.

The plurality of fifth wirings 13G extend in the Y direction, and are provided above the plurality of third wirings U2 in the Z direction.

The first memory cell 101 is arranged between the first wiring 11 and the second wiring G2 at each of a plurality of cross points of the plurality of first wirings 11 and the plurality of second wirings G2, and has the first resistance change film 24.

The second memory cell 102 is arranged between the third wiring U2 (12U) and the fifth wiring 13G at each of a plurality of cross points of the plurality of third wirings U2 (12U) and the plurality of fifth wirings 13G, and has the second resistance change film 24.

Modification

Figure 10B:
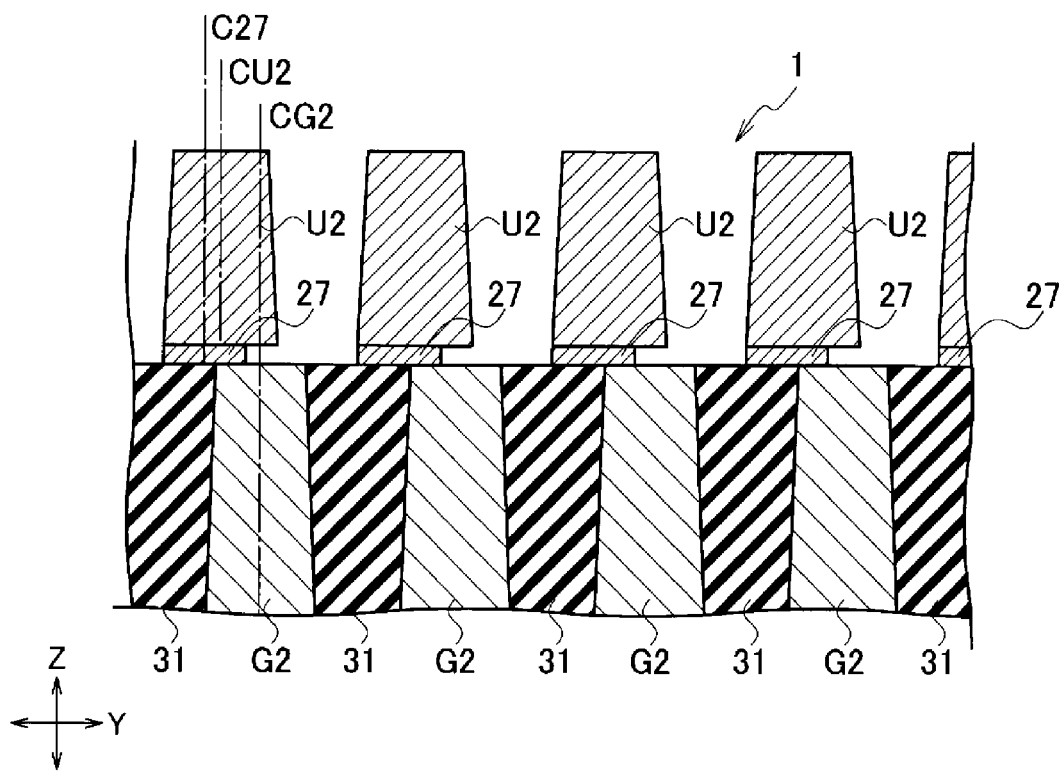
FIG. 10B is a schematic cross-sectional structural diagram of a structure in which the center line in the Y direction of the lower wiring layer, the center line in the Y direction of the upper wiring layer, and the center line in the Y direction of the metal layer are at different positions, respectively, in the nonvolatile semiconductor storage device according to a modification of the third embodiment.

In the nonvolatile semiconductor storage device 1 according to a modification of the third embodiment, a schematic cross-sectional structure in which a center line CG2 in the Y direction of the lower wiring layer G2, a center line CU2 in the Y direction of the upper wiring layer U2, and a center line C27 in the Y direction of the metal layer 27 are at different positions is illustrated in FIG. 10B. As illustrated in FIG. 10B, the center line CG2 in the Y direction of the second wiring G2 and the center line CU2 in the Y direction of the third wiring U2 connected to the fourth wiring 27 which is in turn connected to the second wiring G2 may be at different positions. Here, the structure example of FIG. 10B is an example in which the arrangement of the fourth wiring 27 is shifted in the Y direction as compared with the structure of FIG. 10A.

Further, as illustrated in FIG. 10B, the center line C27 in the Y direction of the fourth wiring 27, the center line CG2 in the Y direction of the second wiring G2 connected to the fourth wiring 27, and the center line CU2 in the Y direction of the third wiring U2 connected to the fourth wiring 27 may be at different positions. Further, in the nonvolatile semiconductor storage device according to the third embodiment illustrated in FIG. 10A, the center line C27 is different from the center line CG2, but coincides with the center line CU2.

(Y Directional Pitch)

Figure 10C:
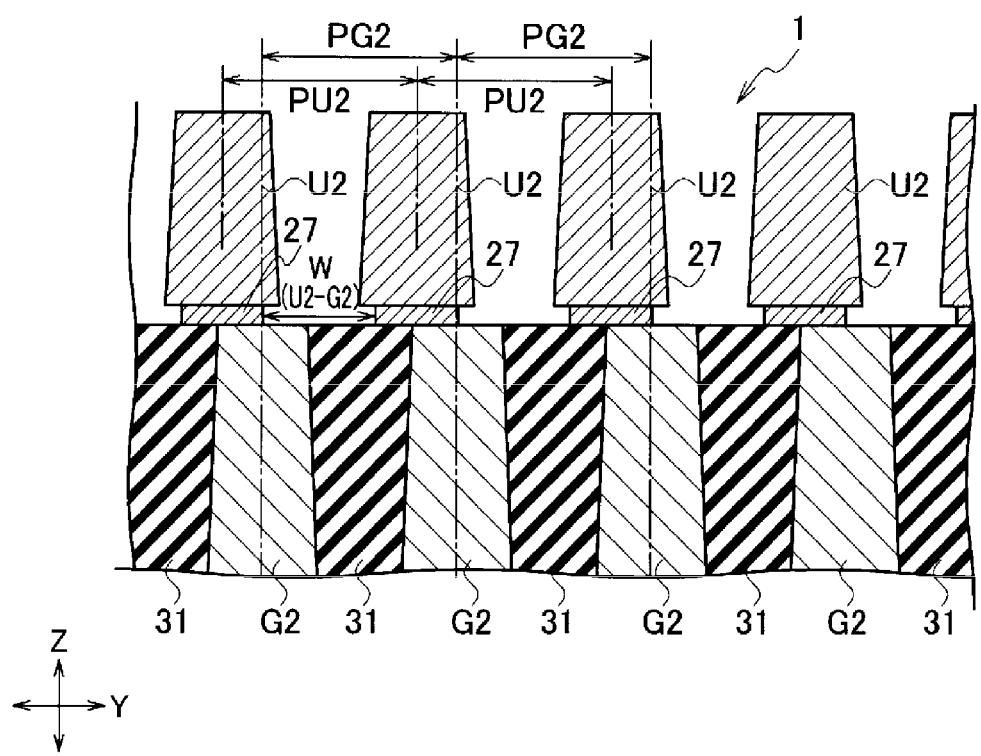
FIG. 10C is a diagram illustrating a pitch in the Y direction of the lower wiring layer and a pitch in the Y direction of the upper wiring layer in the nonvolatile semiconductor storage device according to the third embodiment.

In the nonvolatile semiconductor storage device 1 according to the third embodiment, a pitch PG2 in the Y direction of the lower wiring layer G2 and a pitch PU2 in the Y direction of the upper wiring layer U2 are illustrated in FIG. 10C. As illustrated in FIG. 10C, the plurality of second wirings G2 may be provided at a first pitch PG2 in the Y direction, the plurality of fourth wirings 27 may be provided at a first pitch PG2 in the Y direction, and the plurality of third wirings U2 may be provided at a first pitch PU2 (=PG2) in the Y direction. That is, the plurality of second wirings G2, the plurality of fourth wirings 27, and the plurality of third wirings U2 may be arranged at the same pitch PG2 in the Y direction. Further, the fourth wiring 27 and the second wiring G2 may be integrally formed of the same material.

Further, the fourth wiring 27 may be formed of a material different from those of the second wirings G2 and the third wirings U2.

The nonvolatile semiconductor storage device 1 according to the third embodiment may be formed by forming the upper wiring layer using two different metal materials and selectively etching the metal layer 27 which is in contact with the lower wiring layer G2.

In the third embodiment, the upper wiring layer U2 and the lower wiring layer G2 are formed of any material, any silicide material, or any nitride material selected from the group of W, Mo, polysilicon, Ni, Co, Ti, and Cu.

Further, the metal layer 27 is formed of any material, any silicide material, or any nitride material selected from the group of W, Mo, polysilicon, Ni, Co, Ti, and Cu.

Manufacturing Method of Comparative Example

Figure 11A:
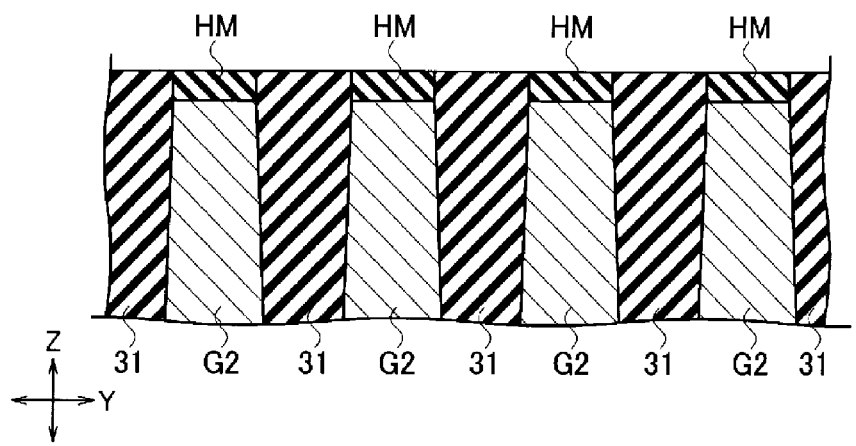
FIG. 11A is a schematic cross-sectional structural diagram of one process of a manufacturing method of forming a wiring layer having a two-layer structure in which the upper wiring layer is disposed on the lower wiring layer in the nonvolatile semiconductor storage device according to the comparative example.
Figure 11B:
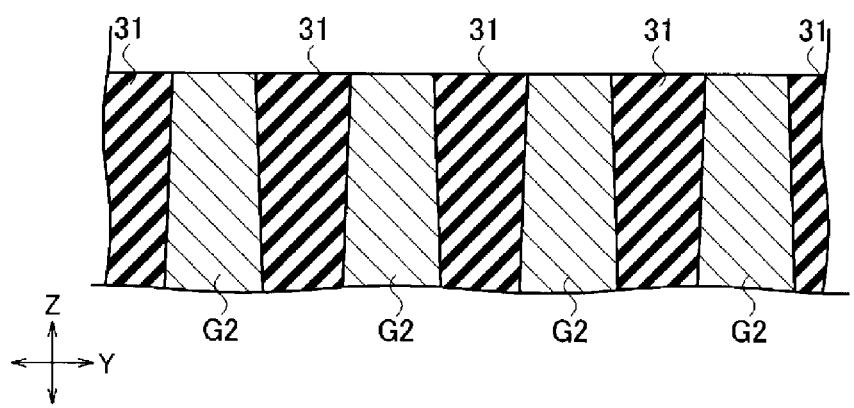
FIG. 11B is a schematic cross-sectional structural diagram of one process of the manufacturing method of forming the wiring layer having a two-layer structure in which the upper wiring layer is disposed on the lower wiring layer in the nonvolatile semiconductor storage device according to the comparative example.
Figure 11C:
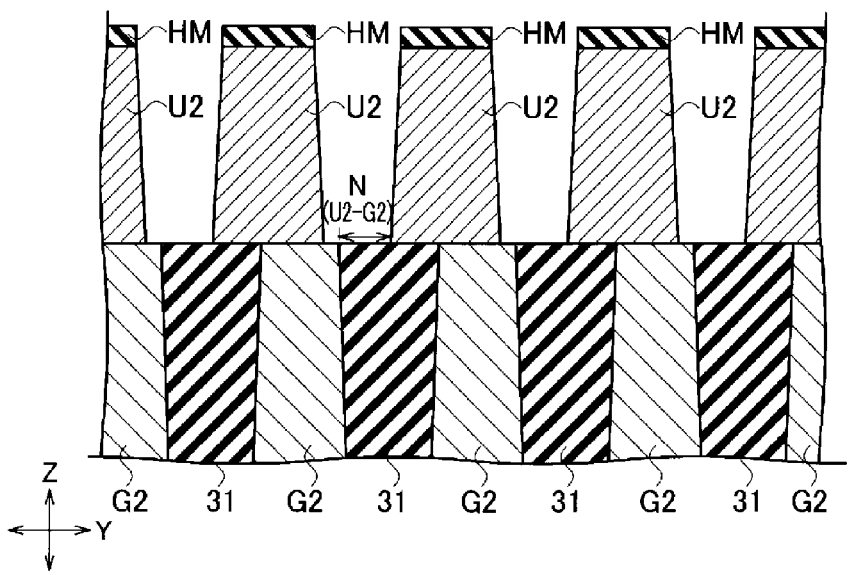
FIG. 11C is a schematic cross-sectional structural diagram of one process of the manufacturing method of forming the wiring layer having a two-layer structure in which the upper wiring layer is disposed on the lower wiring layer in the nonvolatile semiconductor storage device according to the comparative example.

In the nonvolatile semiconductor storage device according to the comparative example, a manufacturing method of forming a wiring layer having a two-layer structure in which the upper wiring layer U2 is disposed on the lower wiring layer G2 is illustrated in FIGS. 11A to 11C.

(a) First, as illustrated in FIG. 11A, after the lower wiring layer G2 is formed using a sputtering technique, the lower wiring layer G2 is patterned by RIE using the hard mask HM such as SiN. Thereafter, the patterned lower wiring layer G2 is filled with the interlayer insulating film 31.

(b) Next, as illustrated in FIG. 11B, the hard mask HM such as SiN and the interlayer insulating film 31 such as $SiO_2$ are etched (etched back) using an RIE technique. As a result, the lower wiring layer G2 is exposed.

(c) Next, as illustrated in FIG. 11C, after the upper wiring layer U2 is formed using a sputtering technique, the upper wiring layer U2 is patterned by RIE using the hard mask HM.

As illustrated in FIG. 11C, the lower wiring layer G2 is formed so as to be embedded in the interlayer insulating film 31, and only the narrow space N (U2-G2) may be formed between the upper wiring layer U2 and the lower wiring layer G2.

Manufacturing Method of First Embodiment

The basic structure illustrated in FIG. 1 may be manufactured, for example, as follows. After stacked films including the memory cell 10 are stacked on the wiring layer 11, the stacked films and the wiring layer 11 are processed into a stripe structure in the Y direction. After an interlayer insulating film is embedded in a trench between the stacked films formed by the processing, the wiring layer 12 is formed on the stacked films and the interlayer insulating film. The wiring layer 12 is processed into a stripe structure in the X direction, and the stacked films and the interlayer insulating film under and between the wiring layers 12 processed into a stripe structure are also processed, so that the memory cell 10 including a plurality of stacked films having a substantially columnar shape (hereinafter, simply referred to as "columnar shape") may be formed at the cross point of the wiring layer 12 and the wiring layer 11.

(Etching Gas System)

As an etching gas (etchant) when forming a W wiring by reactive ion etching (RIE), for example, $CF_4/O_2$ may be applied. As an etchant when forming an Mo wiring by RIE, for example, HBr or bromotrifluoromethane ($CBrF_3$) may be applied. Bromotrifluoromethane ($CBrF_3$) assists in easier etching of Mo than W. In addition to the above, for example, $CCl_4$ and $SiCl_4/O_2/CHF_3$ may also be applied as an etchant when forming the Mo wiring.

As an etchant that may be applied to the etching of Mo rather than the etching of W, a mixed gas of F- or Cl-based halogen gas and $O_2$ gas may also be applied. The presence of $O_2$ makes it possible to use the properties that Mo is more likely to be oxidized than W and that oxidation promotes etching. For example, the mixed gas of F- or Cl-based halogen gas and $O_2$ gas may be $CF_4/O_2$, $CHF_3/O_2$, $CH_2F_2/O_2$, $SF_6/O_2$, or $Cl_2/O_2$.

As an etchant effective for the etching of W rather than the etching of Mo, F-based gas may also be applied. A metal electrode is mainly processed by chemical etching rather than physical etching, and W—F has a low vapor pressure, and thus, etching thereof is easier than Mo. W may be etched by utilizing this property.

Figure 12A:
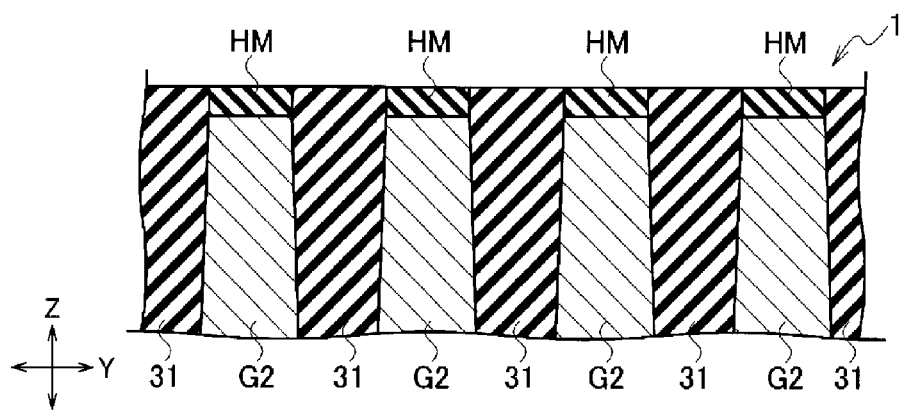
FIG. 12A is a schematic cross-sectional structural diagram of one process of a manufacturing method of forming a wiring layer having a two-layer structure in which the upper wiring layer is disposed on the lower wiring layer in the nonvolatile semiconductor storage device according to the first embodiment.
Figure 12B:
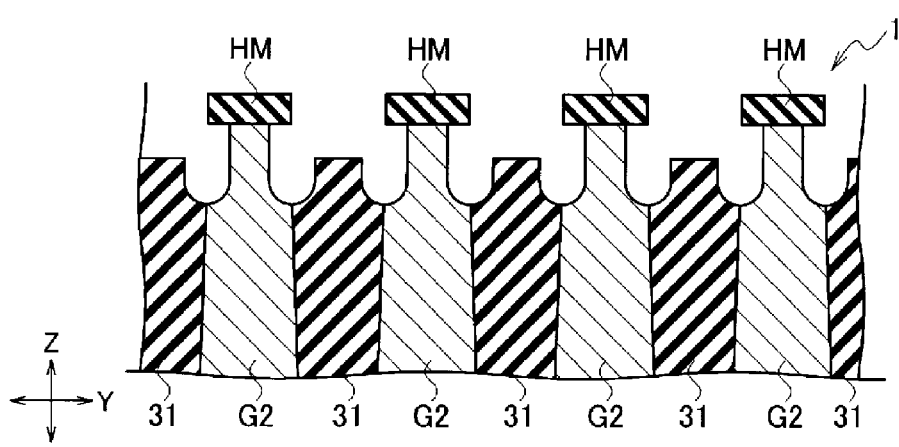
FIG. 12B is a schematic cross-sectional structural diagram of one process of the manufacturing method of forming the wiring layer having a two-layer structure in which the upper wiring layer is disposed on the lower wiring layer in the nonvolatile semiconductor storage device according to the first embodiment.
Figure 12C:
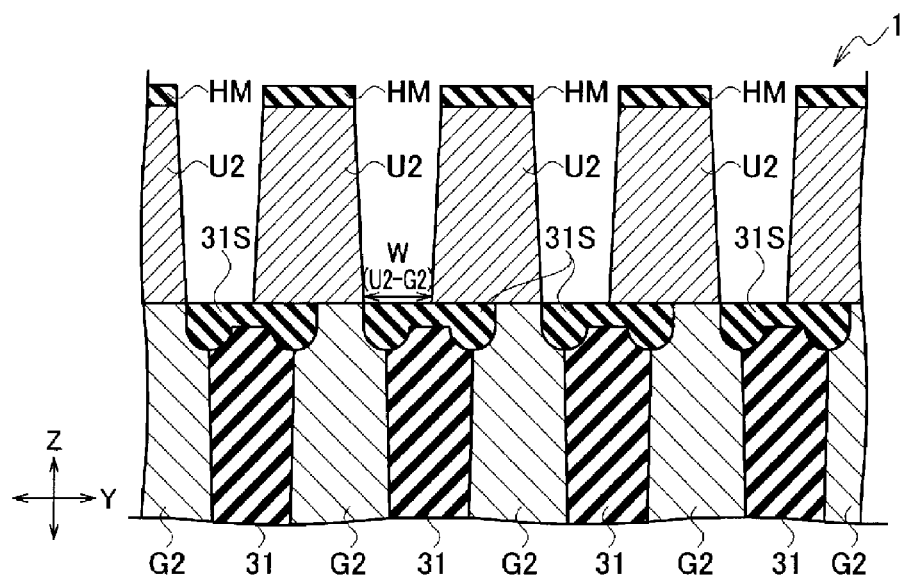
FIG. 12C is a schematic cross-sectional structural diagram of one process of the manufacturing method of forming the wiring layer having a two-layer structure in which the upper wiring layer is disposed on the lower wiring layer in the nonvolatile semiconductor storage device according to the first embodiment.

In the nonvolatile semiconductor storage device 1 according to the first embodiment, a manufacturing method of forming a wiring layer having a two-layer structure in which the upper wiring layer U2 is disposed on the lower wiring layer G2 is illustrated in FIGS. 12A to 12C.

(a) First, as illustrated in FIG. 12A, after the lower wiring layer G2 is formed using a sputtering technique, the lower wiring layer G2 is patterned by RIE using the hard mask HM. As the hard mask HM, for example, SiN may be applied. Thereafter, the patterned lower wiring layer G2 is filled with the interlayer insulating film 31.

(b) Next, as illustrated in FIG. 12B, both sides of the top of the lower wiring layer G2 are selectively etched into a circular recess structure. In order to selectively etch the lower wiring layer G2, wet etching or dry etching may be used. As a wet etching condition, for example, a mixed acid or a mixed solution of $H_2O_2$ and TMY may be applied when the upper wiring layer U2 is W. Further, a mixed solution of $H_2O_2$ and HCl may also be applied. Further, for example, HBr or $CF_4/O_2$ based etching gas may be applied as a dry etching condition. Here, TMY is an aqueous solution of choline, and is called trimethyl-2-hydroxyethylammonium hydroxide.

(c) Next, as illustrated in FIG. 12C, after the selectively etched recess structure is filled with the interlayer insulating film 31S similar to the interlayer insulating film 31, the interlayer insulating film 31S is flattened using a chemical mechanical polishing (CMP) technique. As a result, the lower wiring layer G2 is exposed. An $SiO_2$ film is used as the interlayer insulating film 31 or the material of the interlayer insulating film 31S which is embedded in the etched portion and is then flattened. The material of the interlayer insulating film 31S may be formed by applying and annealing an SiOC film because of a narrow space.

(d) Next, as illustrated in FIG. 12C, after the upper wiring layer U2 is formed using a sputtering technique, the upper wiring layer U2 is patterned by RIE using the hard mask HM.

As illustrated in FIG. 12C, the lower wiring layer G2 is formed so as to be embedded in the interlayer insulating film 31 or 31S, and the relatively wide space W (U2-G2) is formed between the upper wiring layer U2 and the lower wiring layer G2 as compared with the comparative example of FIG. 11C.

Manufacturing Method of Second Embodiment

In the nonvolatile semiconductor storage device 1 according to the second embodiment, a manufacturing method of forming a wiring layer having a two-layer structure in which the upper wiring layer U2 is disposed on the lower wiring layer G2 is illustrated in FIGS. 13A to 13E.

Figure 13A:
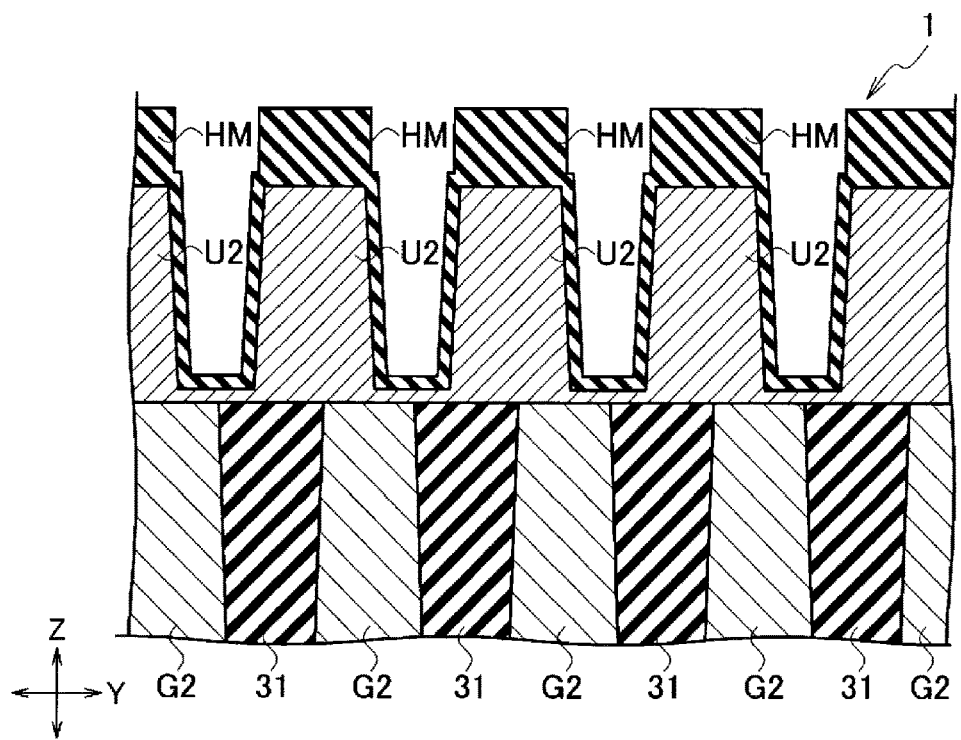
FIG. 13A is a schematic cross-sectional structural diagram of one process of a manufacturing method of forming a wiring layer having a two-layer structure in which the upper wiring layer is disposed on the lower wiring layer in the nonvolatile semiconductor storage device according to the second embodiment.

(a) First, as illustrated in FIG. 13A, after the lower wiring layer G2 is formed using a sputtering technique, the lower wiring layer G2 is patterned by RIE using the hard mask HM such as SiN. Thereafter, the patterned lower wiring layer G2 is filled with the interlayer insulating film 31.

(b) Next, as illustrated in FIG. 13A, the hard mask HM such as SiN and the interlayer insulating film 31 such as $SiO_2$ are etched (etched back) using an RIE technique. As a result, the lower wiring layer G2 is exposed.

(c) Next, as illustrated in FIG. 13A, after the upper wiring layer U2 is formed using a sputtering technique, the upper wiring layer U2 is patterned by RIE using the hard mask HM. At this time, a thin layer of the upper wiring layer U2 is also formed on the lower wiring layer G2 and the interlayer insulating film 31 between the patterned upper wiring layers U2.

(d) Next, as illustrated in FIG. 13A, a liner insulating film such as SiN is formed on the upper wiring layer U2. The liner insulating film is formed using a chemical vapor deposition (CVD) method.

(e) Next, as illustrated in FIG. 13A, the hard mask HM such as SiN is formed on the upper wiring layer U2 using a CVD method.

Figure 13B:
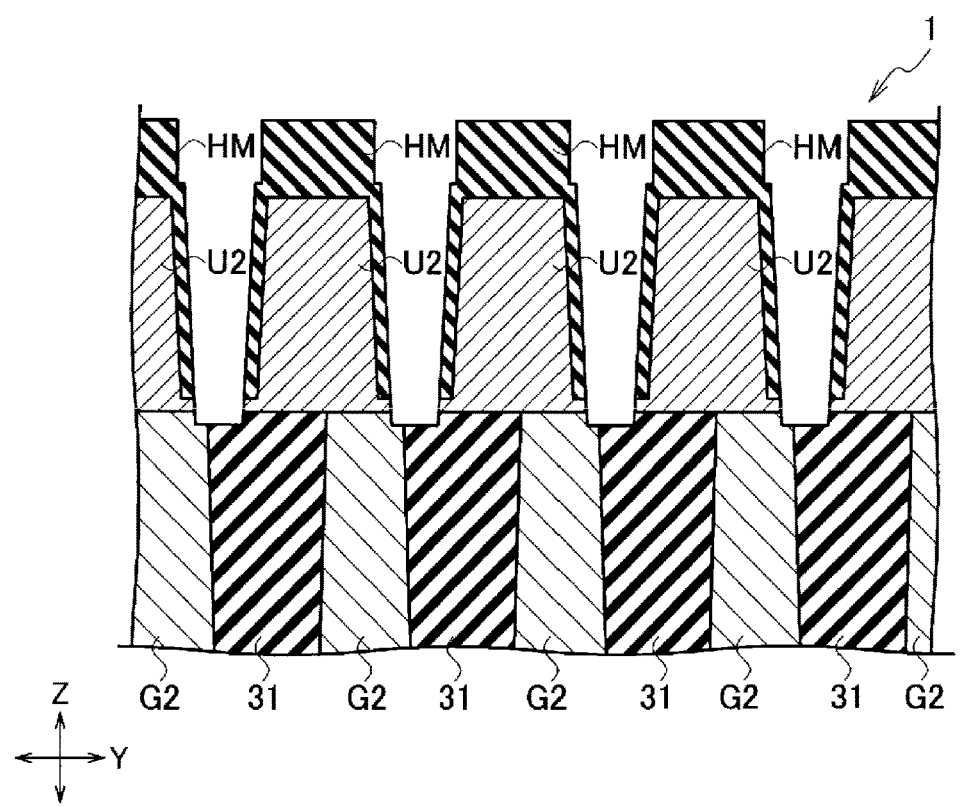
FIG. 13B is a schematic cross-sectional structural diagram of one process of the manufacturing method of forming the wiring layer having a two-layer structure in which the upper wiring layer is disposed on the lower wiring layer in the nonvolatile semiconductor storage device according to the second embodiment.

(f) Next, as illustrated in FIG. 13B, a thin layer portion of the upper wiring layer U2 is etched using wet etching to form a recess structure. As the wet etching condition, for example, a mixed acid or a mixed solution of $H_2O_2$ and TMY may be applied when the upper wiring layer U2 is W. Further, a mixed solution of $H_2O_2$ and HCl may also be applied. As a result, the space between the upper wiring layer U2 and the lower wiring layer G2 may be expanded. Since a sidewall portion of the upper wiring layer U2 may be protected by the liner insulating film such as SiN, the space may be expanded in the connection portion between the upper wiring layer U2 and the lower wiring layer G2. In this process, minute short-circuit terminals in the thin layer portion between the lower wiring layer G2 and the upper wiring layer U2 are separated by wet etching.

A part of the wiring material is left on the processed bottom of the upper wiring layer U2 because a wet etching chemical solution stays on and is caught by a bottom portion of the upper wiring layer U2 and a top portion of the lower wiring layer G2 by leaving and wet etching a part of the wiring material. Meanwhile, the sidewall portion of the upper wiring layer U2 may be protected by the liner insulating film such as SiN.

(g) Next, as illustrated in FIG. 13B, after removing the liner insulating film from the processed bottom of the upper wiring layer U2, dry etching is further performed to partially remove the upper wiring layer U2 in the processed bottom, the top of the interlayer insulating film 31, and the top of the lower wiring layer G2. Further, the upper wiring layer U2 may be etched as illustrated in FIG. 13C depending on the material and processing conditions of the upper wiring layer U2.

Figure 13C:
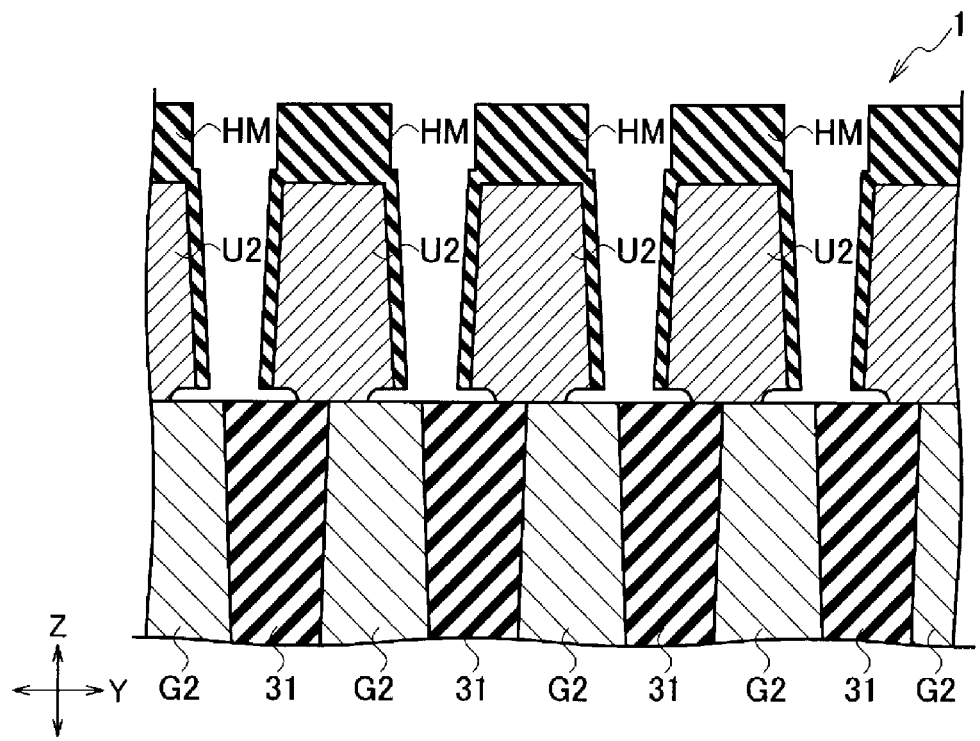
FIG. 13C is a schematic cross-sectional structural diagram of one process of the manufacturing method of forming the wiring layer having a two-layer structure in which the upper wiring layer is disposed on the lower wiring layer in the nonvolatile semiconductor storage device according to the second embodiment.
Figure 13D:
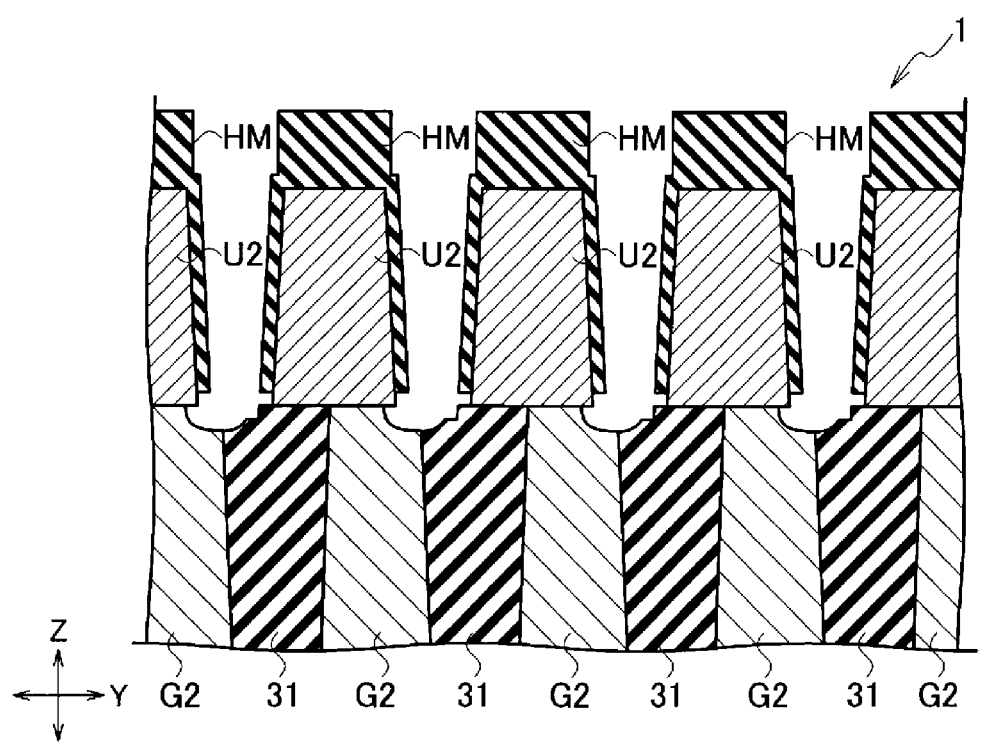
FIG. 13D is a schematic cross-sectional structural diagram of one process of the manufacturing method of forming the wiring layer having a two-layer structure in which the upper wiring layer is disposed on the lower wiring layer in the nonvolatile semiconductor storage device according to the second embodiment.

(h) After the process of FIG. 13B, as illustrated in FIG. 13D, the upper wiring layer U2 in the processed bottom, the interlayer insulating film 31, and the top of the lower wiring layer G2 are partially removed by wet etching. As a wet etching condition, for example, a mixed acid or a mixed solution of $H_2O_2$ and TMY may be applied when the upper wiring layer U2 is W. Further, a mixed solution of $H_2O_2$ and HCl may also be applied.

Figure 13E:
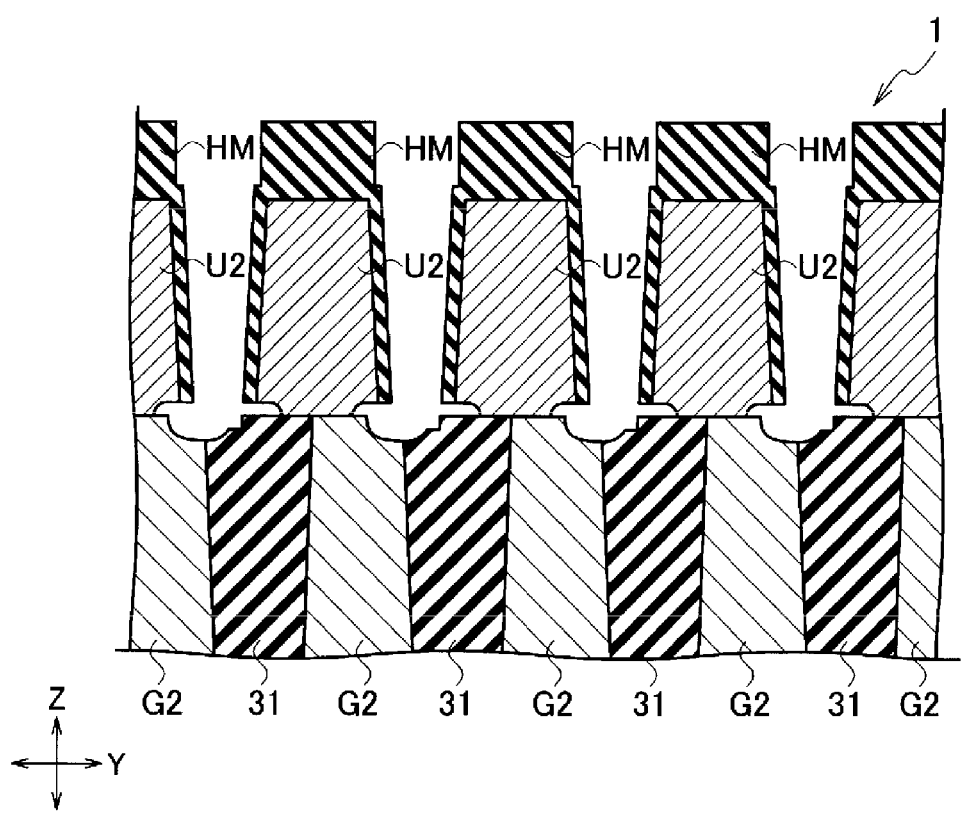
FIG. 13E is a schematic cross-sectional structural diagram of one process of the manufacturing method of forming the wiring layer having a two-layer structure in which the upper wiring layer is disposed on the lower wiring layer in the nonvolatile semiconductor storage device according to the second embodiment.

(i) Similarly, after the process of FIG. 13C, as illustrated in FIG. 13E, the upper wiring layer U2 in the processed bottom, the interlayer insulating film 31, and top of the lower wiring layer G2 are partially removed by wet etching. As a wet etching condition, for example, a mixed acid or a mixed solution of $H_2O_2$ and TMY may be applied when the upper wiring layer U2 is W. Further, a mixed solution of $H_2O_2$ and HCl may also be applied.

Through the above processes, the recess structure may be formed in any of various shapes such a shape in which a bottom portion of the upper wiring layer U2 is recessed, a shape in which a top portion of the lower wiring layer G2 is recessed, an elliptical shape, a semicircular shape, a U-shaped shape, a triangular shape, a rectangular shape, or a polygonal shape, or a combination thereof.

Manufacturing Method of Third Embodiment

Figure 14A:
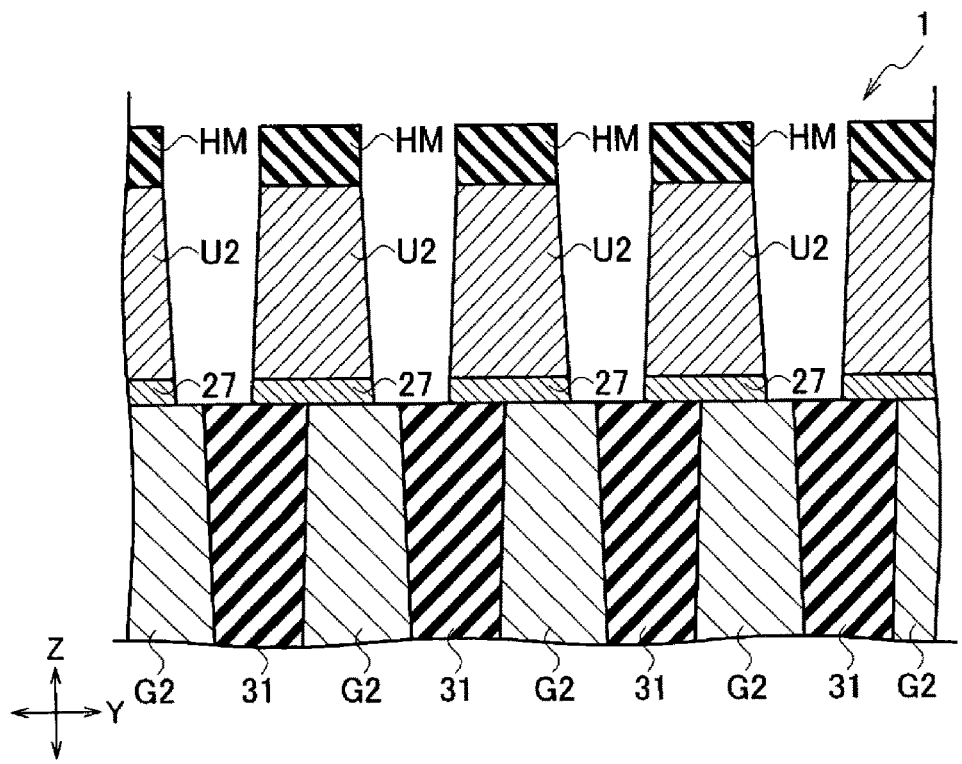
FIG. 14A is a schematic cross-sectional structural diagram of one process of a manufacturing method of forming a wiring layer having a two-layer structure in which the upper wiring layer is disposed on the lower wiring layer in the nonvolatile semiconductor storage device according to the third embodiment.
Figure 14B:
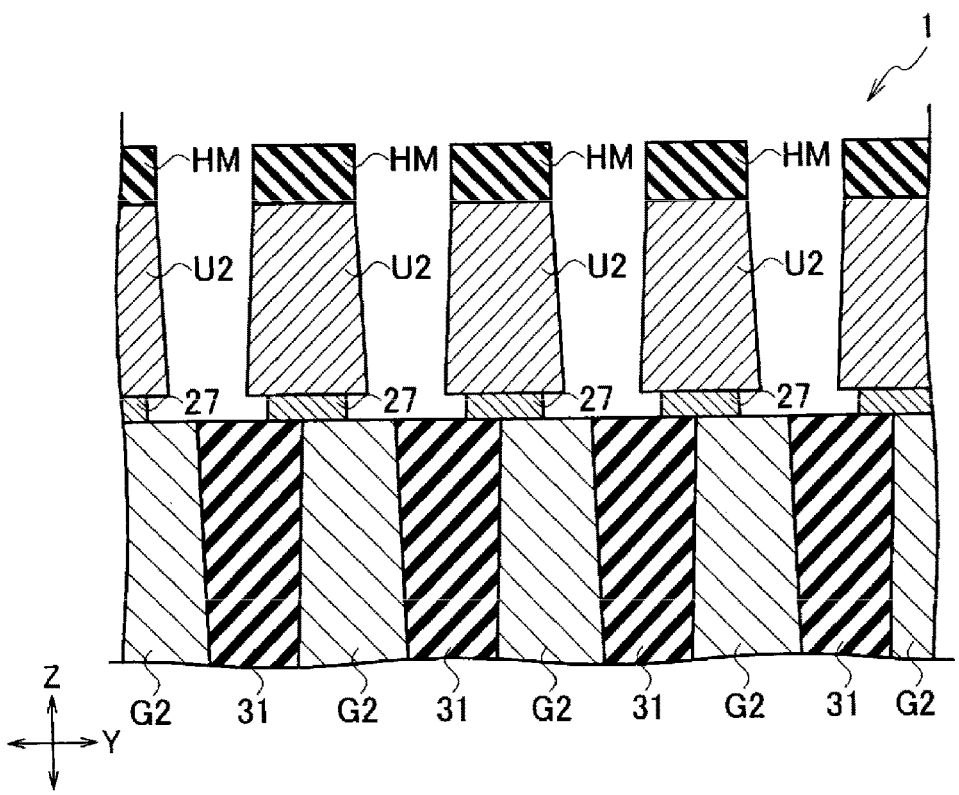
FIG. 14B is a schematic cross-sectional structural diagram of one process of the manufacturing method of forming the wiring layer having a two-layer structure in which the upper wiring layer is disposed on the lower wiring layer in the nonvolatile semiconductor storage device according to the third embodiment.

In the nonvolatile semiconductor storage device 1 according to the third embodiment, a manufacturing method of forming a wiring layer having a two-layer structure in which the upper wiring layer U2 is disposed on the lower wiring layer G2 is illustrated in FIGS. 14A and 14B.

(a) First, as illustrated in FIG. 14A, after the lower wiring layer G2 is formed using a sputtering technique, the lower wiring layer G2 is patterned by RIE using the hard mask HM such as SiN. Thereafter, the patterned lower wiring layer G2 is filled with the interlayer insulating film 31.

(b) Next, as illustrated in FIG. 14A, the hard mask HM such as SiN and the interlayer insulating film 31 such as $SiO_2$ are etched (etched back) using an RIE technique. As a result, the lower wiring layer G2 is exposed.

(c) Next, as illustrated in FIG. 14A, after the metal layer 27 and the upper wiring layer U2 are formed using a sputtering technique, the upper wiring layer U2 and the metal layer 27 are patterned by RIE using the hard mask HM.

(d) Next, as illustrated in FIG. 14B, the sidewall of the metal layer 27 is partially removed in the Y direction by wet etching or RIE. When the metal layer 27 is formed of polysilicon, for example, a mixed solution of $H_2O_2$ and TMY may be applied as an etching solution. When the metal layer 27 is formed of TiSi, for example, a Diluted Hydrofluoric acid (DHF) (a mixed solution of HF and $H_2O$) may be applied as an etching solution. When the metal layer 27 is formed of Mo, for example, $BCl_3$ may be applied as an RIE condition. $BCl_3$ has a higher etching rate than W, and thus, is effective when the upper wiring layer U2 is formed of W. When the metal layer 27 is formed of Mo, for example, $NF_3$/Cl or $SF_6$(S and F) may also be applied as an RIE condition.

According to the manufacturing method of the third embodiment, the upper wiring layer is formed of at least two different materials, and only a portion thereof which is in contact with the lower wiring layer G2 is selectively etched, so that a space is formed between the upper wiring layer U2 and the lower wiring layer G2 as illustrated in FIG. 14B.

Manufacturing Method of Forming Lower Wiring Layer G2 of Embodiment

Figure 15A:
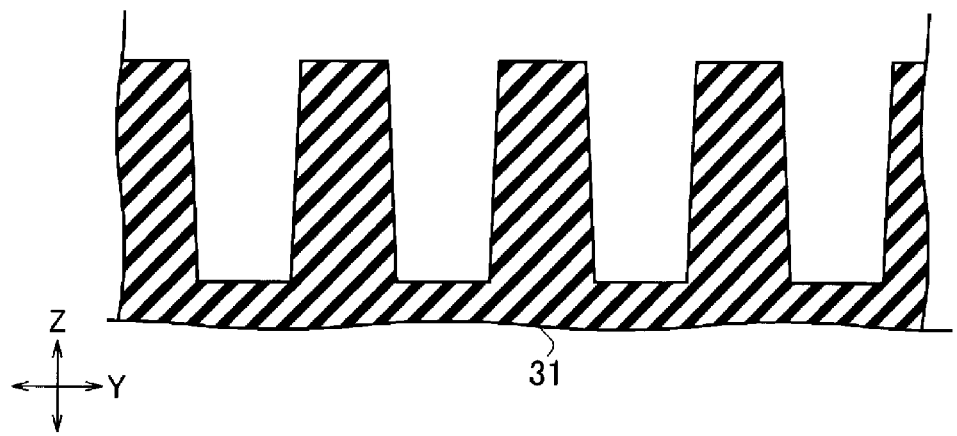
FIG. 15A is a schematic cross-sectional structural diagram of one process of a manufacturing method of forming the lower wiring layer in the nonvolatile semiconductor storage device according to the first embodiment.
Figure 15B:
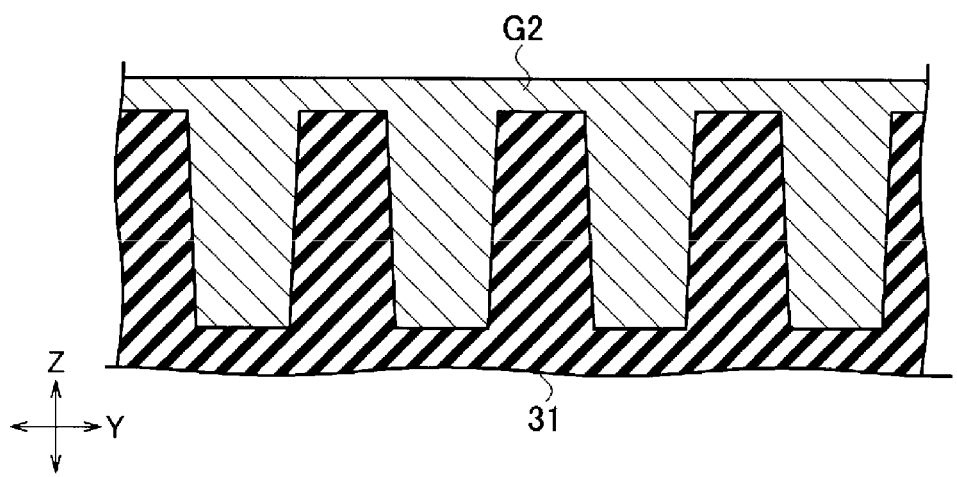
FIG. 15B is a schematic cross-sectional structural diagram of one process of the manufacturing method of forming the lower wiring layer in the nonvolatile semiconductor storage device according to the first embodiment.
Figure 15C:
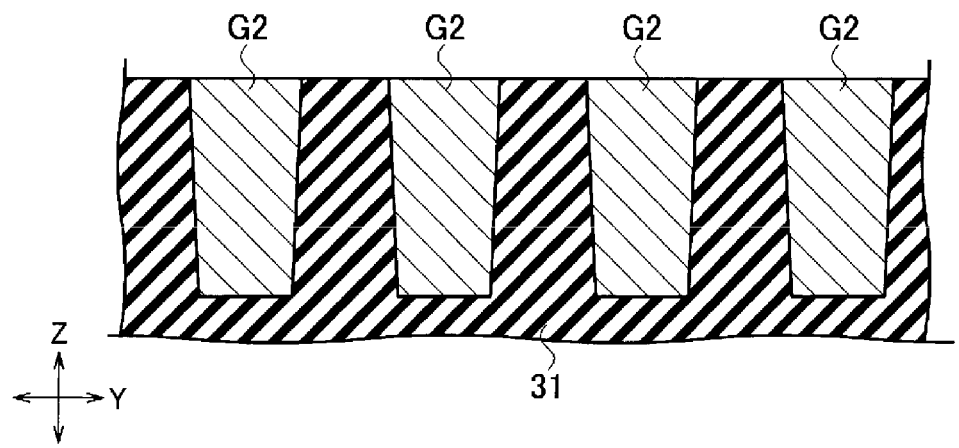
FIG. 15C is a schematic cross-sectional structural diagram of one process of the manufacturing method of forming the lower wiring layer in the nonvolatile semiconductor storage device according to the first embodiment.

In the nonvolatile semiconductor storage device according to the embodiment, a manufacturing method of forming the lower wiring layer G2 is illustrated in FIGS. 15A to 15C. The manufacturing method illustrated in FIGS. 15A to 15C may be referred to as a damascene wiring manufacturing method because the lower wiring layer is formed by embedding a metal in an insulating layer.

(a) First, as illustrated in FIG. 15A, a recess structure which extends in the X direction and has a predetermined pattern pitch in the Y direction is formed in the interlayer insulating film 31 by RIE. Here, the interlayer insulating film 31 includes a silicon oxide film formed, for example, by a plasma CVD method using a source gas containing tetraethyl orthosilicate (tetraethoxysilane: TEOS), a low pressure CVD method, an Atomic Layer Deposition (ALD) method, or a coating method. A TEOS etching condition is, for example, RIE using $C_4F_8/O_2$/Ar as an etching gas.

(b) Next, as illustrated in FIG. 15B, a metal layer which is to be the lower wiring layer G2 is formed on the entire surface.

(c) Next, as illustrated in FIG. 15C, the surface of the lower wiring layer G2 is etched and flattened using RIE or wet etching. As a result, the surface of the lower wiring layer G2 is exposed. When the lower wiring layer G2 is formed of Mo, for example, $BCl_3$ may be applied as an etching gas for RIE. As another etching gas, for example, $NF_3$/Cl or $SF_6$(S and F) may also be applied.

Another Manufacturing Method of Forming Lower Wiring Layer G2 of Embodiment

Figure 16A:
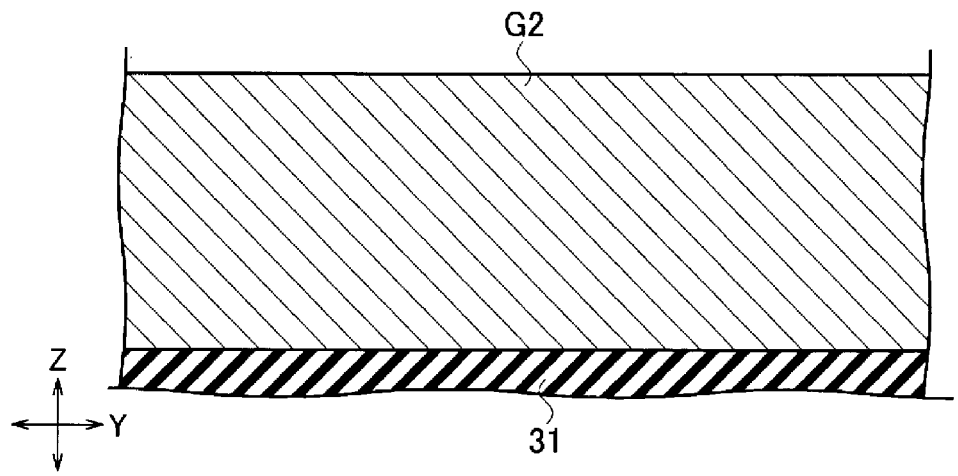
FIG. 16A is a schematic cross-sectional structural diagram of one process of another manufacturing method of forming the lower wiring layer in the nonvolatile semiconductor storage device according to the first embodiment.
Figure 16B:
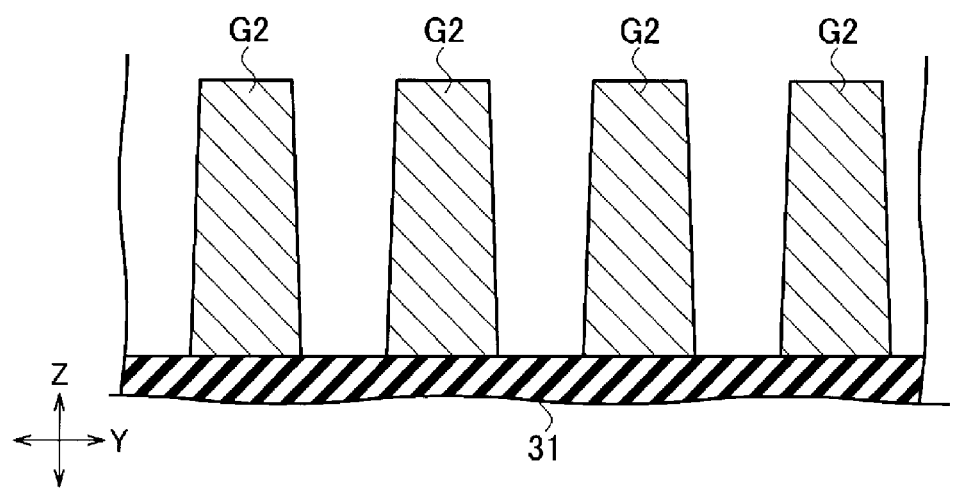
FIG. 16B is a schematic cross-sectional structural diagram of one process of the other manufacturing method of forming the lower wiring layer in the nonvolatile semiconductor storage device according to the first embodiment.
Figure 16C:
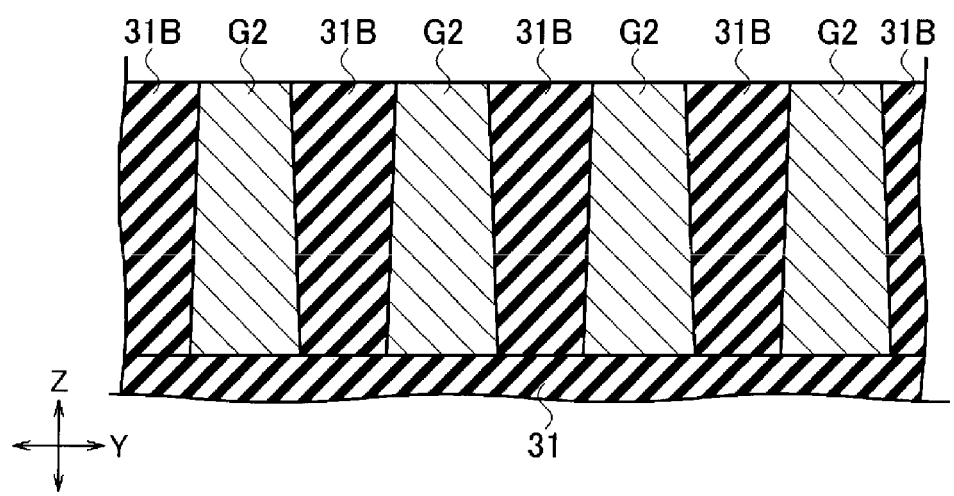
FIG. 16C is a schematic cross-sectional structural diagram of one process of the other manufacturing method of forming the lower wiring layer in the nonvolatile semiconductor storage device according to the first embodiment.

In the nonvolatile semiconductor storage device according to the embodiment, another manufacturing method of forming the lower wiring layer G2 is illustrated in FIGS. 16A to 16C. The manufacturing method illustrated in FIGS. 16A to 16C may be referred to as an RIE wiring manufacturing method because the lower wiring layer G2 is RIE-processed.

(a) First, as illustrated in FIG. 16A, a metal layer which is to be the lower wiring layer G2 is formed on the entire surface of the interlayer insulating film 31.

(b) Next, as illustrated in FIG. 16B, the lower wiring layers G2 which extend in the X direction and have a predetermined pattern pitch in the Y direction are formed by RIE. When the lower wiring layers G2 are formed of Mo, for example, $BCl_3$ may be applied for RIE. In addition to this, for example, $NF_3$/Cl or $SF_6$(S and F) may also be applied.

(c) Next, as illustrated in FIG. 16C, an interlayer insulation film 31B is embedded in a trench groove between the lower wiring layers G2. The interlayer insulating film 31B includes, for example, a TEOS silicon oxide film. A TEOS etching condition is, for example, RIE using $C_4F_8/O_2$/Ar as an etching gas. As a result, the surface of the lower wiring layer G2 is exposed.

The manufacturing method of the nonvolatile semiconductor storage device according to the embodiment may be a combination of the damascene wiring manufacturing method and the RIE wiring manufacturing method. According to the damascene wiring manufacturing method, the lower wiring layer G2 has a tapered shape that widens to the surface side in the Z direction, as illustrated in FIG. 15C.

Meanwhile, according to the RIE wiring manufacturing method, the lower wiring layer G2 has a tapered shape that narrows to the surface side in the Z direction, as illustrated in FIG. 16C.

Comparative Example Two-Layer Memory Cell Configuration

Figure 17A:
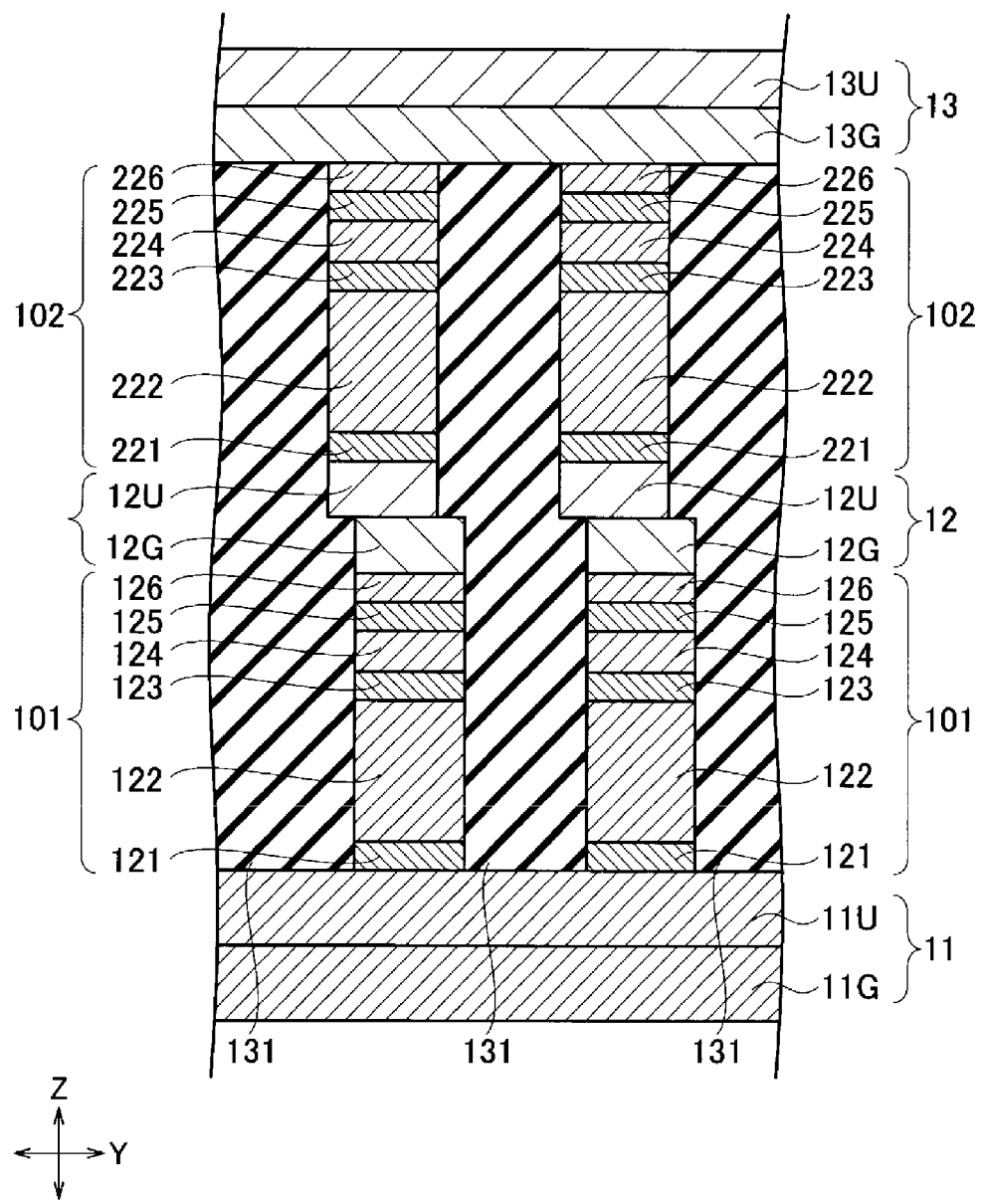
FIG. 17A is a schematic cross-sectional structural diagram of a memory cell two-stage configuration part of the nonvolatile semiconductor storage device according to the comparative example.

A schematic cross-sectional structure of a memory cell two-stage configuration part of the nonvolatile semiconductor storage device according to the comparative example is illustrated in FIG. 17A.

FIG. 17A corresponds to a schematic cross-sectional structure viewed from the Y-Z direction. In FIG. 17A, in order to describe a two-layer memory cell structure, the first memory cell is designated by 101 and the second memory cell is designated by 102, but these memory cells indicate the same memory cell 10. Further, the stacked films of the first memory cell 101 are designated by 121, 122, 123, 124, 125, and 126, and the stacked films of the second memory cell 102 are designated by 221, 222, 223, 224, 225, and 226, but the respective layers correspond to the stacked films 21, 22, 23, 24, 25, and 26 as in FIG. 2, and have the same stacked film structure. This is the same hereinafter.

As illustrated in FIG. 17A, the nonvolatile semiconductor storage device according to the comparative example includes the plurality of first wiring layers 11, the plurality of second wiring layers 12, and the first memory cell 101. The plurality of first wiring layers 11 extend in the Y direction. The plurality of second wiring layers 12 extend above the plurality of first wiring layers 11 in the X direction intersecting the Y direction. The first memory cell 101 is arranged between the second wiring layer 12 and the first wiring layer 11 at each of the cross points of the plurality of second wiring layers 12 and the plurality of first wiring layers 11.

Further, as illustrated in FIG. 17A, the nonvolatile semiconductor storage device according to the comparative example includes the plurality of third wiring layers 13 and the second memory cell 102. The plurality of third wiring layers 13 extend above the plurality of second wiring layers 12 in the Y direction. The second memory cell 102 is arranged between the third wiring layer 13 and the second wiring layer 12 at each of the cross points of the plurality of third wiring layers 13 and the plurality of second wiring layers 12. An interlayer insulating film 131 is arranged between adjacent first memory cells 101, between adjacent second memory cells 102, and between the plurality of first wiring layers 11 and the plurality of second wiring layers 12. The interlayer insulating film 131 is formed of the same material as the above-described interlayer insulating film 31. The interlayer insulating film 131 is arranged between the plurality of second wiring layers 12 and the plurality of third wiring layers 13.

As illustrated in FIG. 17A, the first wiring layer 11 has a stacked structure of the first lower wiring layer 11G and the first upper wiring layer 11U connected to the first memory cell 101.

As illustrated in FIG. 17A, the second wiring layer 12 has a stacked structure of the second lower wiring layer 12G connected to the first memory cell 101 and the second upper wiring layer 12U connected to the second memory cell 102.

As illustrated in FIG. 17A, the third wiring layer 13 has a stacked structure of the third lower wiring layer 13G connected to the second memory cell 102 and the third upper wiring layer 13U.

In the nonvolatile semiconductor storage device according to the comparative example, as illustrated in FIG. 17A, the space between the second lower wiring layer 12G and the second upper wiring layer 12U which are adjacent to each other is narrow, and thus, shorting easily occurs.

Fourth Embodiment Two-Layer Memory Cell Configuration

Figure 17B:
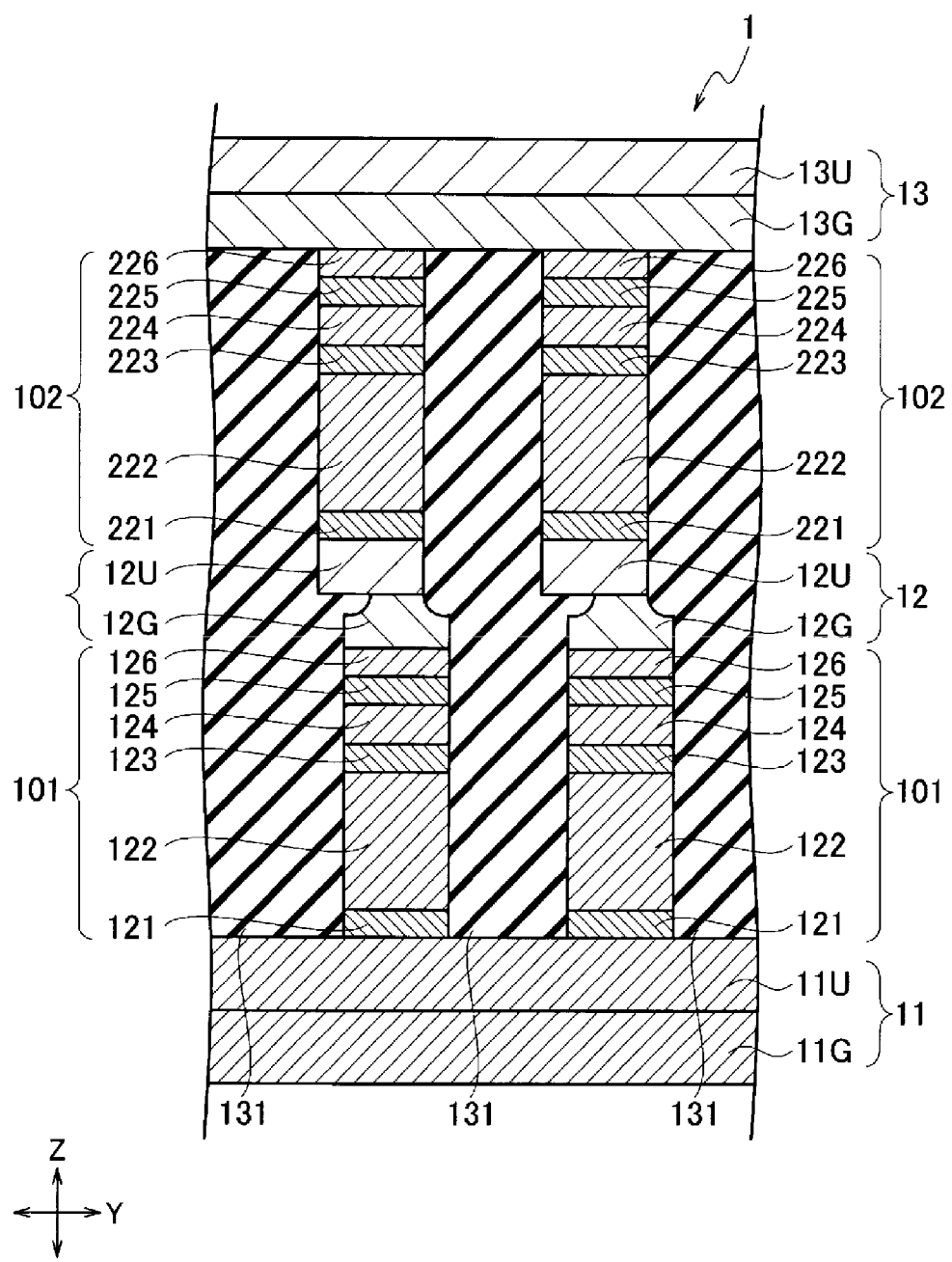
FIG. 17B is a schematic cross-sectional structural diagram of a memory cell two-stage configuration part of the nonvolatile semiconductor storage device according to a fourth embodiment.

A schematic cross-sectional structure of a memory cell two-stage configuration part of the nonvolatile semiconductor storage device 1 according to a fourth embodiment is illustrated in FIG. 17B. FIG. 17B corresponds to a schematic cross-sectional structure viewed from the Y-Z direction.

As illustrated in FIG. 17B, the nonvolatile semiconductor storage device 1 according to the fourth embodiment includes the plurality of first wiring layers 11, the plurality of second wiring layers 12, and the first memory cell 101. The plurality of first wirings 11 extend in the Y direction. The plurality of second wiring layers 12 extend above the plurality of first wiring layers 11 in the X direction intersecting the Y direction. The first memory cell 101 is arranged between the second wiring layer 12 and the first wiring layer 11 at each of the cross points of the plurality of second wiring layers 12 and the plurality of first wiring layers 11. The first memory cell 101 includes a first cell part and a first selector part. The first cell part includes a first resistance change film 124. The first selector part includes a first selector 122 and is connected in series to the first cell part.

Further, as illustrated in FIG. 17B, the nonvolatile semiconductor storage device 1 according to the fourth embodiment includes the plurality of third wiring layers 13 and the second memory cell 102. The plurality of third wiring layers 13 extend above the plurality of second wiring layers 12 in the Y direction. The second memory cell 102 is arranged between the third wiring layer 13 and the second wiring layer 12 at each of the cross points of the plurality of third wiring layers 13 and the plurality of second wiring layers 12. The second memory cell 102 includes a second cell part and a second selector part. The second cell part includes a second resistance change film 224. The second selector part includes a second selector 222 and is connected in series to the second cell part. The interlayer insulating film 131 is arranged between adjacent first memory cells 101, between adjacent second memory cells 102, and between the plurality of first wiring layers 11 and the plurality of second wiring layers 12. The interlayer insulating film 131 is formed of the same material as the above-described interlayer insulating film 31. The interlayer insulating film 131 is arranged between the plurality of second wiring layers 12 and the plurality of third wiring layers 13. This is the same hereinafter.

As illustrated in FIG. 17B, the first wiring layer 11 has a stacked structure of the first lower wiring layer 11G and the first upper wiring layer 11U connected to the first memory cell 101.

As illustrated in FIG. 17B, the third wiring layer 13 has a stacked structure of the third lower wiring layer 13G connected to the second memory cell 102 and the third upper wiring layer 13U.

As illustrated in FIG. 17B, the second wiring layer 12 has a first stacked structure of the second lower wiring layer 12G connected to the first memory cell 101 and the second upper wiring layer 12U connected to the second memory cell 102. The first stacked structure has a first recess structure in the Y direction in the stacked interface.

The first recess structures are provided on both sides of the top of the second lower wiring layer 12G which is in contact with the second upper wiring layer 12U.

The first recess structure illustrated in FIG. 17B has a semicircular shape. The first recess structure may have any shape selected from the group of an elliptical shape, a U-shaped shape, a triangular shape, a rectangular shape, or a polygonal shape, or a combination thereof.

Further, the second wiring layer 12 may also include a first metal layer which is arranged between the second lower wiring layer 12G and the second upper wiring layer 12U and is different from the second upper wiring layer 12U.

Further, the first wiring layer 11 may have a second stacked structure of the first lower wiring layer 11G and the first upper wiring layer 11U connected to the first memory cell, and the second stacked structure may have a second recess structure in the X direction in the stacked interface.

The second recess structures may be provided on both sides of the first lower wiring layer 11G and the first upper wiring layer 11U.

The second recess structures may be provided on both sides of the bottom of the first upper wiring layer 11U which is in contact with the first lower wiring layer 11G.

The second recess structures may be provided on both sides of the top of the first lower wiring layer 11G which is in contact with the first upper wiring layer 11U.

The first wiring layer 11 may also include a second metal layer which is arranged between the first lower wiring layer 11G and the first upper wiring layer 11U and is different from the first upper wiring layer.

Here, the second recess structure may have any shape selected from the group of an elliptical shape, a semicircular shape, a U-shaped shape, a triangular shape, a rectangular shape, or a polygonal shape, or a combination thereof.

Further, the third wiring layer 13 may have a third stacked structure of the third upper wiring layer 13U and the third lower wiring layer 13G connected to the second memory cell, and the third stacked structure may have a third recess structure in the second direction in the stacked interface.

The third recess structures may be provided on both sides of the third lower wiring layer 13G and the third upper wiring layer 13U.

The third recess structures may be provided on both sides of the bottom of the third upper wiring layer 13U which is in contact with the third lower wiring layer 13G.

The third recess structures may be provided on both sides of the top of the third lower wiring layer 13G which is in contact with the third upper wiring layer 13U.

The third wiring layer 13 may also include a third metal layer which is arranged between the third upper wiring layer 13U and the third lower wiring layer 13G and is different from the third upper wiring layer 13U.

Here, the third recess structure may have any shape selected from the group of an elliptical shape, a semicircular shape, a U-shaped shape, a triangular shape, a rectangular shape, or a polygonal shape, or a combination thereof.

Further, the first lower wiring layer 11G and the first upper wiring layer 11U may be formed of the same material, the second lower wiring layer 12G and the second upper wiring layer 12U may be formed of the same material, and the third lower wiring layer 13G and the third upper wiring layer 13U may be formed of the same material.

Further, the first wiring layer 11, the second wiring layer 12, and the third wiring layer 13 are formed of any material, any silicide material, or any nitride material selected from the group of W, Mo, polysilicon, Ni, Co, Ti, and Cu.

Further, the first metal layer, the second metal layer, and the third metal layer are formed of any material, any silicide material, or any nitride material selected from the group of W, Mo, polysilicon, Ni, Co, Ti, and Cu.

Modification 1 of Fourth Embodiment Two-Layer Memory Cell Configuration

Figure 17C:
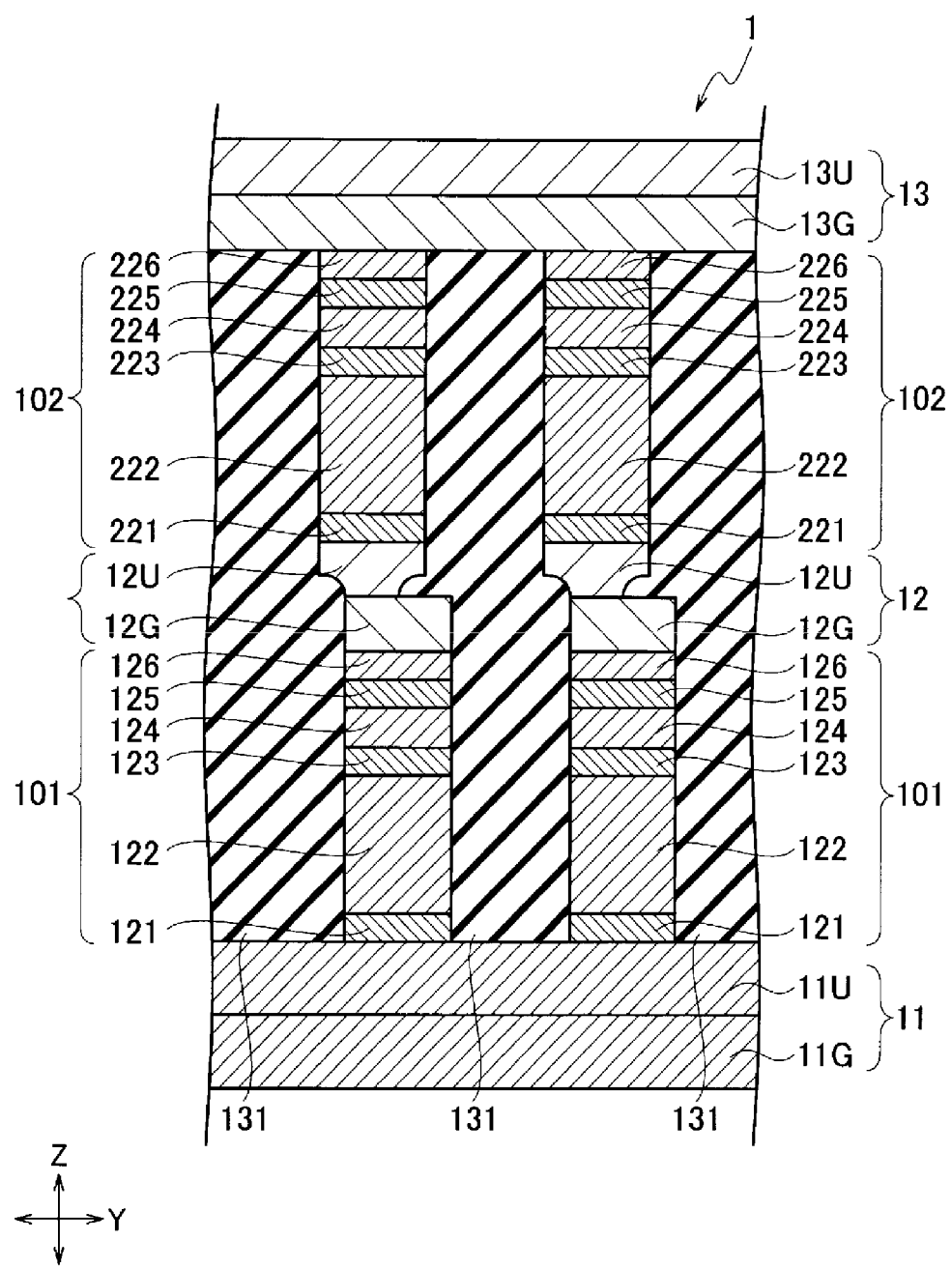
FIG. 17C is a schematic cross-sectional structural diagram of a memory cell two-stage configuration part of the nonvolatile semiconductor storage device according to a modification 1 of the fourth embodiment.

A schematic cross-sectional structure of a memory cell two-stage configuration part of the nonvolatile semiconductor storage device 1 according to a modification 1 of the fourth embodiment is illustrated in FIG. 17C.

As illustrated in FIG. 17C, the first recess structures are provided on both sides of the bottom of the second upper wiring layer 12U which is in contact with the second lower wiring layer 12G. The other configurations are the same as those in the fourth embodiment.

Modification 2 of Fourth Embodiment Two-Layer Memory Cell Configuration

Figure 17D:
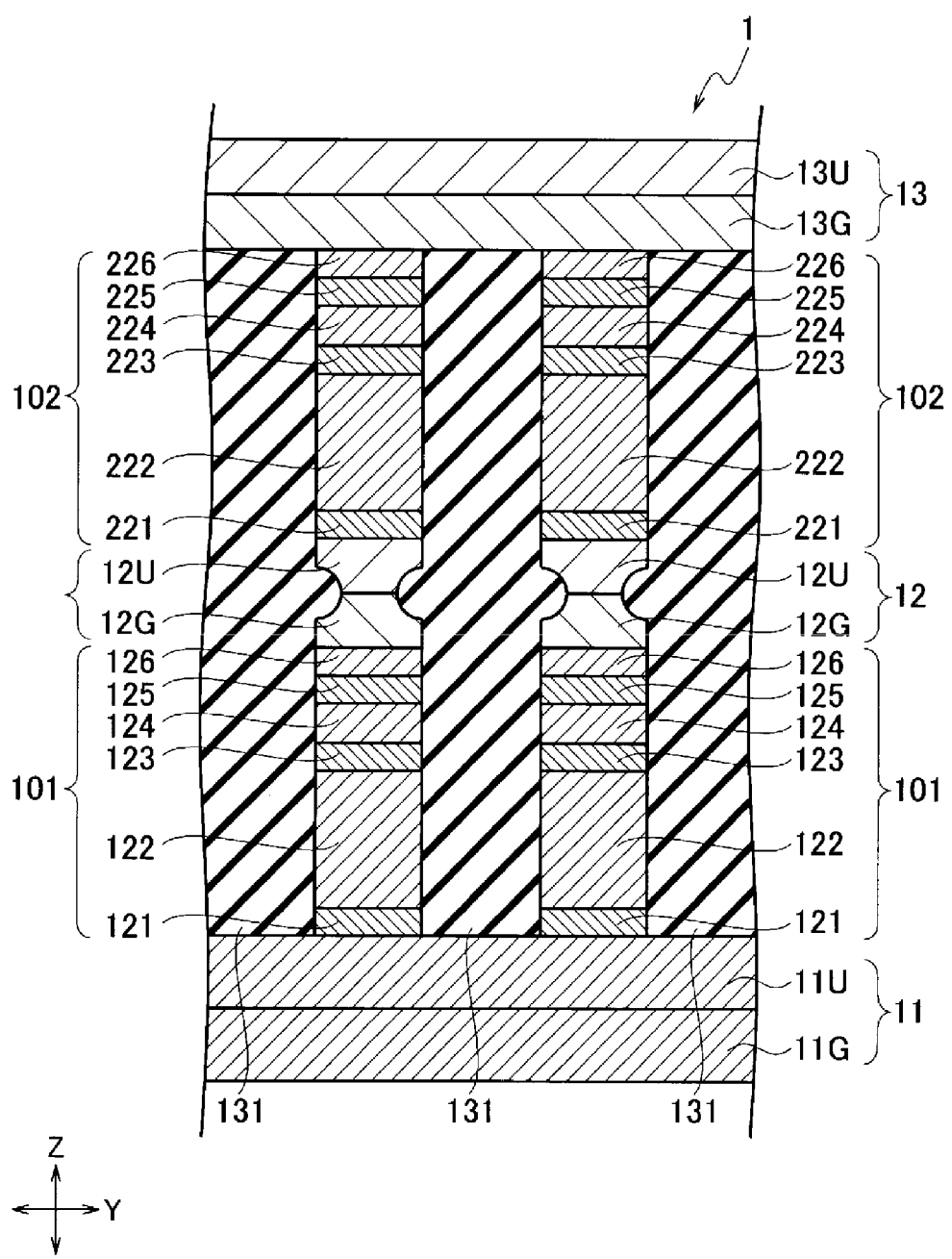
FIG. 17D is a schematic cross-sectional structural diagram of a memory cell two-stage configuration part of the nonvolatile semiconductor storage device according to a modification 2 of the fourth embodiment.

A schematic cross-sectional structure of a memory cell two-stage configuration part of the nonvolatile semiconductor storage device 1 according to a modification 2 of the fourth embodiment is illustrated in FIG. 17D.

As illustrated in FIG. 17D, the first recess structures are provided on both sides of the second upper wiring layer 12U and the second lower wiring layer 12G. The first recess structure has a semicircular shape. The other configurations are the same as those in the fourth embodiment.

Modification 3 of Fourth Embodiment Two-Layer Memory Cell Configuration

Figure 17E:
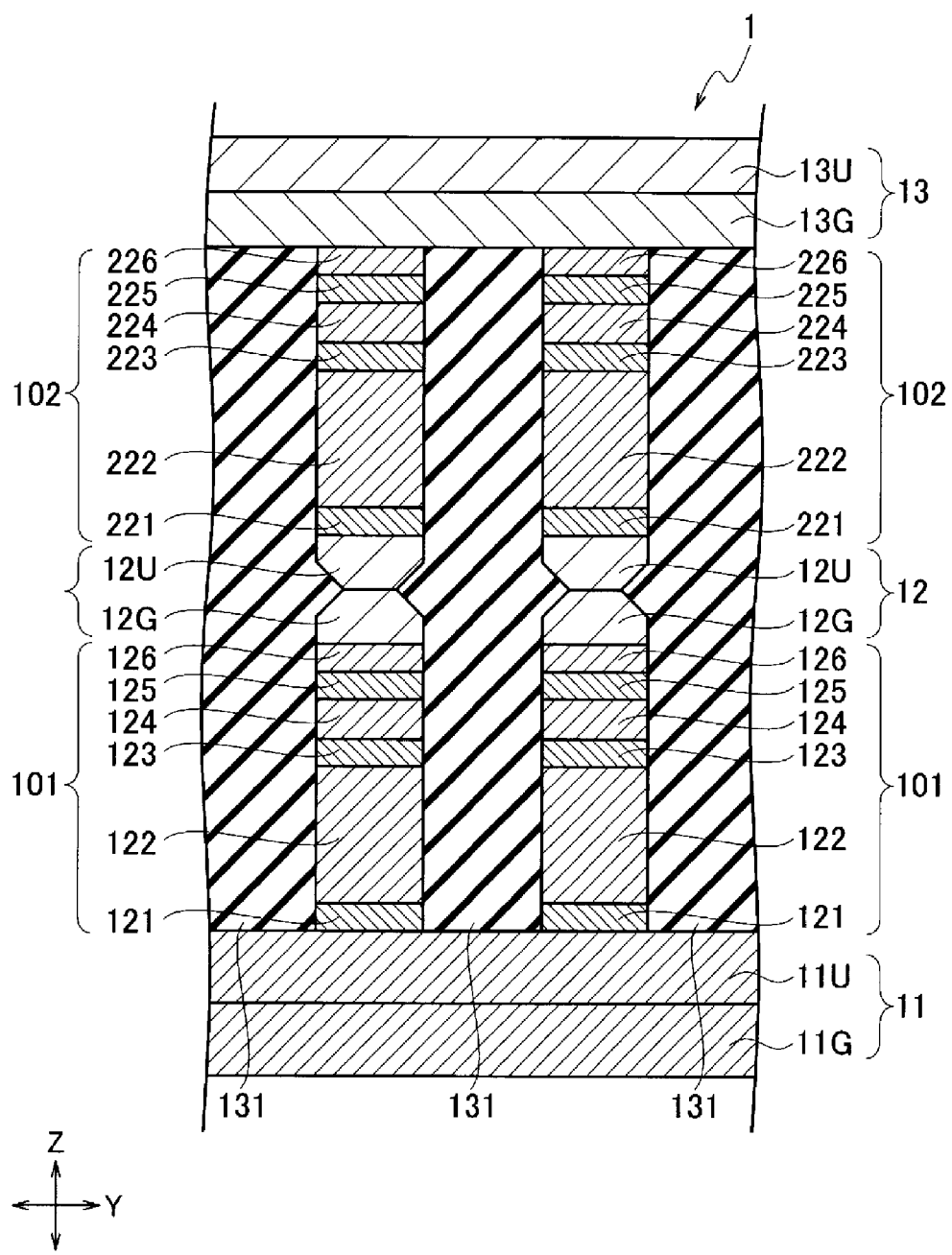
FIG. 17E is a schematic cross-sectional structural diagram of a memory cell two-stage configuration part of the nonvolatile semiconductor storage device according to a modification 3 of the fourth embodiment.

A schematic cross-sectional structure of a memory cell two-stage configuration part of the nonvolatile semiconductor storage device 1 according to a modification 3 of the fourth embodiment is illustrated in FIG. 17E.

As illustrated in FIG. 17E, the first recess structures are provided on both sides of the second upper wiring layer 12U and the second lower wiring layer 12G. The first recess structure has a triangular shape. The other configurations are the same as those in the fourth embodiment.

Modification 4 of Fourth Embodiment Two-Layer Memory Cell Configuration

Figure 17F:
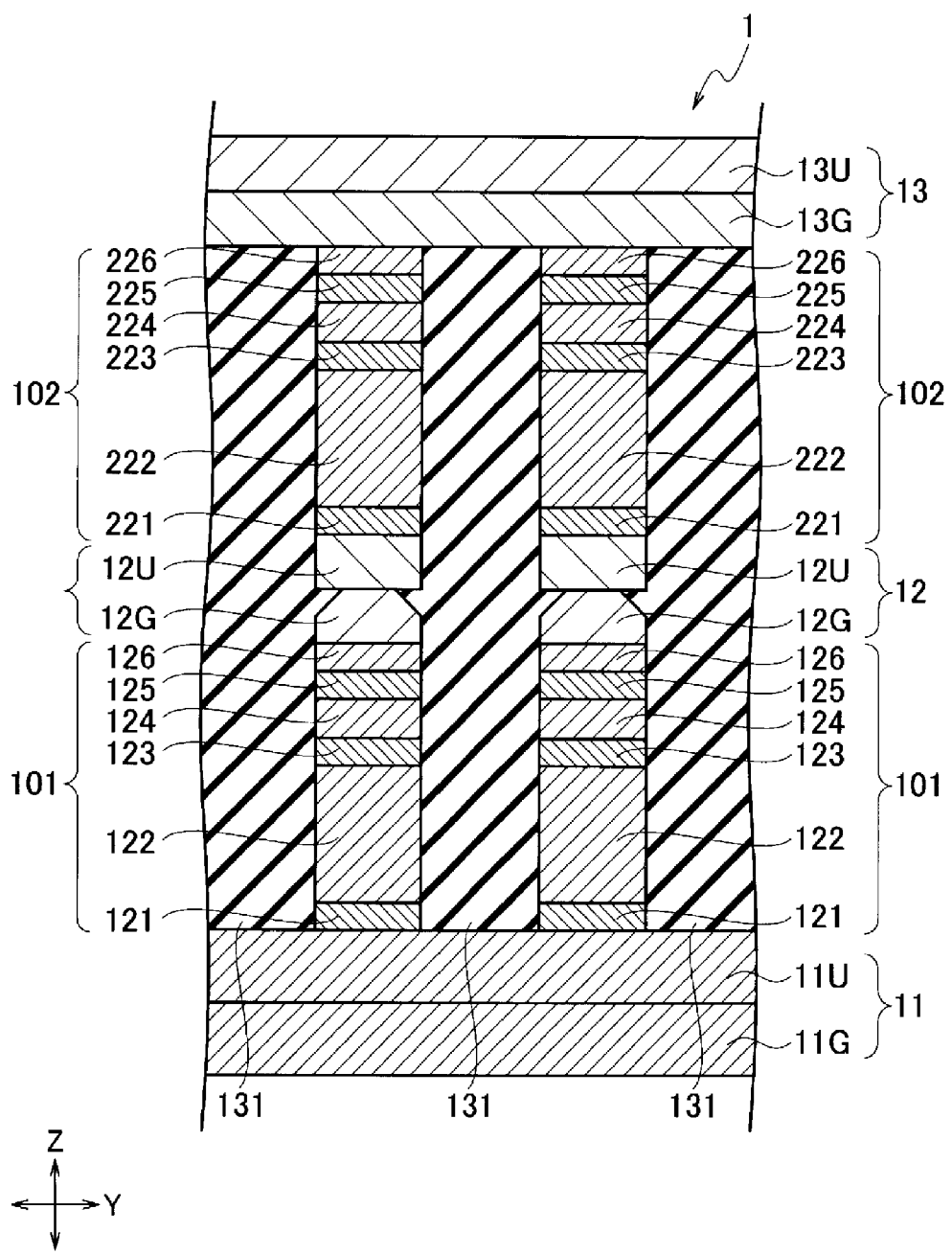
FIG. 17F is a schematic cross-sectional structural diagram of a memory cell two-stage configuration part of the nonvolatile semiconductor storage device according to a modification 4 of the fourth embodiment.

A schematic cross-sectional structure of a memory cell two-stage configuration part of the nonvolatile semiconductor storage device 1 according to a modification 4 of the fourth embodiment is illustrated in FIG. 17F.

The first recess structures are provided on both sides of the top of the second lower wiring layer 12G which is in contact with the second upper wiring layer 12U. The first recess structure has a triangular shape. The other configurations are the same as those in the fourth embodiment.

Modification 5 of Fourth Embodiment Two-Layer Memory Cell Configuration

Figure 17G:
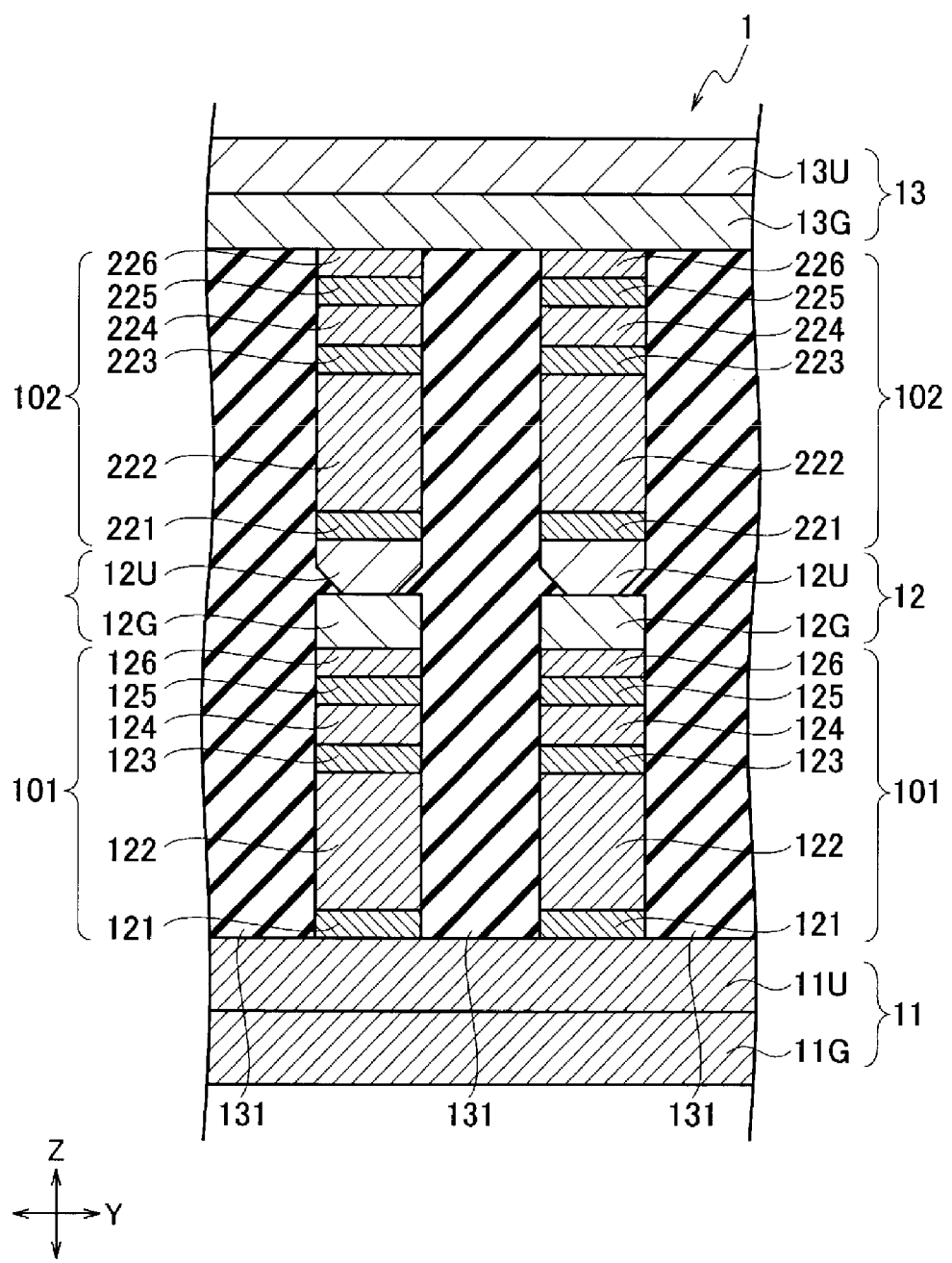
FIG. 17G is a schematic cross-sectional structural diagram of a memory cell two-stage configuration part of the nonvolatile semiconductor storage device according to a modification 5 of the fourth embodiment.

A schematic cross-sectional structure of a memory cell two-stage configuration part of the nonvolatile semiconductor storage device 1 according to a modification 5 of the fourth embodiment is illustrated in FIG. 17G.

As illustrated in FIG. 17G, the first recess structures are provided on both sides of the bottom of the second upper wiring layer 12U which is in contact with the second lower wiring layer 12G. The first recess structure has a triangular shape. The other configurations are the same as those in the fourth embodiment.

Modification 6 of Fourth Embodiment Two-Layer Memory Cell Configuration

Figure 17H:
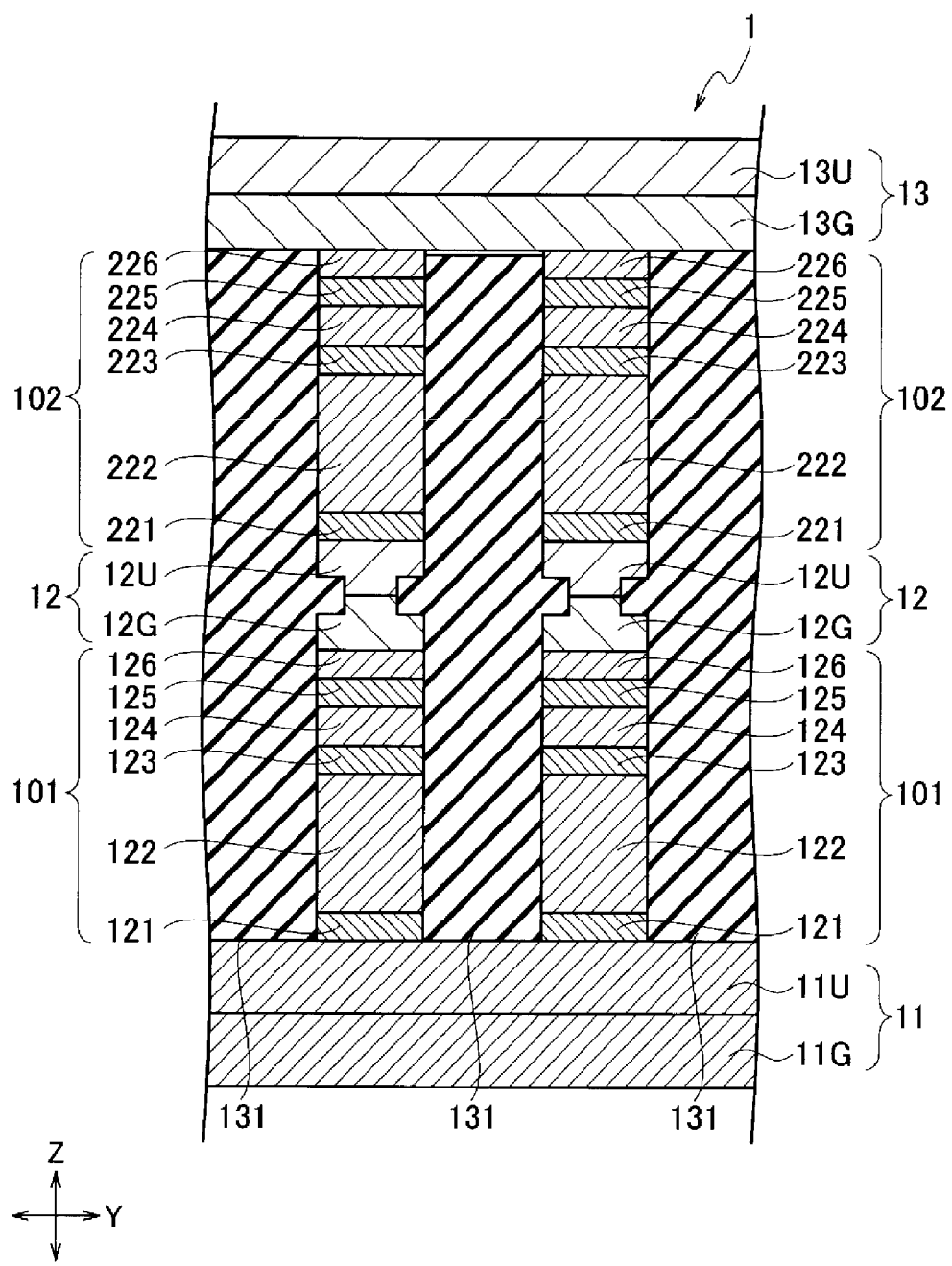
FIG. 17H is a schematic cross-sectional structural diagram of a memory cell two-stage configuration part of the nonvolatile semiconductor storage device according to a modification 6 of the fourth embodiment.

A schematic cross-sectional structure of a memory cell two-stage configuration part of the nonvolatile semiconductor storage device 1 according to a modification 6 of the fourth embodiment is illustrated in FIG. 17H.

As illustrated in FIG. 17H, the first recess structures are provided on both sides of the second upper wiring layer 12U and the second lower wiring layer 12G. The first recess structure has a rectangular shape. The other configurations are the same as those in the fourth embodiment.

According to the present embodiment, the nonvolatile semiconductor storage device and the manufacturing method thereof which prevent shorting between adjacent wirings and reduce the wiring resistance may be provided.

According to the present embodiment, the nonvolatile semiconductor storage device and the manufacturing method thereof which secure a space margin between adjacent wirings by recessing a contact portion of stacked wirings which are arranged in parallel, and thus, prevent shorting between the adjacent wirings and reduce the wiring resistance may be provided.

Manufacturing Method

First Manufacturing Method One-Layer Cell Structure

Hereinafter, a first manufacturing method of the nonvolatile semiconductor storage device 1 according to the first embodiment will be described with reference to FIGS. 18A to 23. The first manufacturing method described here may also be similarly applied to the manufacturing method of the nonvolatile semiconductor storage device according to the second embodiment, the modifications thereof, and the third embodiment. Further, a combination of the damascene wiring manufacturing method and the RIE wiring manufacturing method may be applied.

In the following description, the stacked films 21, 22, 23, 24, 25, and 26 constitute the memory cell 10, and thus, may be simply referred to as the stacked films 10.

Figure 18A:
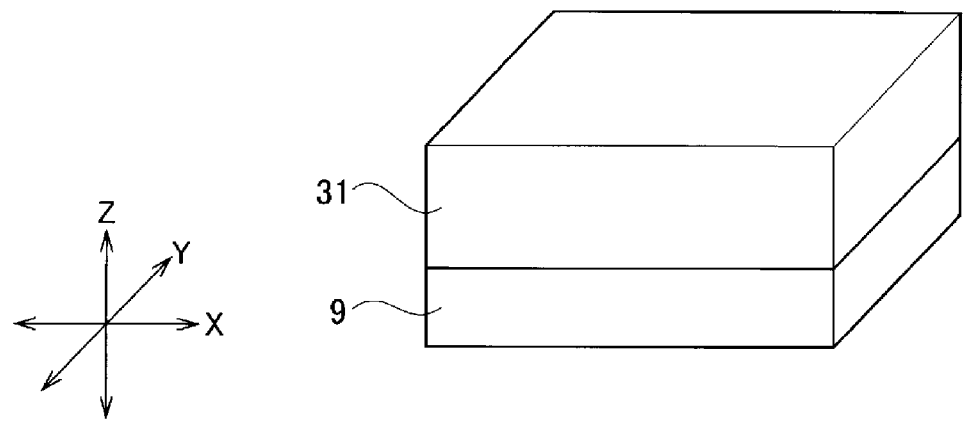
FIG. 18A is a schematic bird's eye view configuration diagram illustrating one process of a first manufacturing method of the nonvolatile semiconductor storage device according to the first embodiment.
Figure 18B:
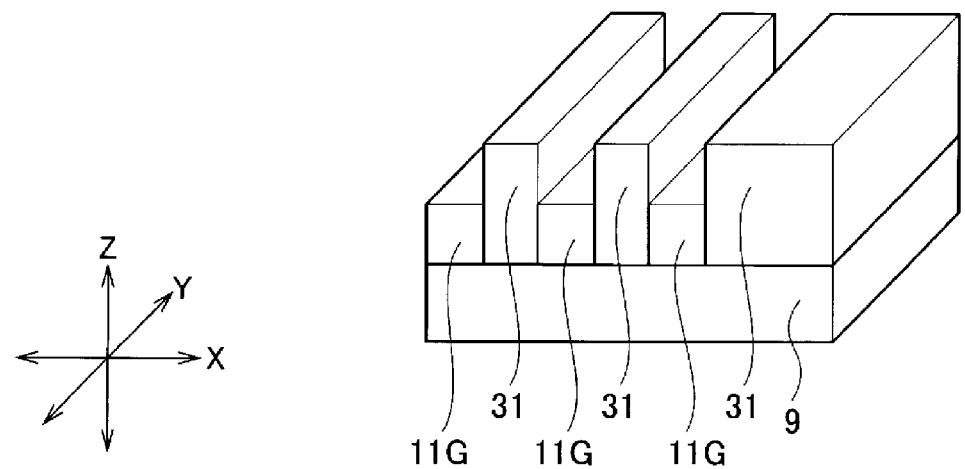
FIG. 18B is a schematic bird's eye view configuration diagram illustrating one process of the first manufacturing method of the nonvolatile semiconductor storage device according to the first embodiment.
Figure 19:
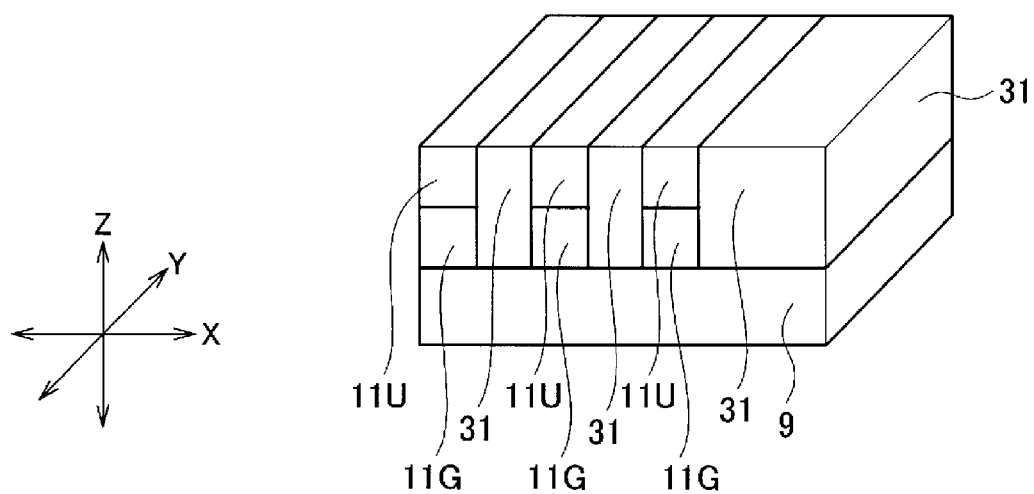
FIG. 19 is a schematic bird's eye view configuration diagram illustrating one process of the first manufacturing method of the nonvolatile semiconductor storage device according to the first embodiment.
Figure 20A:
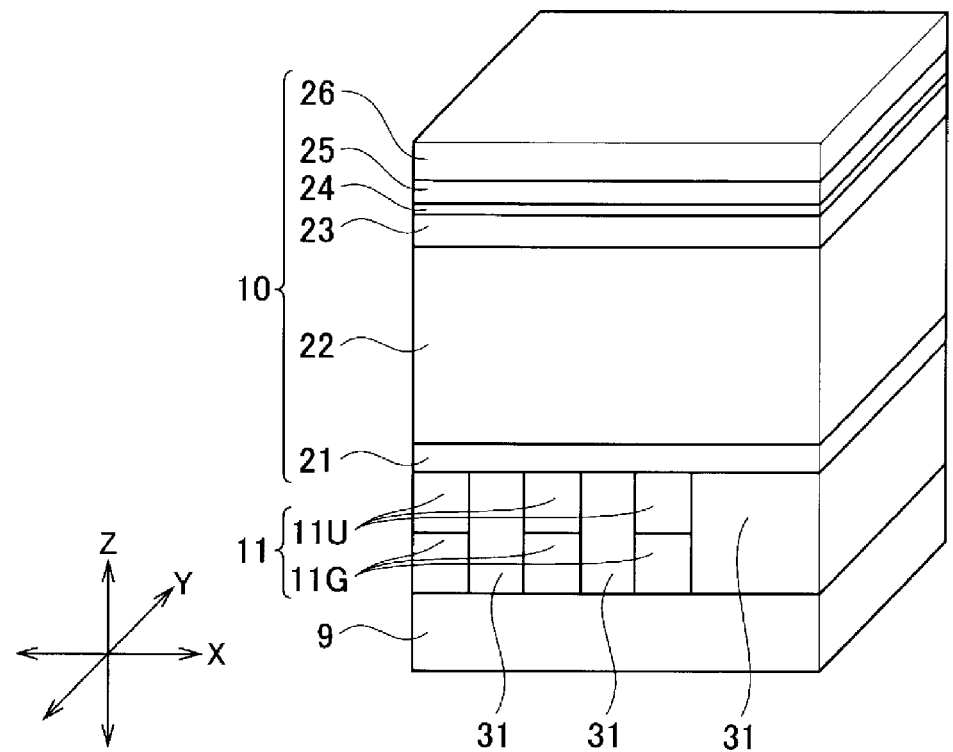
FIG. 20A is a schematic bird's eye view configuration diagram illustrating one process of a second manufacturing method of the nonvolatile semiconductor storage device according to the first embodiment.
Figure 20B:
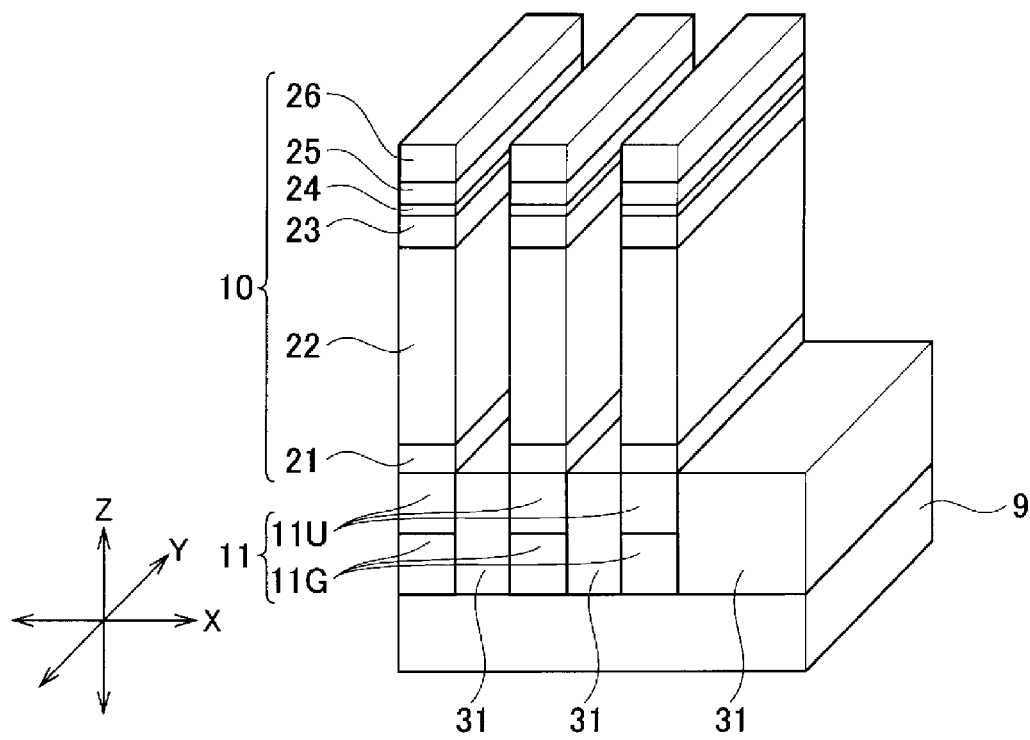
FIG. 20B is a schematic bird's eye view configuration diagram illustrating one process of the second manufacturing method of the nonvolatile semiconductor storage device according to the first embodiment.
Figure 21A:
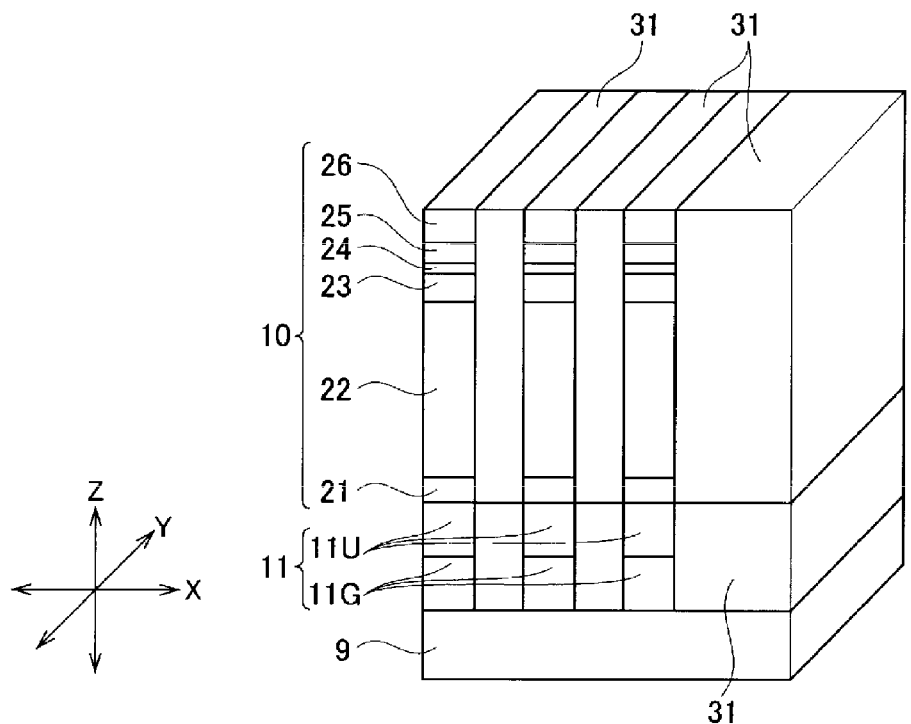
FIG. 21A is a schematic bird's eye view configuration diagram illustrating one process of the first manufacturing method of the nonvolatile semiconductor storage device according to the first embodiment.
Figure 21B:
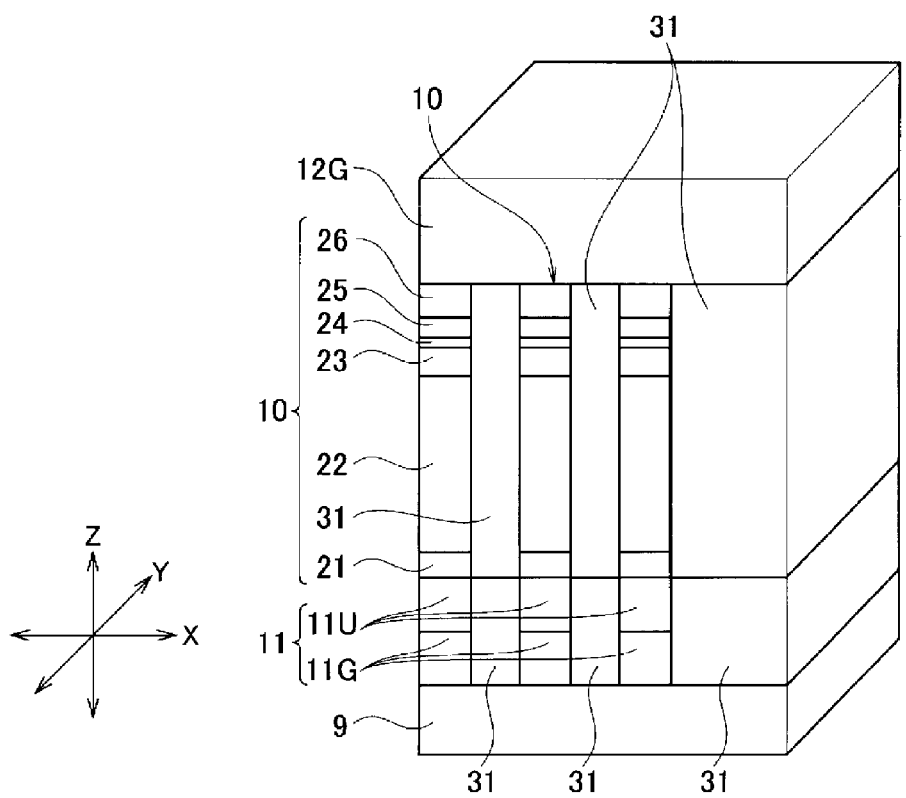
FIG. 21B is a schematic bird's eye view configuration diagram illustrating one process of the first manufacturing method of the nonvolatile semiconductor storage device according to the first embodiment.
Figure 22:
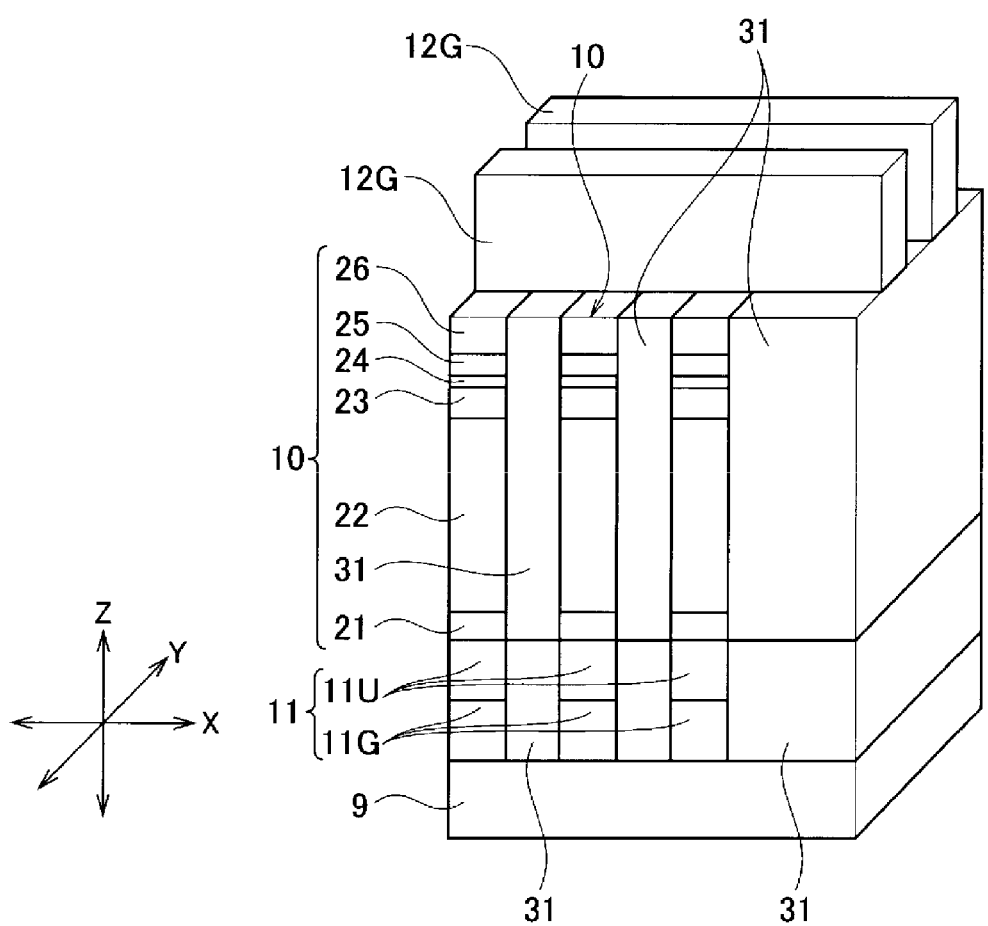
FIG. 22 is a schematic bird's eye view configuration diagram illustrating one process of the first manufacturing method of the nonvolatile semiconductor storage device according to the first embodiment.
Figure 23:
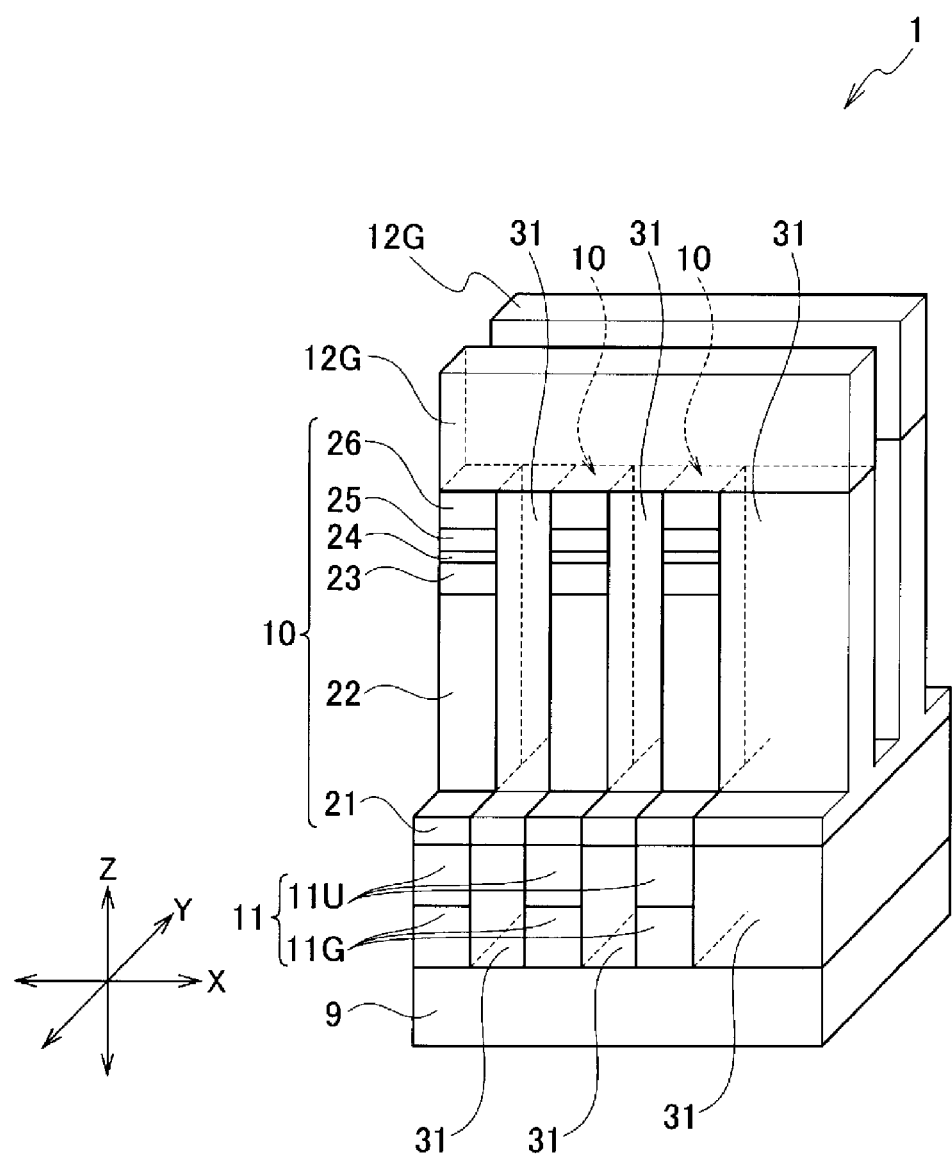
FIG. 23 is a schematic bird's eye view configuration diagram illustrating one process of the first manufacturing method of the nonvolatile semiconductor storage device according to the first embodiment.

As illustrated in FIG. 18A, the first manufacturing method includes a process of forming a first interlayer insulating film 31 on an insulating substrate 9 and flattening the first interlayer insulating film 31. Next, as illustrated in FIG. 18B, after the first interlayer insulating film 31 is patterned into a stripe structure extending in the Y direction, the method includes a process of embedding the first lower wiring 11G in a trench groove between the patterned first interlayer insulating films 31. Next, as illustrated in FIG. 19, the method includes a process of forming the first upper wiring layer 11U on the first lower wiring layer 11G and flattening the first upper wiring layer 11U by CMP. Next, as illustrated in FIG. 20A, the method includes a process of forming the stacked films 21, 22, 23, 24, 25, and 26 on the first upper wiring layer 11U and the first interlayer insulating film 31. Next, as illustrated in FIG. 20B, the method includes a process of processing the stacked films 21, 22, 23, 24, 25, and 26 into a stripe structure extending in the Y direction. Next, as illustrated in FIG. 21A, the method includes a process of forming and flattening a second interlayer insulating film 31. Next, as illustrated in FIG. 21B, the method includes a process of forming the second lower wiring layer 12G. Next, as illustrated in FIG. 22, the method includes a process of processing the second lower wiring layer 12G into a stripe structure extending in the X direction to form the second lower wiring layers 12G that overlap the stacked films 21, 22, 23, 24, 25, and 26. Next, as illustrated in FIG. 23, the method includes a process of processing the stacked films 21, 22, 23, 24, 25, and 26 and the interlayer insulating film 31 under and between the second lower wiring layers 12G to form the memory cell 10 including the stacked films 21, 22, 23, 24, 25, and 26 having a columnar shape. Next, as described above with reference to FIGS. 8B to 14B, the method includes a process of forming the second upper wiring layer 12U on the second lower wiring layer 12G. Details will be described below.

(a) First, as illustrated in FIG. 18A, the interlayer insulating film 31 is formed on the insulating substrate 9, and is flattened using a CMP technique.

(b) Next, as illustrated in FIG. 18B, the interlayer insulating film 31 is processed into a stripe structure extending in the Y direction to form the first lower wiring layer 11G in a trench groove between the patterned interlayer insulating films 31. As the process in this case, the damascene wiring manufacturing process illustrated in FIGS. 15A to 15C may be used.

(c) Next, as illustrated in FIG. 19, the first upper wiring layer 11U is formed on the first lower wiring layer 11G. As the process in this case, the damascene wiring manufacturing process illustrated in FIGS. 15A to 15C may be used. Thereafter, the first upper wiring layer 11U is flattened by CMP. As described above with reference to FIGS. 8B to 14B, similarly, the recess structure (not illustrated) is formed in the X direction on both sides of the stacked structure of the first lower wiring layer 11G and the first upper wiring layer 11U. Further, instead of the above processes (a) to (c), the RIE wiring manufacturing processes illustrated in FIGS. 16A to 16C may be used.

(d) Next, as illustrated in FIG. 20A, the stacked films 21, 22, 23, 24, 25, and 26 which are to be the memory cell 10 are stacked on the first upper wiring layer 11U and the interlayer insulating film 31. That is, the conductive film 21, the selector 22, the conductive film 23, the resistance change film 24, the conductive film 25, and the electrode layer 26 are sequentially formed on the first upper wiring layer 11U and the interlayer insulating film 31.

(e) Next, as illustrated in FIG. 20B, the stacked films are simultaneously processed into a stripe structure extending in the Y direction by RIE. The stacked films 10 on the plurality of first upper wiring layers 11U are arranged with a trench interposed therebetween in the X direction orthogonal to the Y direction.

(f) Next, as illustrated in FIG. 21A, the interlayer insulating film 31 is formed and is flattened using a CMP technique. As a result, the interlayer insulating film 31 is embedded in the trench between the stacked films 10 formed by the processing. The interlayer insulating film 31 is provided in a region between the first wiring layers 11 (11U and 11G) adjacent to each other in the X direction and in a region between the stacked films 10 adjacent to each other in the X direction. The interlayer insulating film 31 may be embedded with a liner film (not illustrated) therein. The liner film is conformally formed before the interlayer insulating film 31 is formed.

As the interlayer insulating film 31, for example, a silicon oxide film or a silicon nitride film is formed by an ALD method, a low pressure CVD method, or a flowable CVD method.

The flowable CVD method is a kind of plasma CVD method, and forms a $SiO_xN_xH_x$ film having fluidity similar to a liquid by mixing impurities at a temperature of, for example, about 400° C. Thereafter, for example, by performing baking in an $O_3$ atmosphere of about 200° C. or by performing a water vapor gas processing under a temperature of about 350° C., $NH_3$ (gas) is removed from the $SiO_xN_xH_x$ film, resulting in a silicon oxide (SiO) film.

For example, the first lower wiring layer 11G and the first upper wiring layer 11U may be formed of Mo, the electrode layer 26 may be formed of W, and the interlayer insulating film 31 may be formed of a silicon oxide film. Further, the interlayer insulating film 31 may be formed in multiple layers.

The interlayer insulating film 31 may include, for example, a silicon oxide film formed by a plasma CVD method using a source gas containing TEOS, a low pressure CVD method, an ALD method, a coating method, or the like.

The interlayer insulating film 31 may use different kinds of films, for example, a multilayer film of a silicon oxide film and a silicon nitride film. Further, the interlayer insulating film 31 may be, for example, the same kind of multilayer film such as a silicon oxide based multilayer film. Further, the interlayer insulating film 31 may be a multilayer film of films having different qualities even if they are of the same kind.

For example, the silicon oxide film may contain hydrogen (H) due to a source gas. Then, the amount of Si—H bonds in the silicon oxide film may be controlled according to a film forming method or film forming conditions. Generally, a denser silicon oxide film tends to have a smaller amount of Si—H bonds. Therefore, when a silicon oxide film is used as the interlayer insulating film 31, by controlling the amount of Si—H bonds in the interlayer insulating film to form a dense film, the etching rate may be controlled for RIE using a gas containing, for example, fluorocarbon (e.g., $C_4F_8$, $C_4F_6$, or $CF_4$).

The interlayer insulating film 31 deposited above the stacked films 10 is polished and removed by, for example, a CMP method, so that the upper surface of the interlayer insulating film 31 is flattened. As illustrated in FIG. 21A, the upper surface of the electrode layer 26 is exposed.

(g) Next, as illustrated in FIG. 21B, the second lower wiring layer 12G is formed. For example, the second lower wiring layer 12G is formed of W.

(h) Next, as illustrated in FIG. 22, the second lower wiring layer 12G is processed into a stripe structure extending in the X direction. As a result, the second lower wiring layer 12G is connected to the electrode layer 26 of the memory cell 10.

The plurality of second lower wiring layers 12G are arranged in the Y direction with a gap therebetween, and the upper surface of the stacked films 10 (the upper surface of the electrode layer 26) and the upper surface of the interlayer insulating film 31 are exposed between the second lower wiring layers 12G adjacent to each other in the Y direction. The second lower wiring layer 12G extends on the stacked films 10 in the X direction and further extends to the periphery.

(i) Next, as illustrated in FIG. 23, the stacked films 10 and the interlayer insulating film 31 under and between the second lower wiring layers 12G processed into a stripe structure are also processed by an RIE method using a mask (not illustrated) to form a first memory cell including the stacked films 10 having a columnar shape at the cross point of the second lower wiring layer 12G and the first upper wiring layer 11U.

(j) Next, as described above with reference to FIGS. 8B to 14B, the second upper wiring layer 12U2 is formed on the second lower wiring layer 12G. Similarly, a recess structure (not illustrated) is formed in the Y direction on both sides of the stacked structure of the second lower wiring layer 12G and the second upper wiring layer 12U. As a result, the nonvolatile semiconductor storage device according to the first embodiment is formed.

Here, for the etching of the stacked films 10 and the interlayer insulating film 31 under and between the second lower wiring layers 12G, for example, an RIE method using a gas containing fluorocarbon (e.g., $C_4F_8$, $C_4F_6$, or $CF_4$) may be used. The stacked films 10 and the interlayer insulating film 31 under and between the second lower wiring layers 12G are simultaneously etched and removed.

Second Manufacturing Method One-Layer Cell Structure

Hereinafter, a second manufacturing method of the nonvolatile semiconductor storage device 1 according to the first embodiment will be described with reference to FIG. 24. The second manufacturing method described here may be similarly applied to the manufacturing method of the nonvolatile semiconductor storage device according to the second embodiment and the modifications thereof and the third embodiment. Further, a combination of the damascene wiring manufacturing method and the RIE wiring manufacturing method may be applied.

As illustrated in FIG. 18A, the second manufacturing method includes a process of forming the first interlayer insulating film 31 on the insulating substrate 9 and flattening the first interlayer insulating film 31. Next, as illustrated in FIG. 18B, the method includes a process of patterning the first interlayer insulating film 31 into a stripe structure extending in the Y direction, and thereafter, embedding the first lower wiring layer 11G in a trench groove between the patterned first interlayer insulating films 31. Next, as illustrated in FIG. 19, the method includes a process of forming the first upper wiring layer 11U on the first lower wiring layer 11G and flattening the first upper wiring layer 11U by CMP. Next, as illustrated in FIG. 20A, the method includes a process of forming the stacked films 21, 22, 23, 24, 25, and 26 on the first upper wiring layer 11U and the first interlayer insulating film 31. Next, as illustrated in FIG. 20B, the method includes a process of processing the stacked films 21, 22, 23, 24, 25, and 26 into a stripe structure extending in the Y direction. Next, as illustrated in FIG. 21A, the method includes a process of forming and flattening the second interlayer insulating film 31. Next, as illustrated in FIG. 24, the method includes a process of processing the stacked films 10 on the first upper wiring layer 11U in the X direction intersecting the Y direction to form the stacked films 10 having a columnar shape. Next, the method includes a process of forming and flattening a third interlayer insulating film. Next, the method includes a process of forming the second lower wiring layer 12G similarly to FIG. 21B, and thereafter, processing the second lower wiring layer 12C into a stripe structure extending in the X direction similarly to FIG. 22 to form the second lower wiring layer 12G overlapping the stacked films 10. As a result, the memory cell 10 including the stacked films 21, 22, 23, 24, 25, and 26 having a columnar shape is formed between the plurality of first upper wiring layers 11U and the plurality of second lower wiring layers 12G. Next, as described above with reference to FIGS. 8B to 14B, the method includes a process of forming the second upper wiring layer 12U on the second lower wiring layer 12G. Details will be described below.

(a) First, as illustrated in FIG. 18A, the interlayer insulating film 31 is formed on the insulating substrate 9, and is flattened using a CMP technique.

(b) Next, as illustrated in FIG. 18B, the interlayer insulating film 31 is processed into a stripe structure extending in the Y direction to form the first lower wiring layer 11G in the trench groove between the patterned interlayer insulating films 31. As the process in this case, the damascene wiring manufacturing process illustrated in FIGS. 15A to 15C may be used.

(c) Next, as illustrated in FIG. 19, the first upper wiring layer 11U is formed on the first lower wiring layer 11G1. Thereafter, the first upper wiring layer 11U is flattened by CMP. As described above with reference to FIGS. 8B to 14B, similarly, a recess structure (not illustrated) is formed in the X direction on both sides of the stacked structure of the first lower wiring layer 11G and the first upper wiring layer 11U. Further, instead of the above processes (a) to (c), the RIE wiring manufacturing process illustrated in FIGS. 16A to 16C may be used.

(d) Next, as illustrated in FIG. 20A, the stacked films 21, 22, 23, 24, 25, and 26 which are to be the memory cell 10 are stacked on the first upper wiring layer 11U1 and the interlayer insulating film 10.

(e) Next, as illustrated in FIG. 20B, the stacked films are simultaneously processed into a stripe structure extending in the Y direction by, for example, an RIE method.

(f) Next, as illustrated in FIG. 21A, the interlayer insulating film 31 is formed and is flattened using a CMP technique. As a result, the interlayer insulating film 31 is embedded in a trench between the stacked films 10 formed by the processing.

Figure 24:
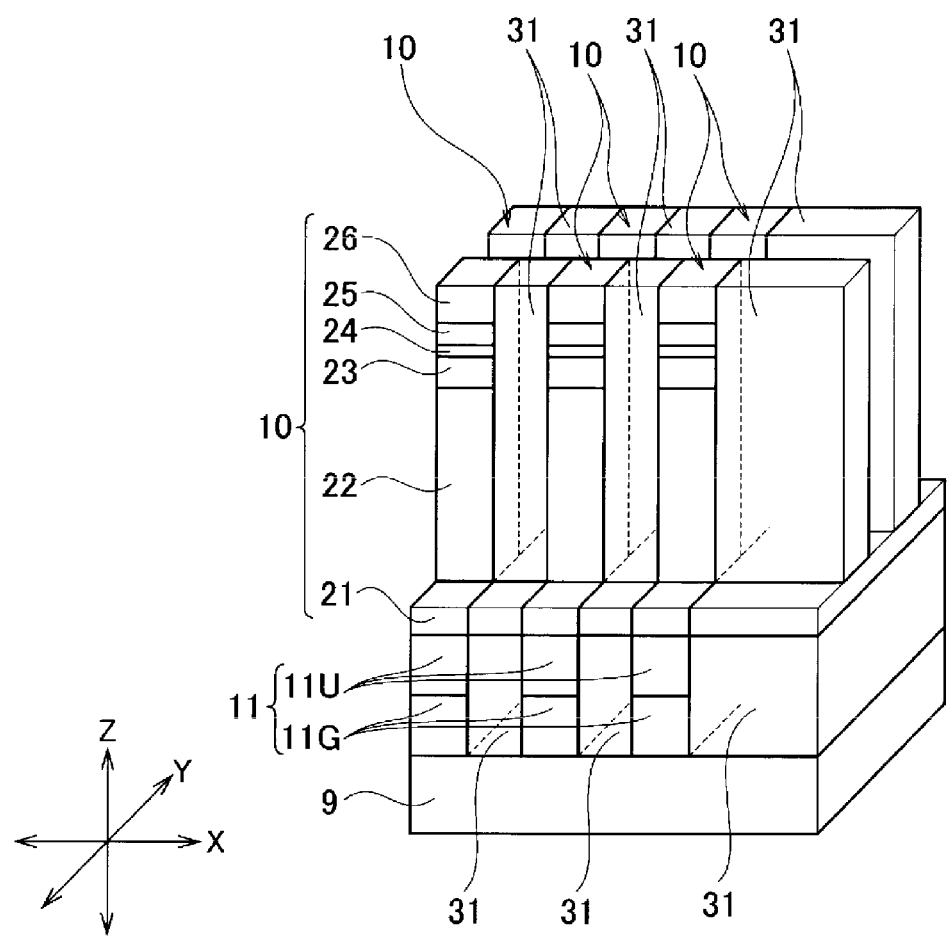
FIG. 24 is a schematic bird's eye view configuration diagram illustrating one process of the second manufacturing method of the nonvolatile semiconductor storage device according to the first embodiment.

(g) Next, as illustrated in FIG. 24, the stacked film 10 on the first upper wiring layer 11U is processed in the X direction intersecting the Y direction to form the stacked films 10 of the memory cell having a columnar shape.

(h) Next, the interlayer insulating film 31 is formed and is flattened using a CMP technique. As a result, the interlayer insulating film 31 is embedded in the trench between the stacked films 10 having a columnar shape formed by the processing.

(i) Next, similarly to FIG. 21B, the second lower wiring layer 12G is formed.

(j) Next, similarly to FIG. 22, the second lower wiring layer 12G is processed into a stripe structure extending in the X direction. As a result, the second lower wiring layer 12G is connected to the electrode layer 26 of the memory cell 10. As a result, the memory cell 10 including the stacked film 21, 22, 23, 24, 25, and 26 having a columnar shape is formed between the plurality of first upper wiring layers 11U and the plurality of second lower wiring layers 12G.

(k) Next, as described above with reference to FIGS. 8B to 14B, the second upper wiring layer 12U is formed on the second lower wiring layer 12G. Similarly, a recess structure (not illustrated) is formed in the Y direction on both sides of the stacked structure of the second lower wiring layer 12G and the second upper wiring layer 12U. As a result, the nonvolatile semiconductor storage device according to the first embodiment is formed.

Manufacturing Method Two-Layer Memory Cell Configuration

A manufacturing method of the nonvolatile semiconductor storage device 1 according to the fourth embodiment is illustrated in FIGS. 25A to 32.

In the following description, the stacked films 121, 122, 123, 124, 125, and 126 constitute the memory cell 101, and thus, may be simply referred to as the stacked films 101. The stacked films 221, 222, 223, 224, 225, and 226 constitute the memory cell 102, and thus, may be simply referred to as the stacked films 102.

Figure 31A:
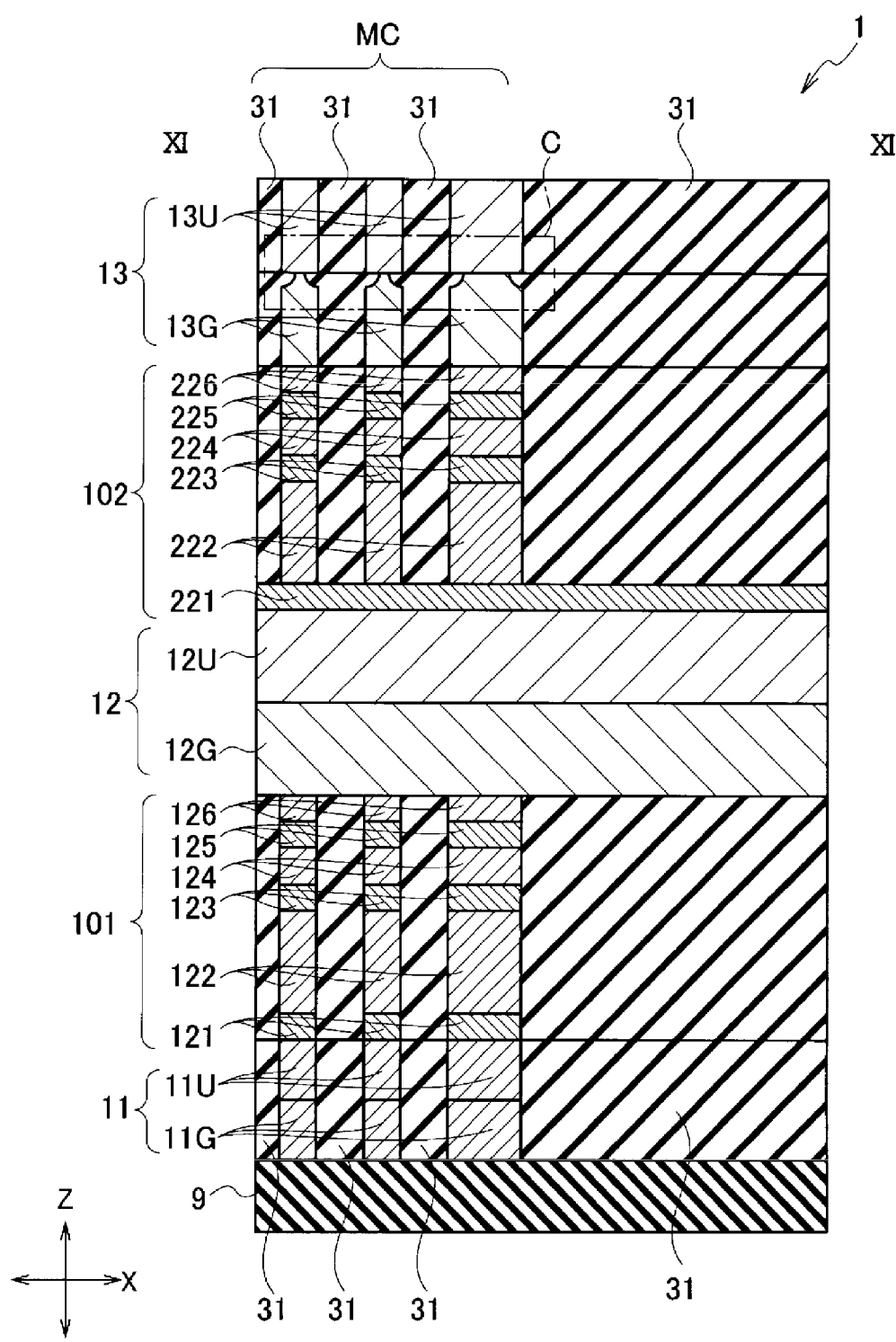
FIG. 31A is a schematic cross-sectional structural diagram taken along line XI-XI of FIG. 26A illustrating the manufacturing method of the nonvolatile semiconductor storage device according to the fourth embodiment.
Figure 32:
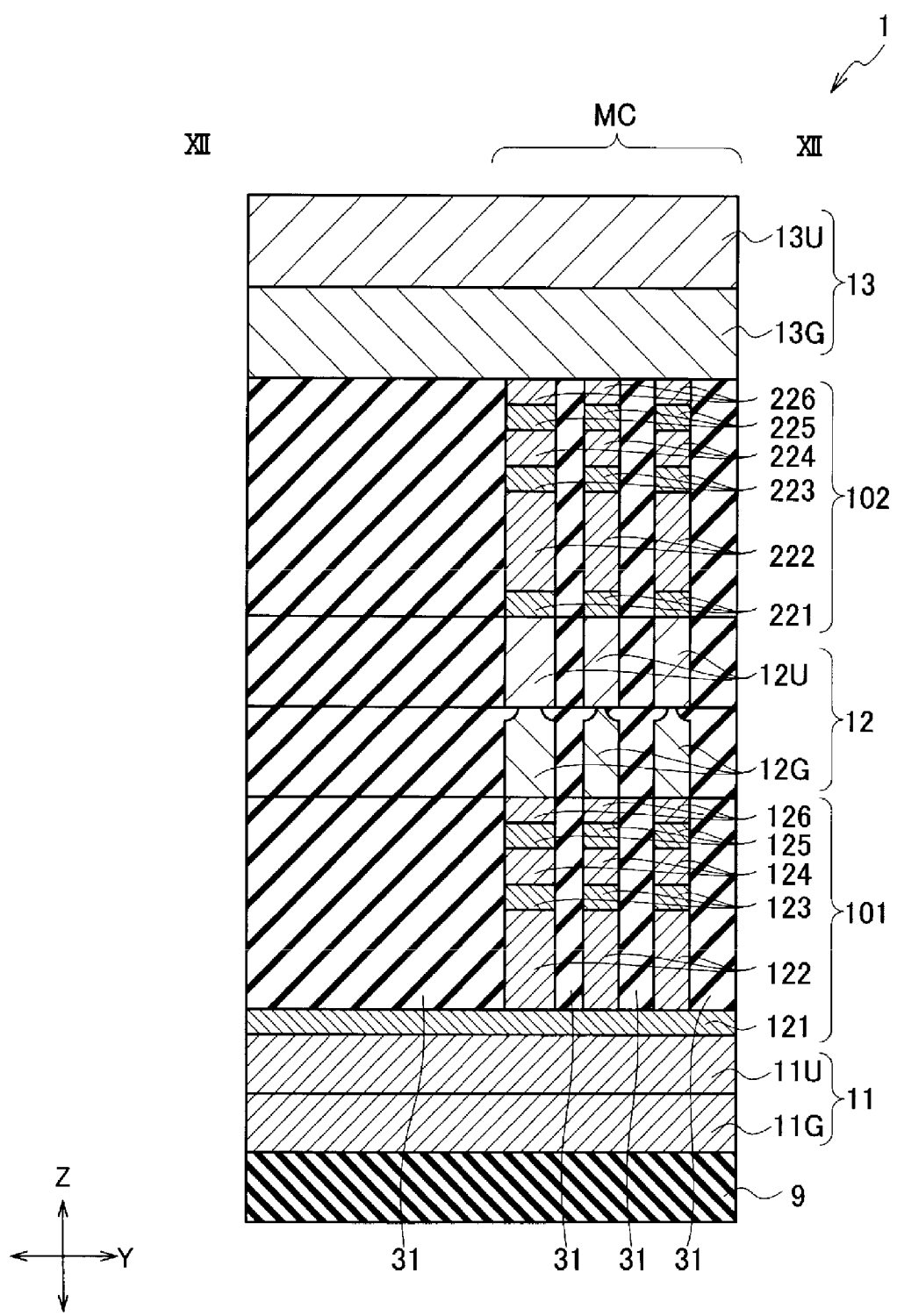
FIG. 32 is a schematic cross-sectional structural diagram taken along line XII-XII of FIG. 26B illustrating the manufacturing method of the nonvolatile semiconductor storage device according to the fourth embodiment.

As illustrated in FIGS. 31A and 32, the first memory cell 101 is arranged between the first wiring layer 11 and the second wiring layer 12, and the second memory cell 102 is arranged between the second wiring layer 12 and the third wiring layer 13. That is, the memory cells are stacked in two layers.

The first wiring layer 11 has a stacked structure of the first lower wiring layer 11G and the first upper wiring layer 11U, the second wiring layer 12 has a stacked structure of the second lower wiring layer 12G and the second upper wiring layer 12U, and the third wiring layer 13 has a stacked structure of the third lower wiring layer 13G and the third upper wiring layer 13U.

As illustrated in FIGS. 31A and 32, the nonvolatile semiconductor storage device includes the plurality of first wiring layers 11 extending in the Y direction, the plurality of second wiring layers 12 extending in the X direction intersecting the Y direction above the plurality of first wiring layers 11, and the first memory cell 101 arranged between the second wiring layer 12 and the first wiring layer 11 at each cross point of the plurality of second wiring layers 12 and the plurality of first wiring layers 11.

Further, the nonvolatile semiconductor storage device includes the plurality of third wiring layers 13 extending in the Y direction above the plurality of second wiring layers 12 and the second memory cell 102 arranged between the third wiring layer 13 and the second wiring layer 12 at each cross point of the plurality of third wiring layers 13 and the plurality of second wiring layers 12.

A schematic plane pattern configuration with reference to which a description will be made on one process of the manufacturing method of the nonvolatile semiconductor storage device according to the fourth embodiment is illustrated in FIGS. 25A, 25B, 26A and 26B.

Figure 25A:
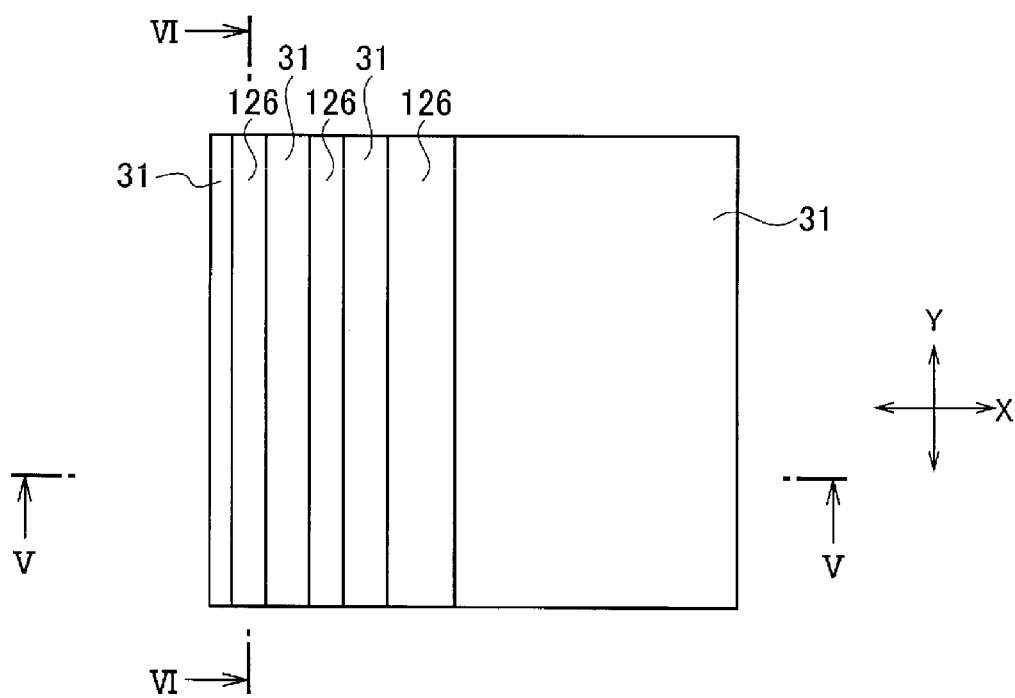
FIG. 25A is a schematic plan pattern configuration diagram illustrating one process of a manufacturing method of the nonvolatile semiconductor storage device according to the fourth embodiment.
Figure 27A:
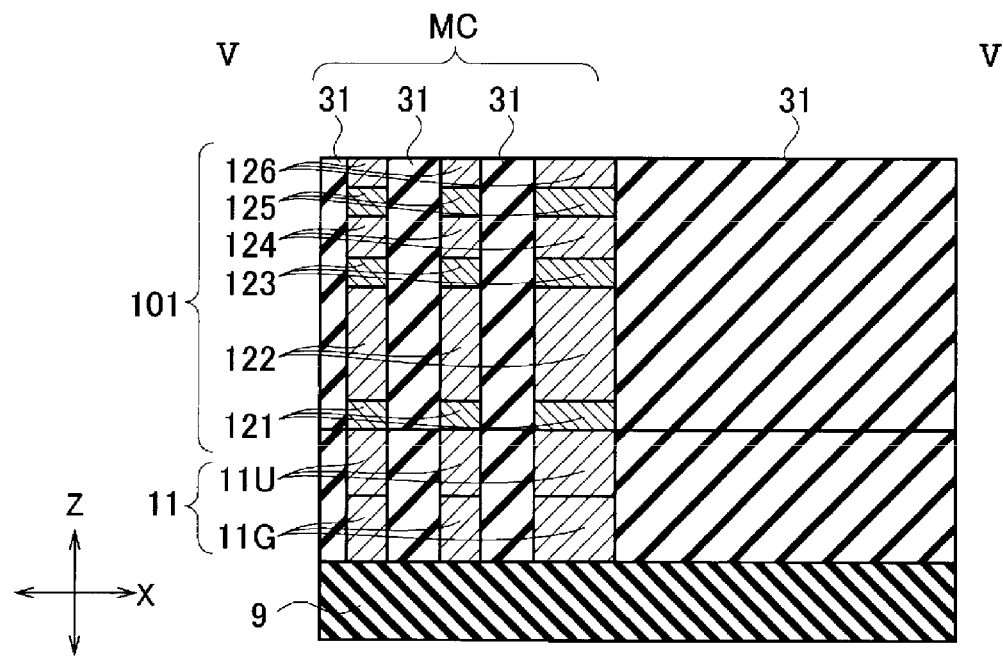
FIG. 27A is a schematic cross-sectional structural diagram taken along line V-V of FIG. 25A illustrating the manufacturing method of the nonvolatile semiconductor storage device according to the fourth embodiment.
Figure 27B:
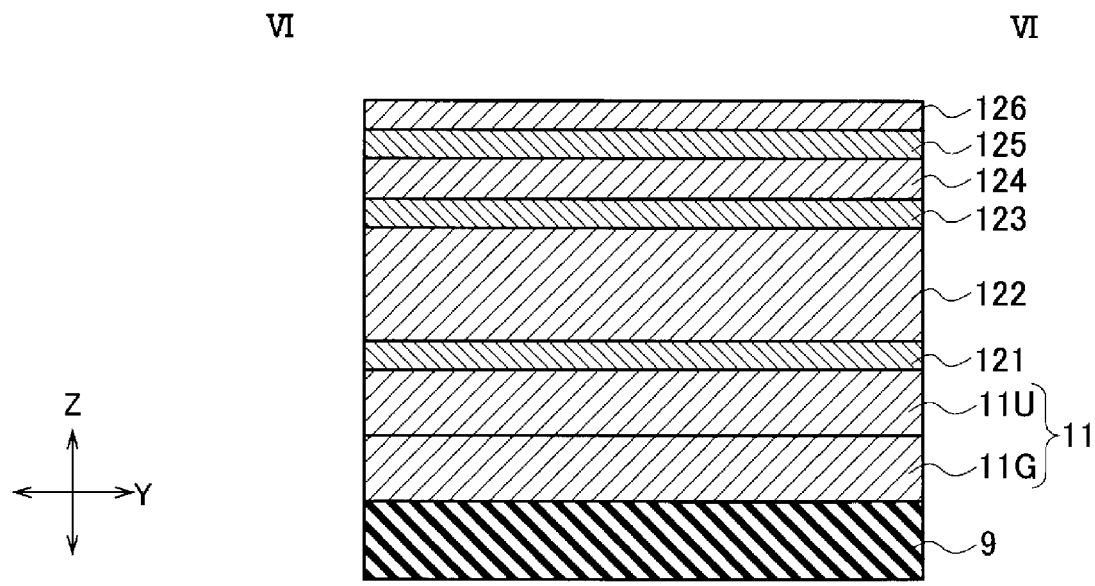
FIG. 27B is a schematic cross-sectional structural diagram taken along line VI-VI of FIG. 25A illustrating the manufacturing method of the nonvolatile semiconductor storage device according to the fourth embodiment.

A schematic sectional structure taken along line V-V of FIG. 25A is illustrated in FIG. 27A, and a schematic sectional structure taken along line VI-VI of FIG. 25A is illustrated in FIG. 27B.

(a) First, similarly to FIGS. 18A to 19, after the interlayer insulating film 31 is formed and patterned on the insulating substrate 9, the first wiring layer 11 is formed and is flattened using a CMP technique. As a result, the first wiring layer 11 is embedded between the patterned interlayer insulating films 31. The first wiring layer 11 has a stacked structure of the first lower wiring layer 11G and the first upper wiring layer 11U. As described above with reference to FIGS. 8B to 14B, similarly, a recess structure (not illustrated) is formed in the X direction on both sides of the stacked structure of the first lower wiring layer 11G and the first upper wiring layer 11U.

(b) Next, as illustrated in FIG. 20A, the stacked films 121, 122, 123, 124, 125, and 126 which are to be the memory cell 101 are sequentially formed on the patterned first wiring layer 11 and the patterned interlayer insulating films 31. The conductive film 121, the selector 122, the conductive film 123, the resistance change film 124, the conductive film 125, and the electrode layer 126 are sequentially formed on the first wiring layer 11 and the interlayer insulating films 31.

(c) Next, similarly to FIG. 20B, the stacked films 101 are processed. For example, the stacked films 101 on the first wiring layer 11 are processed into a stripe structure extending in the Y direction by an RIE method. The plurality of first wiring layers 11 and the stacked films 101 on the first wiring layers 11 are arranged with a trench interposed therebetween in the X direction orthogonal to the Y direction.

(d) Next, similarly to FIG. 21A, the interlayer insulating film 31 is formed and is flattened using a CMP technique. As a result, as illustrated in FIGS. 27A and 27B, the interlayer insulating film 31 is embedded in the trench between the stacked films 101 formed by the processing.

The interlayer insulating film 31 deposited above the stacked films 101 is polished and removed by, for example, a CMP method, and the upper surface of the interlayer insulating film 31 is flattened. As illustrated in FIGS. 27A and 27B, the upper surface of the electrode layer 126 is exposed.

Figure 25B:
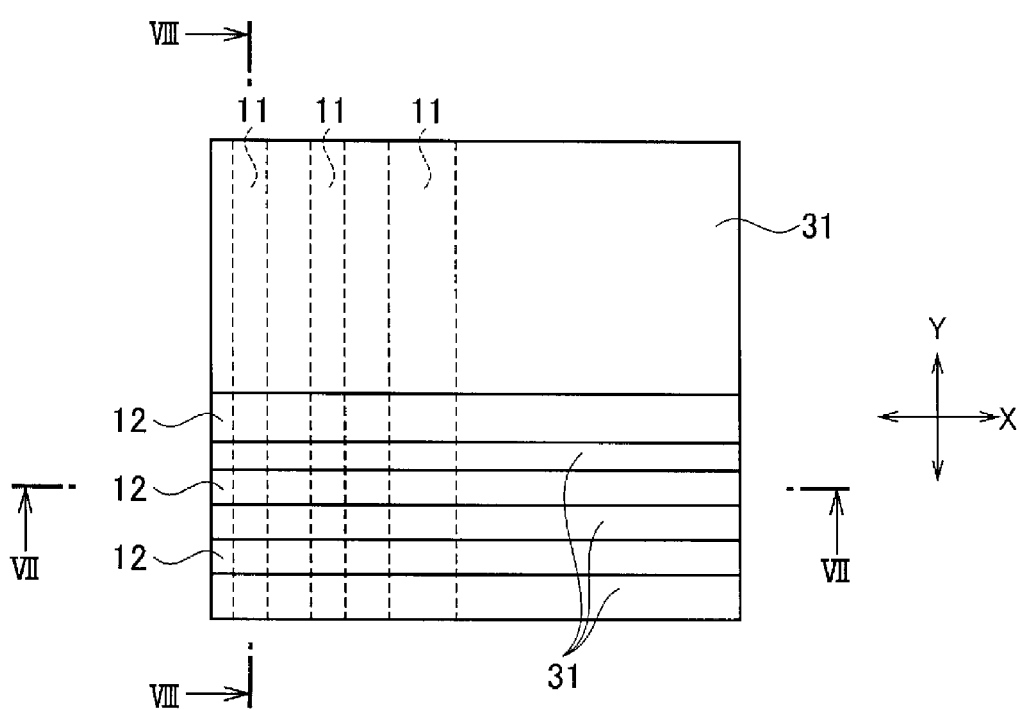
FIG. 25B is a schematic plan pattern configuration diagram illustrating one process of the manufacturing method of the nonvolatile semiconductor storage device according to the fourth embodiment.
Figure 28A:
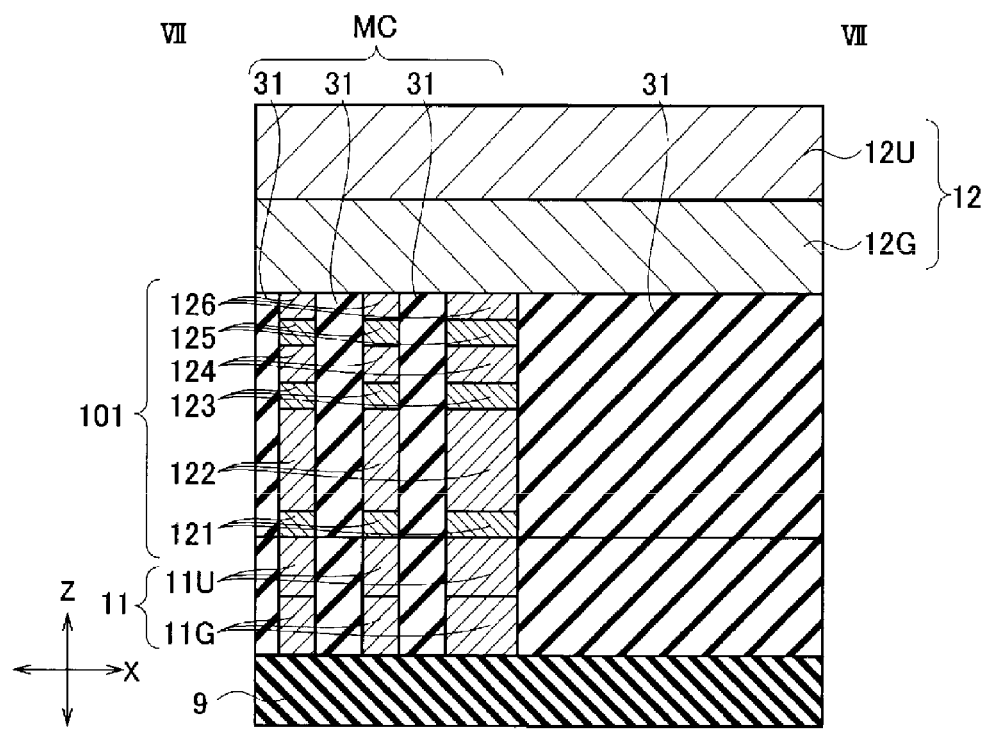
FIG. 28A is a schematic cross-sectional structural diagram taken along line VII-VII of FIG. 25B illustrating the manufacturing method of the nonvolatile semiconductor storage device according to the fourth embodiment.
Figure 28B:
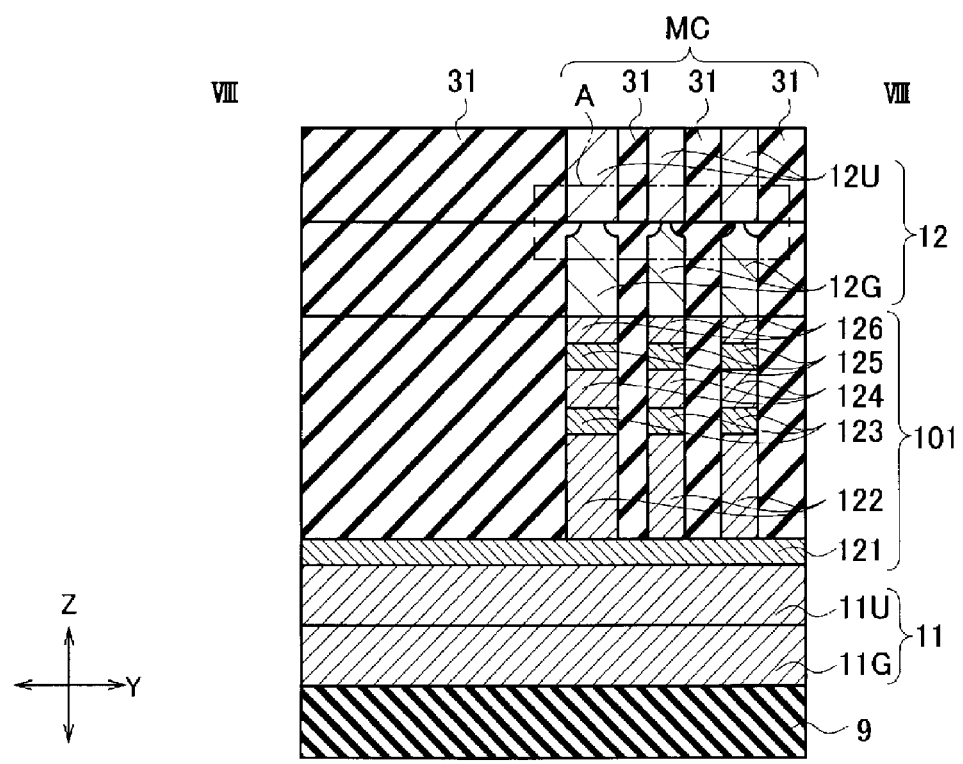
FIG. 28B is a schematic cross-sectional structural diagram taken along line VIII-VIII of FIG. 25B illustrating the manufacturing method of the nonvolatile semiconductor storage device according to the fourth embodiment.

A schematic sectional structure taken along line VII-VII of FIG. 25B is illustrated in FIG. 28A, and a schematic sectional structure taken along line VIII-VIII of FIG. 25B is illustrated in FIG. 28B.

(e) Next, as illustrated in FIGS. 28A and 28B, the second lower wiring layer 12 is formed. Here, the second wiring layer 12 has a stacked structure of the second lower wiring layer 12G and the second upper wiring layer 12U. First, the second lower wiring layer 12G is formed and patterned. The second lower wiring layer 12G is processed into a stripe structure extending in the X direction. As a result, the second lower wiring layer 12G is connected to the electrode layer 126 of the memory cell 101.

The plurality of second lower wiring layers 12G are arranged in the Y direction with a gap therebetween, and the upper surface of the stacked films 101 (the upper surface of the electrode layer 126) and the upper surface of the interlayer insulating film 31 are exposed between the second lower wiring layers 12G adjacent to each other in the Y direction. The second lower wiring layer 12G extends on the stacked film 101 in the X direction and further extends to the periphery.

(f) Next, the stacked films 101 and the interlayer insulating film 31 under and between the second lower wiring layers 12G processed into a stripe structure are also processed by an RIE method to form the stacked films 121, 122, 123, 124, 125, and 126 of the memory cell 101 having a columnar shape at the cross point of the second lower wiring layer 12G and the first wiring layer 11.

(g) Next, after the interlayer insulating film 31 is formed and flattened, the second upper wiring layer 12U is formed and patterned. That is, the second upper wiring layer 12U is processed into a stripe structure extending in the X direction. As a result, as illustrated in FIGS. 28A and 28B, the second upper wiring layer 12U is stacked on the second lower wiring layer 12G. As described above with reference to FIGS. 8B to 14B, similarly, a recess structure is formed in the Y direction on both sides of the stacked structure of the second lower wiring layer 12G and the second upper wiring layer 12U.

Figure 28C:
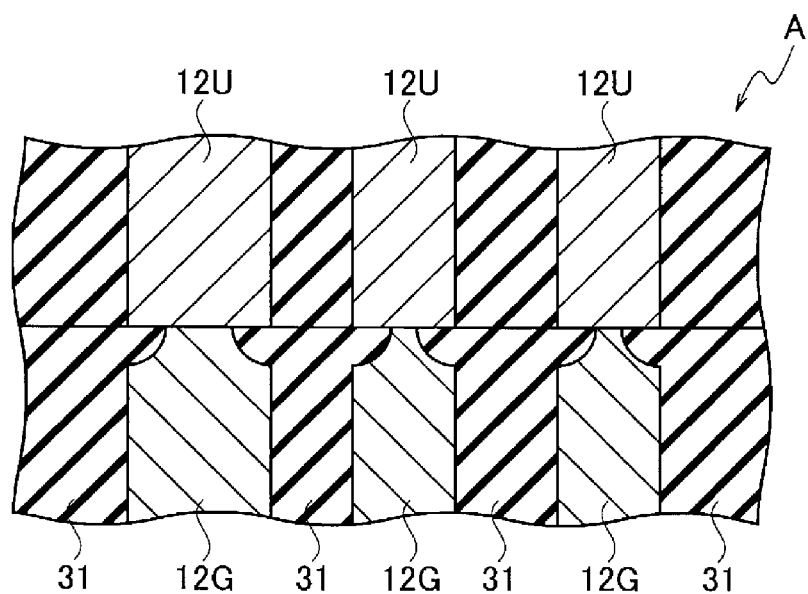
FIG. 28C is an enlarged cross-sectional structural diagram of region A of FIG. 28B.

An enlarged cross-sectional structure of region A of FIG. 28B is illustrated in FIG. 28C. Further, an enlarged cross-sectional structure of a modification 1 of region A of FIG. 28B is illustrated in FIG. 28D, an enlarged cross-sectional structure of a modification 2 of region A of FIG. 28B is illustrated in FIG. 28E, and an enlarged cross-sectional structure of a modification 3 of region A of FIG. 28B is illustrated in FIG. 28F.

Figure 28D:
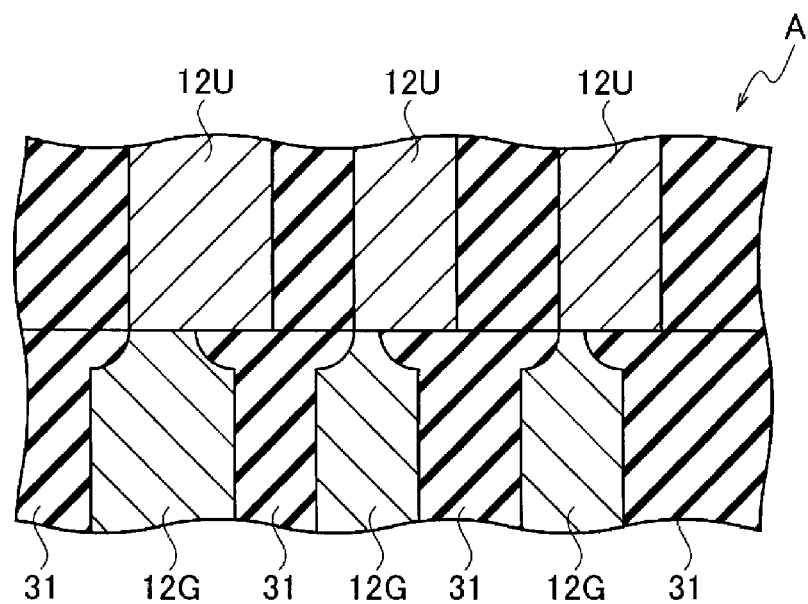
FIG. 28D is an enlarged cross-sectional structural diagram of a modification 1 of region A of FIG. 28B.
Figure 28E:
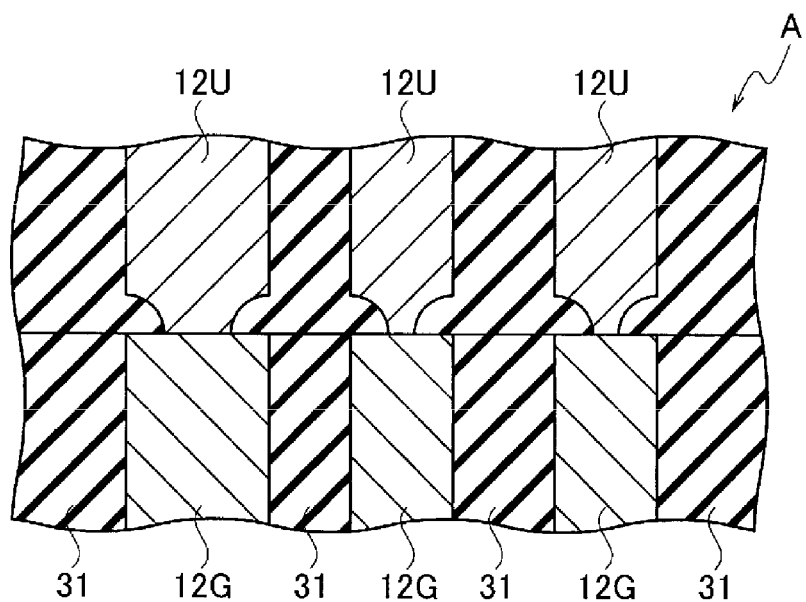
FIG. 28E is an enlarged cross-sectional structural diagram of a modification 2 of region A of FIG. 28B.
Figure 28F:
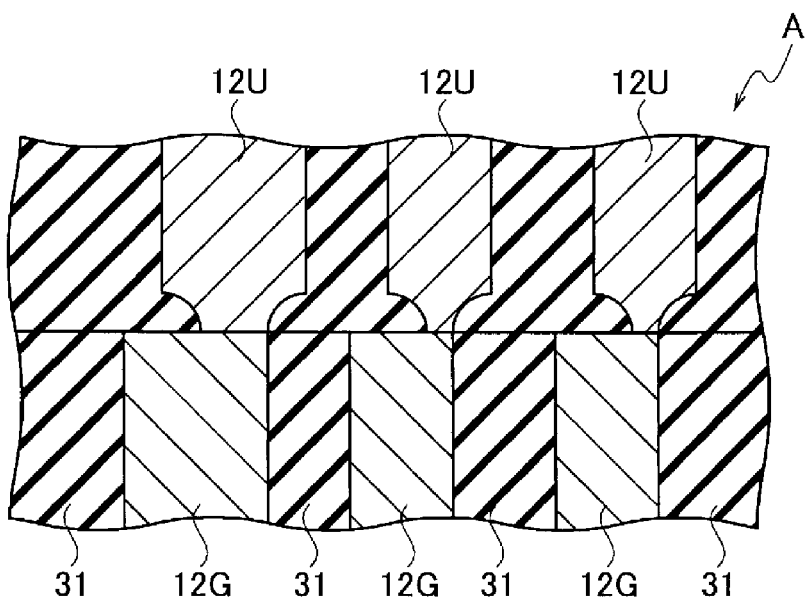
FIG. 28F is an enlarged cross-sectional structural diagram of a modification 3 of region A of FIG. 28B.

As illustrated in FIGS. 28C and 28D, the recess structures may be provided on both sides of the top of the second lower wiring layer 12G which is in contact with the second upper wiring layer 12U. As illustrated in FIGS. 28E and 28F, the recess structures may be provided on both sides of the bottom of the second upper wiring layer 12U which is in contact with the second lower wiring layer 12G. The recess structures may be provided on both sides of the second lower wiring layer 12G and the second upper wiring layer 12U. The second wiring layer 12 may further include a metal layer which is arranged between the second lower wiring layer 12G and the second upper wiring layer 12U and is different from the second upper wiring layer 12U. Here, the recess structure may have any shape selected from the group of an elliptical shape, a semicircular shape, a U-shaped shape, a triangular shape, a rectangular shape, or a polygonal shape, or a combination thereof.

Figure 26A:
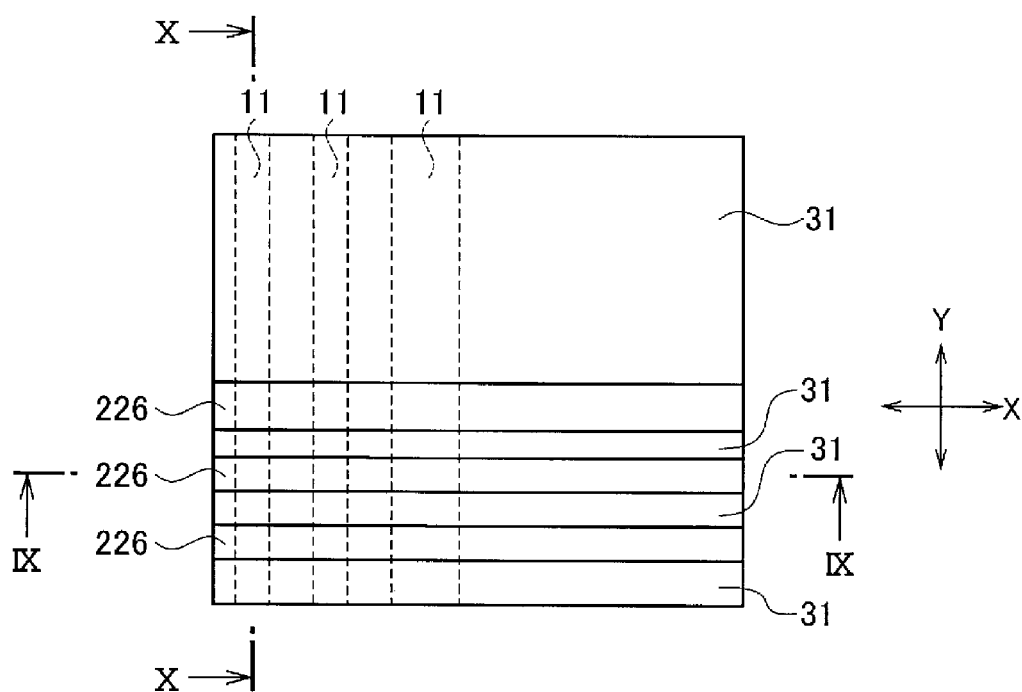
FIG. 26A is a schematic plan pattern configuration diagram illustrating one process of the manufacturing method of the nonvolatile semiconductor storage device according to the fourth embodiment.
Figure 29:
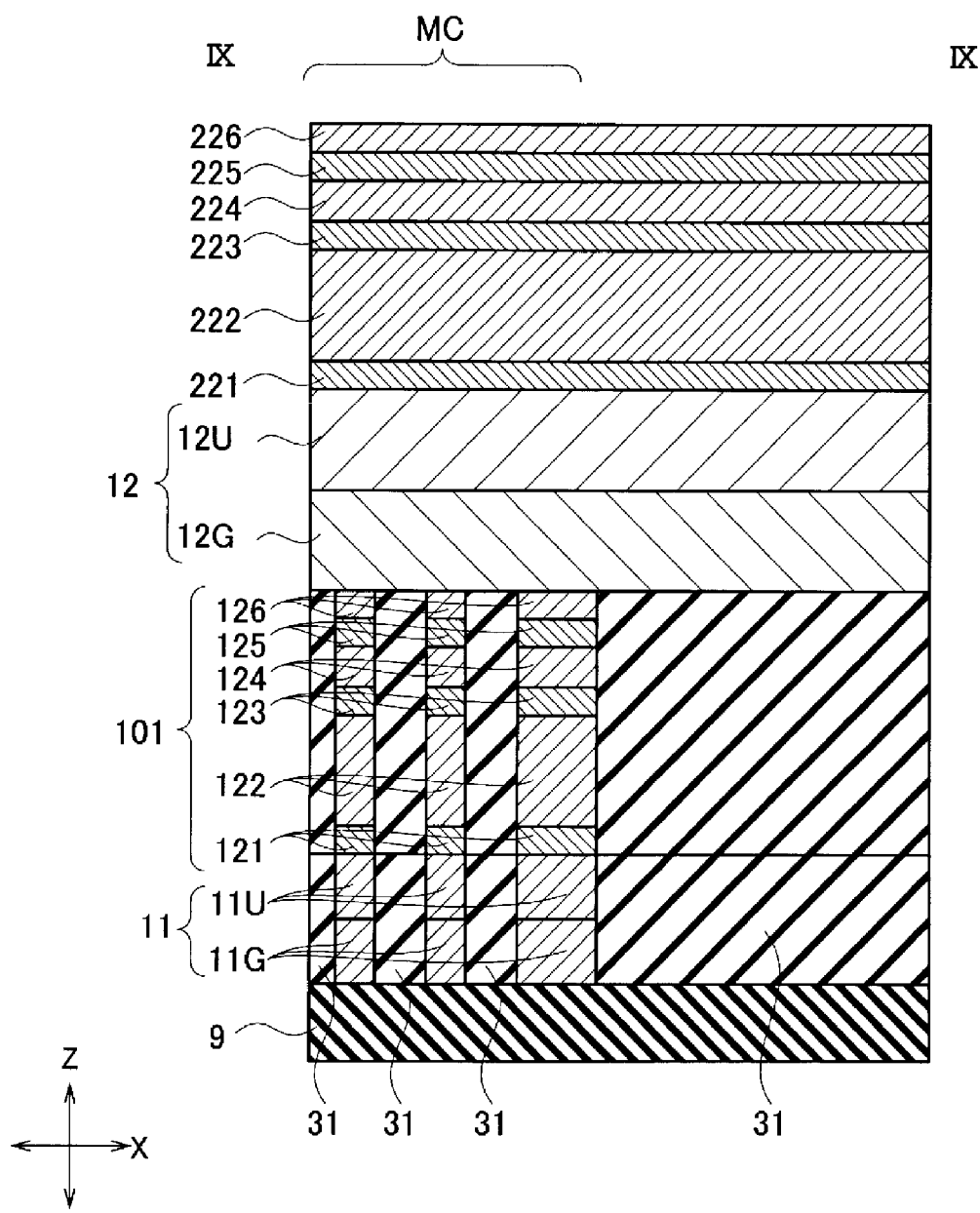
FIG. 29 is a schematic cross-sectional structural diagram taken along line IX-IX of FIG. 26A illustrating the manufacturing method of the nonvolatile semiconductor storage device according to the fourth embodiment.
Figure 30:
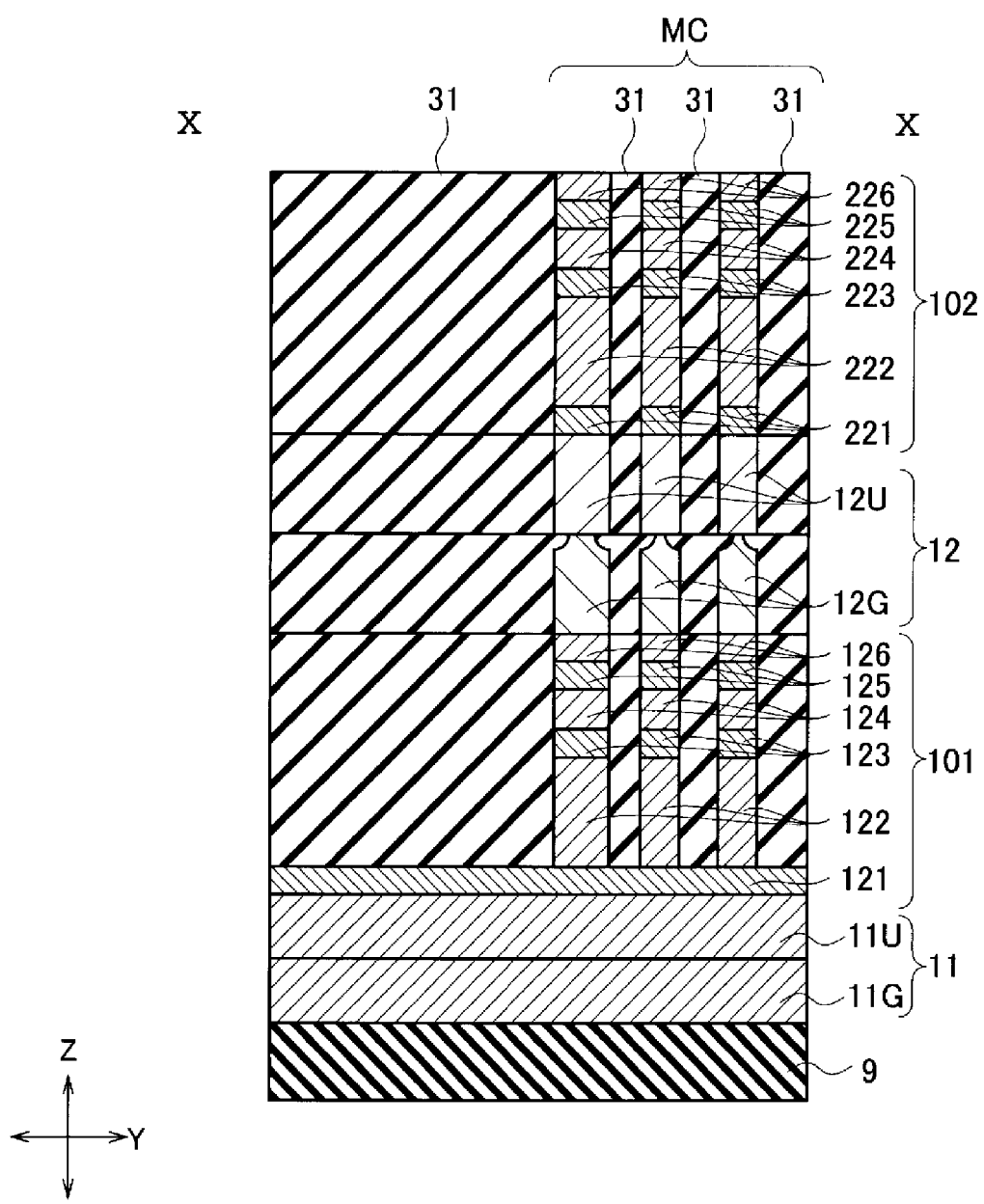
FIG. 30 is a schematic cross-sectional structural diagram taken along line X-X of FIG. 26A illustrating the manufacturing method of the nonvolatile semiconductor storage device according to the fourth embodiment.

A schematic sectional structure taken along line IX-IX of FIG. 26A is illustrated in FIG. 29, and a schematic sectional structure taken along line X-X of FIG. 26A is illustrated in FIG. 30.

(h) Next, after the interlayer insulating film 31 is formed and flattened, as illustrated in FIG. 29, the stacked films 221, 222, 223, 224, 225, and 226 which are to be the second memory cell 102 are sequentially formed on the second upper wiring layer 12U and the interlayer insulating film 31. The conductive film 221, the selector 222, the conductive film 223, the resistance change film 224, the conductive film 225, and the electrode layer 226 are sequentially formed on the second upper wiring layer 12U and the interlayer insulating film 31.

(i) Next, the stacked films 102 are processed. The stacked films 102 on the second upper wiring layer 12U are processed into a stripe structure extending in the X direction. As a result, the stacked films 221, 222, 223, 224, 225, and 226 which are to be the second memory cell 102 are formed.

(j) Next, the interlayer insulating film 31 is formed and flattened. As a result, as illustrated in FIGS. 29 and 30, the interlayer insulating film 31 is embedded in a trench between the stacked films 102 formed by the processing.

Figure 26B:
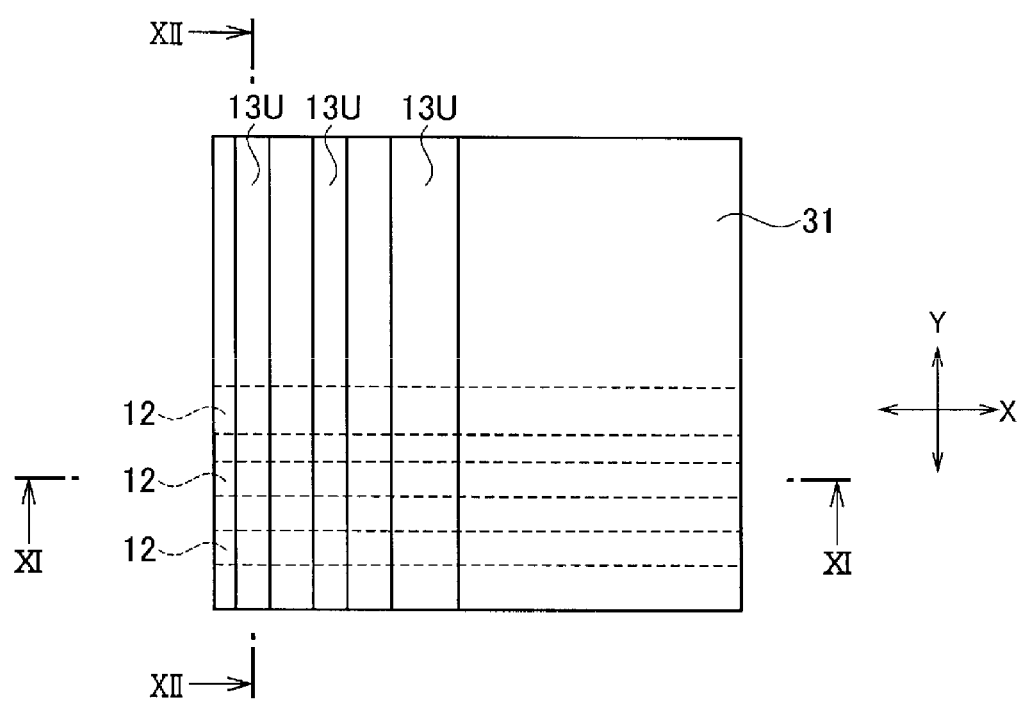
FIG. 26B is a schematic plan pattern configuration diagram illustrating one process of the manufacturing method of the nonvolatile semiconductor storage device according to the fourth embodiment.

A schematic sectional structure taken along line XI-XI of FIG. 26B is illustrated in FIG. 31A, and a schematic sectional structure taken along line XII-XII of FIG. 26B is illustrated in FIG. 32.

(k) Next, the third wiring layer 13 is formed. In a case of a two-layer memory cell structure, the third wiring layer 13 may have a one-layer structure. The third wiring layer 13 may be formed in a stacked structure of the third lower wiring layer 13G and the third upper wiring layer 13U in consideration of further stacking.

(l) In this case, first, the third lower wiring layer 13G is formed and patterned. The third lower wiring layer 13G is processed into a stripe structure extending in the X direction. As a result, the third lower wiring layer 13G is electrically connected to the electrode layer 226 of the memory cell 102.

(m) Next, the stacked films 102 and the interlayer insulating film 31 under and between the third lower wiring layers 13G processed into a stripe structure are also processed to form the stacked films 221, 222, 223, 224, 225, and 226 of the memory cell 102 having a columnar shape at the cross point of the third lower wiring layer 13G and the second upper wiring layer 12U.

(n) Next, after the interlayer insulating film 31 is formed and flattened, the third upper wiring layer 13U is formed and patterned. The third upper wiring layer 13U is processed into a stripe structure extending in the X direction. As a result, as illustrated in FIGS. 31A and 32, the third upper wiring layer 13U is stacked on the third lower wiring layer 13G, so that the third wiring layer 13 is formed in a stacked structure. As described above with reference to FIGS. 8B to 14B, similarly, a recess structure is formed in the X direction on both sides of the stacked structure of the third lower wiring layer and the third upper wiring layer.

Figure 31B:
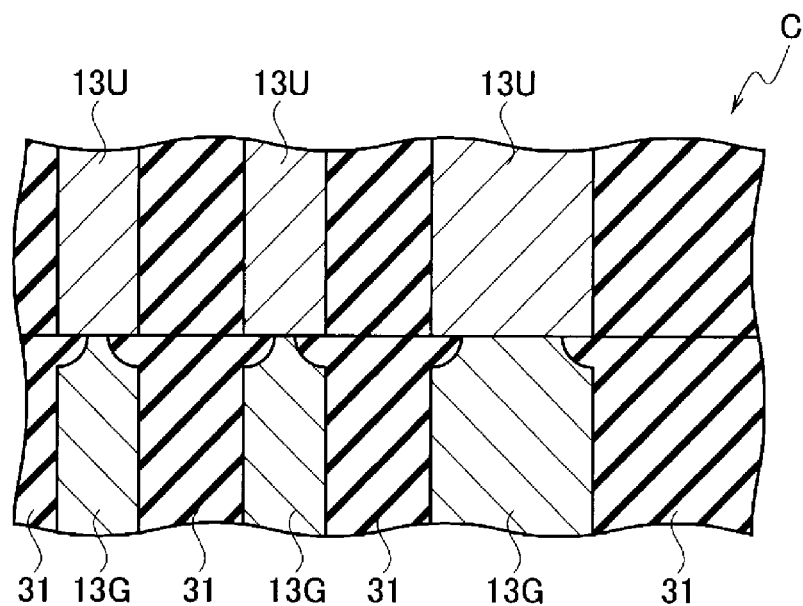
FIG. 31B is an enlarged cross-sectional structural diagram of region C of FIG. 31A.

Further, an enlarged cross-sectional structure of region C of FIG. 31A is illustrated in FIG. 31B. Further, an enlarged cross-sectional structure of a modification 1 of region C of FIG. 31A is illustrated in FIG. 31C, an enlarged cross-sectional structure of a modification 2 of region C of FIG. 31A is illustrated in FIG. 31D, and an enlarged cross-sectional structure of a modification 3 of region C of FIG. 31A is illustrated in FIG. 31E.

Figure 31C:
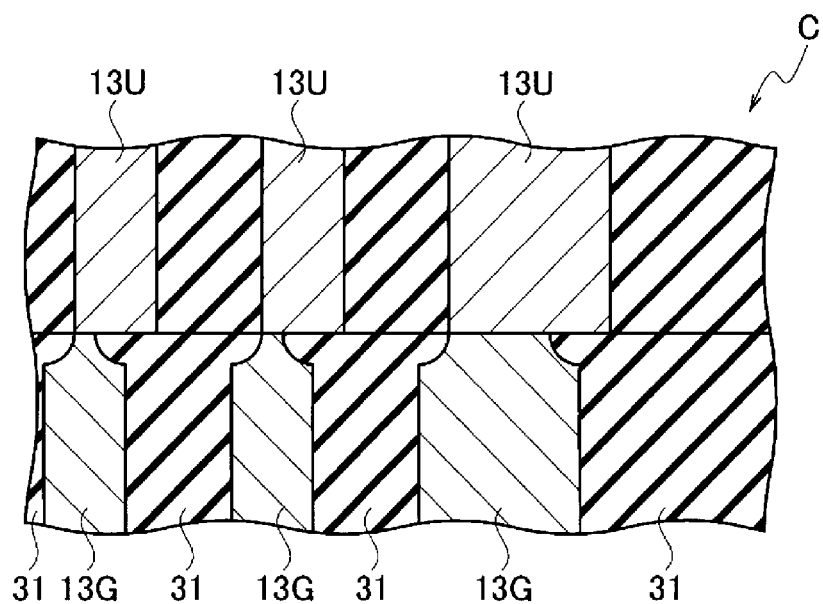
FIG. 31C is an enlarged cross-sectional structural diagram of a modification 1 of region C of FIG. 31A.
Figure 31D:
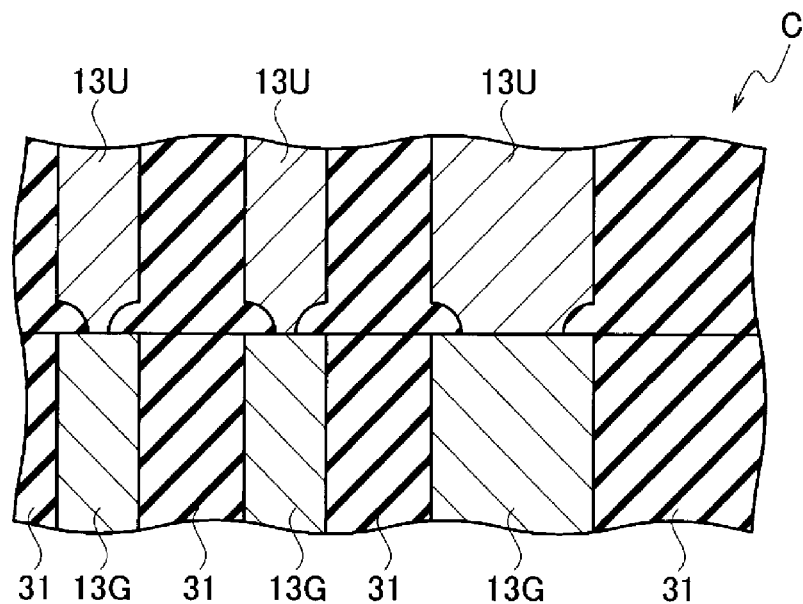
FIG. 31D is an enlarged cross-sectional structural diagram of a modification 2 of region C of FIG. 31A.
Figure 31E:
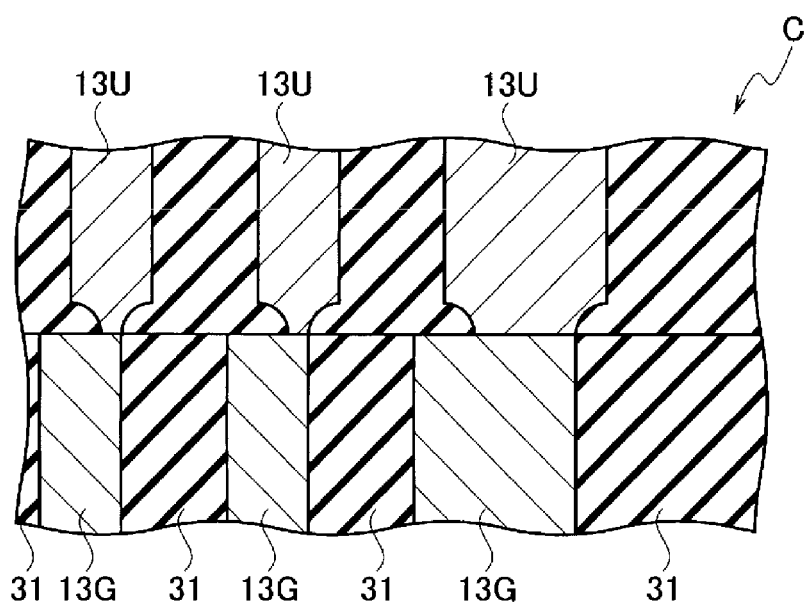
FIG. 31E is an enlarged cross-sectional structural diagram of a modification 3 of region C of FIG. 31A.

As illustrated in FIGS. 31B and 31C, the recess structures may be provided on both sides of the top of the third lower wiring layer 13G which is in contact with the third upper wiring layer 13U. As illustrated in FIGS. 31D and 31E, the recess structures may be provided on both sides of the bottom of the third upper wiring layer 13U which is in contact with the third lower wiring layer 13G. The recess structures may be provided on both sides of the third lower wiring layer 13G and the third upper wiring layer 13U. The third wiring layer 13 may further include a metal layer which is arranged between the third upper wiring layer 13U and the third lower wiring layer 13G and is different from the third upper wiring layer 13U. Here, the recess structure may have any shape selected from the group of an elliptical shape, a semicircular shape, a U-shaped shape, a triangular shape, a rectangular shape, or a polygonal shape, or a combination thereof.

(o) Further, similarly to FIG. 24, after the processes illustrated in FIGS. 25A, 27A, and 27B, the stacked films 101 on the first wiring layer 11 may be processed in the X direction intersecting the Y direction to form the stacked films 121, 122, 123, 124, 125, and 126 of the memory cell 101 having a columnar shape.

(p) Next, the interlayer insulating film 31 is formed and is flattened using a CMP technique. As a result, the interlayer insulating film 31 is embedded in a trench between the stacked films 101 having a columnar shape formed by the processing. Further, similarly to FIGS. 28A and 28B, the second lower wiring layer 12G and the second upper wiring layer 12U may be formed. The subsequent processes are the same.

Further, when the number of layers is further increased, the above-described processes are repeated according to the number of stacked memory cell arrays.

In a PCM, stacking increases the number of processes, and thus, increases the cost. However, in the nonvolatile semiconductor storage device according to the present embodiment, by increasing the film thickness of a cell wiring, the wiring resistance decreases, and a larger cell may be created in the same circuit. As a result, the number of bits per unit area increases, and the cost decreases.

In the nonvolatile semiconductor storage device according to the present embodiment, by stacking the wirings, a reduction in the size of a chip is larger than an increase in the costs of stacking, which results in large cost reduction.

As described above, according to the embodiment, the nonvolatile semiconductor storage device and the manufacturing method thereof which prevent shorting between adjacent wirings and reduce the wiring resistance may be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
   a plurality of first wiring layers extending in a first direction;
   a plurality of second wiring layers, extending in a second direction intersecting the first direction, provided above the plurality of first wiring layers along a third direction intersecting the first direction and the second direction;
   a plurality of third wiring layers, extending in the second direction, provided above the plurality of second wiring layers along the third direction;
   a first memory cell, arranged between the second wiring layer and the first wiring layer at each cross point of one of the plurality of second wiring layers and one of the plurality of first wiring layers, the first memory cell having a first resistance change film;
   a plurality of fourth wiring layers extending in the first direction and provided above the plurality of third wiring layers along the third direction; and
   a second memory cell, arranged between the fourth wiring layer and the third wiring layer at each cross point of one of the plurality of fourth wiring layers and one of the plurality of third wiring layers, the second memory cell having a second resistance change film,
   wherein the second wiring layer has a first surface that is in contact with the third wiring layer and a second surface that has a portion extending in the first direction, the extended portion of the second surface being longer than the first surface in the first direction, the second surface being spaced from the first surface in the third direction, and
   wherein the third wiring layer has a third surface that is in contact with the first surface of the second wiring layer, the third surface being longer than the first surface in the first direction.

2. The nonvolatile semiconductor storage device according to claim 1, wherein the second wiring layer further has a fourth surface that is spaced from the first surface in the third direction and has a portion extending in the first direction, the fourth surface located opposite to the second surface in the first direction with the first surface interposed therebetween.

3. The nonvolatile semiconductor storage device according to claim 1, further comprising an insulating film provided on the second surface.

4. The nonvolatile semiconductor storage device according to claim 2, wherein the third surface has a side end and a middle end in the first direction, and the fourth surface is located between the side end and the middle end in the first direction.

5. The nonvolatile semiconductor storage device according to claim 2, further comprising an insulating film provided between the third surface and the fourth surface.

6. The nonvolatile semiconductor storage device according to claim 1, wherein the second wiring layer further includes a first metal layer that is formed of a metal different from a material of the third wiring layer, the first metal layer being connected to the third wiring layer.

7. The nonvolatile semiconductor storage device according to claim 1, wherein the first wiring layer, the second wiring layer, and the third wiring layer are formed of a material selected from at least one of: a first group that consists of: W, Mo, polysilicon, Ni, Co, Ti, and Cu; a second group that consists of a silicide material of at least one of W, Mo, polysilicon, Ni, Co, Ti, or Cu; or a third group consisting of a nitride material of at least one of W, Mo, polysilicon, Ni, Co, Ti, or Cu.

8. The nonvolatile semiconductor storage device according to claim 6, wherein the first metal layer is formed of a material selected from at least one of: a first group that consists of: W, Mo, polysilicon, Ni, Co, Ti, and Cu; a second group that consists of a silicide material of at least one of W, Mo, polysilicon, Ni, Co, Ti, or Cu; or a third group consisting of a nitride material of at least one of W, Mo, polysilicon, Ni, Co, Ti, or Cu.

9. A nonvolatile semiconductor storage device comprising:
- a plurality of first wirings extending in a first direction;
- a plurality of second wirings, extending in a second direction intersecting the first direction, provided above the plurality of first wirings along a third direction intersecting the first direction and the second direction, and having at least a first width in the first direction;
- a plurality of third wirings extending in the second direction, having at least a second width in the first direction, and provided above the second wirings in the third direction;
- a plurality of fourth wirings extending in the second direction, having a third width less than the first width and the second width in the first direction, connected to respective ones of the plurality of second wirings, and connected to respective ones of the plurality of third wirings;
- a plurality of fifth wirings extending in the first direction and provided above the plurality of third wirings in the third direction;
- a first memory cell arranged between the second wiring and the first wiring at each cross point of one of the plurality of second wirings and one of the plurality of first wirings, the first memory cell having a first resistance change film; and
- a second memory cell arranged between the third wiring and the fifth wiring at each cross point of one of the plurality of third wiring and one of the plurality of fifth wiring, the second memory cell having a second resistance change film;
- wherein a center of the second wiring and a center of the third wiring are spaced apart from each other in the first direction.

10. The nonvolatile semiconductor storage device according to claim 9, wherein a center of the fourth wiring, a center of the second wiring, and a center of the third wiring are spaced apart from one another in the first direction.

11. The nonvolatile semiconductor storage device according to claim 9, wherein the plurality of second wirings are provided with a space in the first direction,
the plurality of fourth wirings are provided with the space in the first direction, and
the plurality of third wirings are provided with the space in the first direction.

12. The nonvolatile semiconductor storage device according to claim 9, wherein the fourth wiring and the second wiring are integrally formed of a same material.

13. The nonvolatile semiconductor storage device according to claim 9, wherein the fourth wiring is formed of a material different from a material of the second wiring and the third wiring.

14. The nonvolatile semiconductor storage device according to claim 9, wherein the first wiring, the second wiring, and the third wiring are formed of a material selected from at least one of: a first group that consists of: W, Mo, polysilicon, Ni, Co, Ti, and Cu; a second group that consists of a silicide material of at least one of W, Mo, polysilicon, Ni, Co, Ti, or Cu; or a third group consisting of a nitride material of at least one of W, Mo, polysilicon, Ni, Co, Ti, or Cu.

* * * * *